(12) United States Patent
Hirose et al.

(10) Patent No.: US 12,051,883 B2
(45) Date of Patent: Jul. 30, 2024

(54) SPATIAL LIGHT MODULATOR AND LIGHT-EMITTING DEVICE

(71) Applicant: HAMAMATSU PHOTONICS K.K., Hamamatsu (JP)

(72) Inventors: Kazuyoshi Hirose, Hamamatsu (JP); Yoshitaka Kurosaka, Hamamatsu (JP); Soh Uenoyama, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 206 days.

(21) Appl. No.: 17/787,976

(22) PCT Filed: Dec. 23, 2020

(86) PCT No.: PCT/JP2020/048241
§ 371 (c)(1),
(2) Date: Jun. 22, 2022

(87) PCT Pub. No.: WO2021/132374
PCT Pub. Date: Jul. 1, 2021

(65) Prior Publication Data
US 2023/0035423 A1 Feb. 2, 2023

(30) Foreign Application Priority Data
Dec. 27, 2019 (JP) .................. 2019-238392

(51) Int. Cl.
*G02F 1/015* (2006.01)
*G02F 1/025* (2006.01)
(Continued)

(52) U.S. Cl.
CPC .......... *H01S 5/0085* (2013.01); *G02F 1/0151* (2021.01); *G02F 1/025* (2013.01);
(Continued)

(58) Field of Classification Search
CPC .... G02F 1/0151; G02F 1/025; G02F 2201/12; H01S 5/0085; H01S 5/026; H01S 5/0265; H01S 5/11; H01S 5/18; H01S 5/185
See application file for complete search history.

(56) References Cited

U.S. PATENT DOCUMENTS 7,415,172 B2* 8/2008 An ..................... G02B 26/0808
385/10
7,664,158 B2* 2/2010 Kiyota ................. B82Y 20/00
372/96
(Continued)

FOREIGN PATENT DOCUMENTS

JP  2008-523621 A  7/2008
JP  2018-198302 A  12/2018
(Continued)

OTHER PUBLICATIONS

International Preliminary Report on Patentability mailed Jul. 7, 2022 for PCT/JP2020/048241.
(Continued)

*Primary Examiner* — Ryan A Lepisto
(74) *Attorney, Agent, or Firm* — Faegre Drinker Biddle & Reath LLP

(57) ABSTRACT

This disclosure relates to a spatial light modulator, etc., the spatial light modulator being capable of dynamically controlling the phase distribution of light, and provided with a structure having a smaller pixel arrangement period and suitable for high-speed operation. The spatial light modulator includes a substrate. The substrate has a front surface, a back surface, and through-holes arranged one-dimensionally or two-dimensionally and penetrating between the front surface and the back surface. The spatial light modulator further includes layered structures each covering the inner walls of the through-holes. Each layered structure includes a first electroconductive layer on the inner wall, a dielectric
(Continued)

layer on the first electroconductive layer and having optical transparency, and a second electroconductive layer on the dielectric layer and having optical transparency. At least one of the first and second electroconductive layers is electrically isolated for each group including one or more throughholes.

24 Claims, 33 Drawing Sheets

(51) Int. Cl.
  *H01S 5/00* (2006.01)
  *H01S 5/026* (2006.01)
  *H01S 5/11* (2021.01)
  *H01S 5/185* (2021.01)
  *H01S 5/18* (2021.01)
(52) U.S. Cl.
  CPC ............ *H01S 5/026* (2013.01); *H01S 5/0265* (2013.01); *H01S 5/11* (2021.01); *H01S 5/185* (2021.01); *G02F 2201/12* (2013.01); *H01S 5/18* (2013.01)

(56) References Cited

U.S. PATENT DOCUMENTS

| | | | | |
|---|---|---|---|---|
| 9,614,352 | B2* | 4/2017 | Takiguchi | G02B 27/286 |
| 10,404,037 | B2* | 9/2019 | Higuchi | H01S 5/18394 |
| 10,666,017 | B2* | 5/2020 | Ledentsov | H01S 5/1833 |
| 11,637,409 | B2* | 4/2023 | Sugiyama | H01S 5/11 |
| | | | | 250/559.29 |
| 11,646,546 | B2* | 5/2023 | Sugiyama | H01S 5/04256 |
| | | | | 372/38.05 |
| 2007/0098318 | A1 | 5/2007 | An et al. | |
| 2011/0188526 | A1* | 8/2011 | Noda | H01S 5/185 |
| | | | | 372/41 |
| 2013/0121358 | A1* | 5/2013 | Hirose | H01S 5/11 |
| | | | | 438/46 |
| 2022/0019096 | A1* | 1/2022 | Nomoto | G02F 1/0151 |

FOREIGN PATENT DOCUMENTS

| | | |
|---|---|---|
| JP | 2019-003041 A | 1/2019 |
| WO | WO-2006/065550 A2 | 6/2006 |
| WO | WO-2013/172161 A1 | 11/2013 |

OTHER PUBLICATIONS

B. R. Brown & A. W. Lohmann, "Complex Spatial Filtering with Binary Masks," Applied Optics, vol. 5, No. 6, 1966, pp. 967-969.
Burckhardt, C. B., "A Simplification of Lee's Method of Generating Holograms by Computer," Applied Optics, vol. 9, No. 8, 1970, p. 1949.
Kurosaka, Y. et al., "Effects of non-lasing band in two-dimensional photonic-crystal lasers clarified using omnidirectional band structure," Optics Express, vol. 20, No. 19, 2012, pp. 21773-21783.
Junghyun Park and Soo Jin Kim et al., "Subwavelength-spaced transmissive metallic slits for 360-degree phase control by using transparent conducting oxides," Applied Optics, vol. 57, No. 21, Jul. 20, 2018, pp. 6027-6031.

* cited by examiner

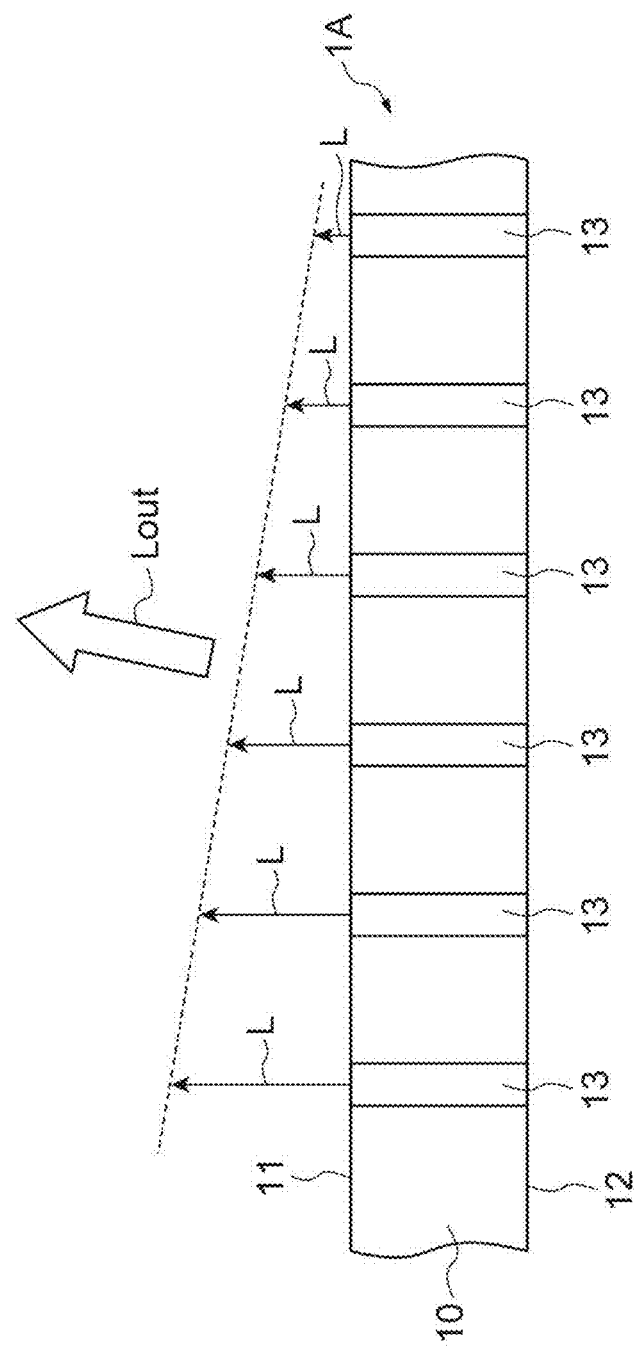

Fig.30A

| A2 | A1 |
|---|---|
| A3 | A4 |

ORIGINAL IMAGE

Fig.30B

| A4<br><br>ROTATED A2 | A3<br><br>ROTATED A1 |
|---|---|
| A1<br><br>ROTATED A3 | A2<br><br>ROTATED A4 |

BEAM PATTERN TO BE OBTAINED

Fig.31

SPATIAL LIGHT MODULATOR AND LIGHT-EMITTING DEVICE

TECHNICAL FIELD

The present disclosure relates to a spatial light modulator and a light-emitting device.

BACKGROUND ART

Patent Document 1 discloses a technique related to a semiconductor light-emitting element and a method of manufacturing the same. This semiconductor light-emitting element includes: a semiconductor substrate; and a first cladding layer, an active layer, a second cladding layer, and a contact layer, each sequentially provided on the semiconductor substrate. In addition, this semiconductor light-emitting element includes a phase modulation layer, which is disposed between the first cladding layer and the active layer or between the active layer and the second cladding layer. The phase modulation layer includes: a base layer; and a plurality of modified refractive index regions each having a refractive index different from the refractive index of the base layer. A virtual square lattice, which is set on a plane perpendicular to the thickness direction of the phase modulation layer, includes a plurality of unit constituent regions. In each unit constituent region, a modified refractive index region is allocated, and the phase modulation layer is configured such that the centroid position of the modified refractive index region is arranged away from the lattice point of the corresponding unit constituent region and has a rotation angle around the lattice point according to a desired optical image.

Non-Patent Document 1 describes that a plurality of periodic recesses is formed on a substrate surface by metal-assisted chemical etching (MACE), and a metal layer, a dielectric layer, and a transparent electroconductive layer are layered on the sidewalls of the recesses, thereby modulating the phase of incident light.

CITATION LIST

Patent Literature

Patent Document 1: Japanese Patent Application Laid-Open No. 2018-198302

Non-Patent Literature

Non-Patent Document 1: Junghyun Park and Soo Jin Kim, "Subwavelength-spaced transmissive metallic slits for 360-degree phase control by using transparent conducting oxides", Applied Optics, Vol. 57, No. 21, 6027-6031, 20 Jul. 2018
Non-Patent Document 2: Appl. Opt. No. 5, p. 967-969 (1966)
Non-Patent Document 3: Appl. Opt. No. 9, p. 1949 (1970)
Non-Patent Document 4: Y. Kurosaka et al., "Effects of non-lasing band in two-dimensional photonic-crystal lasers clarified using omnidirectional band structure," Opt. Express 20, 21773-21783 (2012)

SUMMARY OF INVENTION

Technical Problem

As a result of studies on the above-described conventional technique, the inventors have found the following problems.

That is, there has been studied from the past a technique of generating a freely-selected optical image by spatial phase modulation. In a certain technique, a phase modulation layer including a plurality of modified refractive index regions is provided in the vicinity of the active layer of a semiconductor laser element. Then, in a virtual square lattice set on a plane perpendicular to the thickness direction of the phase modulation layer, for example, the centroids of the plurality of modified refractive index regions are arranged away from the lattice points of the virtual square lattices, and the rotation angle around the lattice point is individually defined for each modified refractive index region. Such element is capable of emitting laser light in a stacking direction similarly to photonic crystal laser elements, and spatially controlling the phase distribution of the laser light thereby emitting the laser light as an optical image having a freely-selected shape.

However, the above-described element can only output a pre-designed one optical image, since the arrangement of the plurality of modified refractive index regions in the phase modulation layer is fixed. Dynamical control of the phase distribution of the emitted light is necessary to dynamically change the emitted light image.

One of the devices capable of dynamically controlling the phase distribution of the light is a phase modulation-type spatial light modulator. For example, a liquid crystal-type spatial light modulator has a configuration in which a plurality of pixel electrodes is arranged one-dimensionally or two-dimensionally along a liquid crystal layer. The phase modulation amount of the light incident on the liquid crystal layer can be individually controlled for each pixel by individually choosing the voltage for each pixel electrode. By combining such spatial light modulator and a surface light source (e.g. a photonic crystal laser element), the phase distribution of the emitted light can be dynamically controlled.

However, while the arrangement period of the pixels in the liquid crystal-type spatial light modulator is approximately 10 μm, the overall dimension of the light emitting surface of the photonic crystal laser element is 200 μm to 500 μm on each side. Therefore, the number of effective pixels is extremely small even when a liquid crystal spatial light modulator and a photonic crystal laser element are combined, consequently a high-quality optical image is difficult to be obtained. In addition, there is also a problem in which speeding up is difficult to be achieved as the operation speed is limited by the response speed of the liquid crystal.

The present disclosure has been made to solve the problems described above, and an object of the present disclosure is to provide: a spatial light modulator, with which a phase distribution of light can be dynamically controlled, and which has a smaller pixel arrangement period and is suitable for the speeding up; and a light-emitting device including the spatial light modulator.

Solution to Problem

A spatial light modulator according to an embodiment of the present disclosure includes a surface waveguide-type spatial light modulator. The spatial light modulator includes a substrate and a plurality of layered structures. The substrate has a front surface, a back surface opposing to the front surface, and a plurality of through-holes each of which connects the front surface and the back surface. Each of the plurality of through-holes has an opening, to be defined at least on the front surface, being arranged one-dimensionally or two-dimensionally. In particular, each of the plurality of layered structures includes a first electroconductive layer, a dielectric layer, and a second electroconductive layer. The first electroconductive layer is provided on the inner wall of a corresponding through-hole among the plurality of through-holes. The dielectric layer is provided on the first electroconductive layer and has optical transparency. The second electroconductive layer is provided on the dielectric layer and has optical transparency. Furthermore, at least one of the first and second electroconductive layers is electrically isolated for each group including one or more through-holes among the plurality of through-holes.

Advantageous Effects of Invention

The present disclosure enables to provide: a spatial light modulator that is capable of dynamically controlling the phase distribution of light, has a smaller period of pixel arrangement, and is suitable for speeding up; and a light-emitting device including the spatial light modulator.

BRIEF DESCRIPTION OF DRAWINGS

FIG. 6 is a diagram conceptually illustrating a state of the light L in a case where there is an inclination in the magnitude of the voltage between the electroconductive layer 21 and the electroconductive layer 23 among the plurality of through-holes 13 arranged in a certain direction.

FIGS. 30A and 30B are diagrams for explaining precautions in calculating using general discrete Fourier transform (or fast Fourier transform) when determining the position of each of the modified refractive index regions 65b.

FIG. 31 is a diagram conceptually illustrating an example of the distribution of rotation angles $\varphi_1(x, y)$.

DESCRIPTION OF EMBODIMENTS

Description of Embodiments of Present Disclosure

Figure 1:
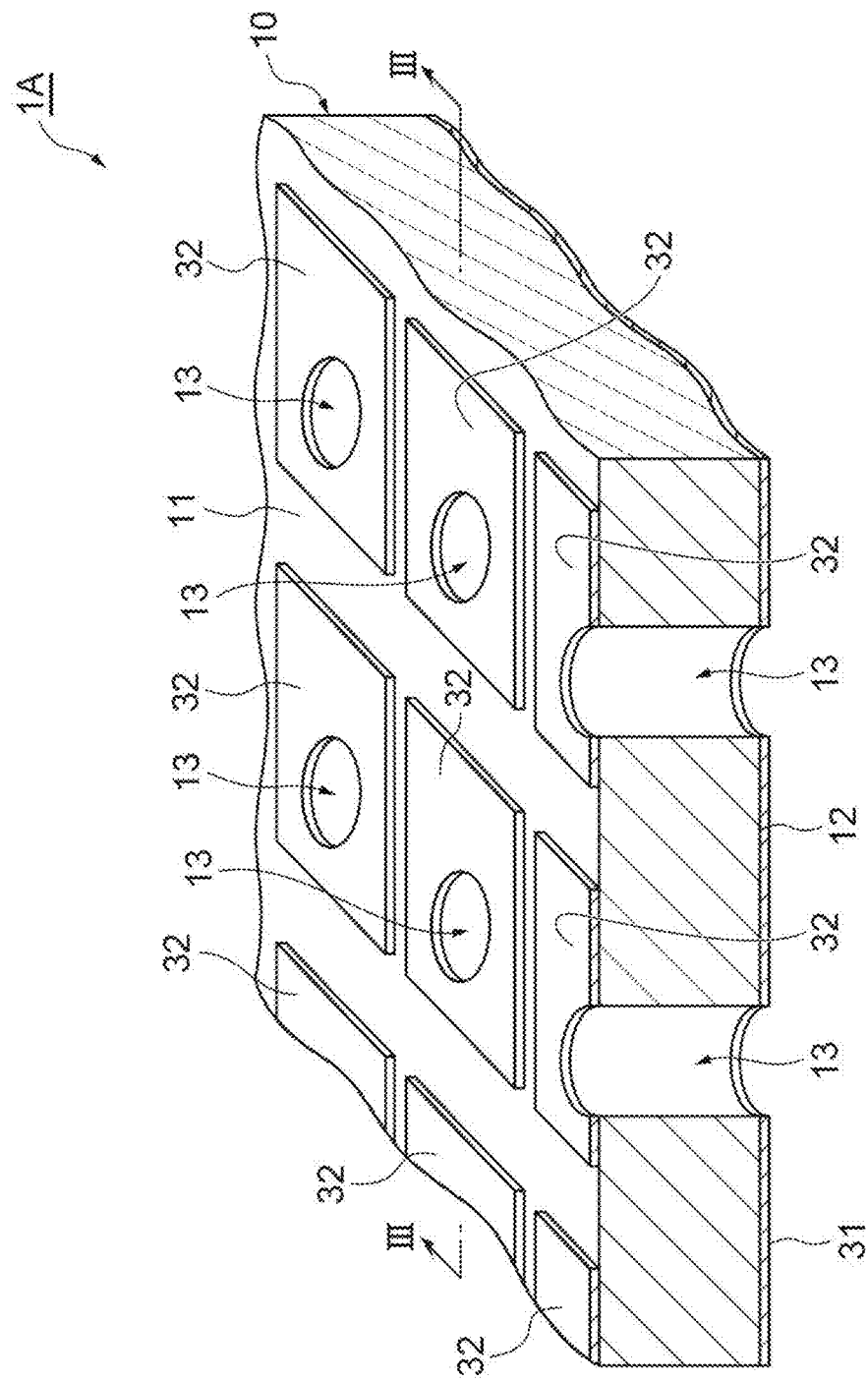
FIG. 1 is a cutaway perspective view illustrating an appearance of a spatial light modulator 1A according to a first embodiment, and is an enlarged view illustrating a part of the spatial light modulator 1A.

First, the detail of each embodiment of the present disclosure will be individually listed and described.

(1) The spatial light modulator of the present disclosure includes a surface waveguide-type spatial light modulator. As one aspect, the spatial light modulator includes a substrate and a plurality of layered structures. The substrate has a front surface, a back surface opposing to the front surface, and a plurality of through-holes each of which connects the front surface and the back surface. Each of the plurality of through-holes has an opening, to be defined at least on the front surface, being arranged one-dimensionally or two-dimensionally. In particular, each of the plurality of layered structures includes a first electroconductive layer, a dielectric layer, and a second electroconductive layer.

The first electroconductive layer is provided on the inner wall of a corresponding through-hole among the plurality of through-holes. The dielectric layer is provided on the first electroconductive layer and has optical transparency. The second electroconductive layer is provided on the dielectric layer and has optical transparency. Furthermore, at least one of the first and second electroconductive layers is electrically isolated for each group including one or more through-holes among the plurality of through-holes.

Light enters from the front surface side or the back surface side of the spatial light modulator, then the light passes through the plurality of through-holes. At that time, the light in each through-hole travels while being reflected at the interface between the first electroconductive layer and the dielectric layer in each layered structure, and passes through each through-hole. When a voltage is applied between the first electroconductive layer and the second electroconductive layer, the refractive index of the second electroconductive layer changes depending on the density of carriers accumulated in the second electroconductive layer, the refractive index of the dielectric layer changes depending on the electric field between the first electroconductive layer and the second electroconductive layer, and the amount of phase shift before and after the reflection at the interface between the first electroconductive layer and the dielectric layer changes. Therefore, the phase of the light emitted from each through-hole changes depending on the magnitude of the voltage between the first electroconductive layer and the second electroconductive layer. In addition, at least one of the first and second electroconductive layers is electrically isolated for each group including one or more through-holes. Therefore, the voltage can be individually adjusted for one or more through-holes. By the above operation, this spatial light modulator enables the dynamical control of the phase distribution of the light.

Since the through-hole can be formed by, for example, an etching process for semiconductor, metal assist chemical etching (MACE), or the like, the arrangement period of the through-hole can be easily made smaller than the arrangement period of the pixels of the liquid crystal-type spatial light modulator. Therefore, this spatial light modulator enables to make the arrangement period of the pixels smaller than before. As a result, by combining this spatial light modulator with a surface light source such as a photonic crystal laser element, the number of effective pixels can be increased to obtain a high-quality optical image. Furthermore, this spatial light modulator does not use any liquid crystal, and hence its speed is not limited by the response speed of the liquid crystal and is suitable for speeding up.

(2) As one aspect of the present disclosure, the opening shape of each of the plurality of through-holes to be defined on the front surface preferably has rotational symmetry or reflection symmetry. As one aspect of the present disclosure, the opening shapes of the plurality of through-holes to be defined on the front surface may coincide with each other.

(3) As one aspect of the present disclosure, in at least one of the front surface and the back surface, the centroid of opening of each of the plurality of through-holes is preferably located on the lattice point of a square lattice or of a triangular lattice. In this case, the plurality of through-holes is regularly aligned on a surface that is perpendicular to the thickness direction of the substrate, and hence the design of an optical image can be facilitated.

(4) As one aspect of the present disclosure, the opening shape of each of the plurality of through-holes to be defined on the front surface may be a linearly extending shape. As such, the plurality of through-holes may be arranged in a direction intersecting a direction in which each through-hole extends.

(5) As one aspect of the present disclosure, the opening shape of each of the plurality of through-holes may include a linear shape or an arc shape.

(6) As one aspect of the present disclosure, in a case where the opening shape of each of the plurality of through-holes includes an arc shape extending over an angular range of less than 360° in polar coordinates centered at the origin, the plurality of through-holes is preferably arranged at equal intervals along the radial direction, on the front surface.

(7) As one aspect of the present disclosure, the spatial light modulator may further include a dielectric region that has optical transparency and that is provided on a corresponding layered structure among the plurality of layered structures, in each of the plurality of through-holes. In this case, the optical path length of the light passing through the through-hole becomes greater, and the number of times of reflections at the interface between the first electroconductive layer and the dielectric layer increases. Hence, the amount of phase modulation in each through-hole can be increased. Alternatively, the substrate thickness necessary for realizing the predetermined amount of phase modulation can be reduced.

(8) As one aspect of the present disclosure, the dielectric region is preferably filled in at least a predetermined section to be defined along the thickness direction from the front surface to the back surface, among the space surrounded by the corresponding layered structure. In this case, the optical path length of the light passing through the through-hole is further increased, and the number of times the light undergoes reflection at the interface between the first electroconductive layer and the dielectric layer is further increased.

(9) As one aspect of the present disclosure, the spatial light modulator may further include a smooth layer that has a smooth surface and that is provided on the inner wall in each of the plurality of through-holes, and on the surface of the smooth layer may be provided a corresponding layered structure among the plurality of layered structures. In this case, even in a case where the through-hole has an unevenness on its inner wall, the surface of the first electroconductive layer becomes smooth, so that the diffused reflection of light can be suppressed. In a case where the smooth layer is comprised of an insulating dielectric material, the first electroconductive layer and the substrate can be electrically isolated from each other, so that an unwanted current leakage to the substrate can be suppressed.

(10) As one aspect of the present disclosure, the smooth layer may include at least one of a metal and a dielectric material. In this case, a smooth layer can be suitably realized.

(11) As one aspect of the present disclosure, one of the first and second electroconductive layers may be electrically connected to one or more first electrodes provided on the front surface of the substrate, corresponding to each of the plurality of through-holes. For example, such configuration enables to apply a voltage to the first and second electroconductive layers individually for each through-hole. In addition, as one aspect of the present disclosure, the other of the first and second electroconductive layers is preferably electrically connected to a second electrode, provided on the back surface of the substrate, in common to the plurality of through-holes. For example, such configuration facilitates the setting of a reference electric potential for the first or second electroconductive layer.

(12) As one aspect of the present disclosure, the second electrode preferably covers a region between each of the plurality of through-holes, on the front surface or the back surface of the substrate. In this case, the light can be prevented from passing through the substrate portion other than the through-hole, and hence the emitted light can include only of the light modulated after passing through the through-hole. In addition, such second electrode is provided on the light incident surface out of the front surface and the back surface of the substrate, thereby enabling to achieve the suppression of the light absorption in the substrate portion other than the through-hole and the suppression of an increase in the substrate temperature.

(13) As one aspect of the present disclosure, the spatial light modulator having the above-described structure may have a configuration in which the intensity modulation of an applied voltage (voltage applied between the first electroconductive layer and the second electroconductive layer) is used to achieve the dynamic modulation of an incident light phase. Specifically, the substrate includes a plurality of base elements, one through-hole among the plurality of through-holes is allocated to each base element, and the maximum width of each base element, to be defined along each of a first direction and a second direction intersecting each other on the front surface, is configured so as to be shorter than the wavelength of an incident light. In this case, three or more consecutive base elements along at least one of the first direction and the second direction, among the plurality of base elements are included in a base unit as a modulation control unit. In three or more base elements included in this base unit, one of the first and second electroconductive layers is connected to a common electrode. Note that, this common electrode includes a second electrode provided on the back surface of the substrate.

(14) As one aspect of the present disclosure, it is preferable that the substrate mainly contains a semiconductor material. In this case, an etching process of semiconductor or MACE can be easily used to form the through-hole. Therefore, the arrangement period of the through-holes can be easily made smaller.

(15) As one aspect of the present disclosure, the semiconductor material may include at least one of Si, Ge, GaAs, InP, and GaN. In this case, a known etching process can be used in the formation of the through-hole, and the formation of the through-hole is facilitated.

(16) As one aspect of the present disclosure, the first electroconductive layer may be a metal layer. In this case, light can be sufficiently reflected at the interface between the first electroconductive layer and the dielectric layer.

(17) As one aspect of the present disclosure, the first electroconductive layer may contain Pt. In this case, by using the atomic layer deposition (ALD), for example, the first electroconductive layer can be easily formed in a through-hole having a small inner diameter and being long in the penetrating direction (i.e. having a large aspect ratio).

(18) As one aspect of the present disclosure, the dielectric layer may contain at least one of aluminum oxide, hafnium oxide, silicon oxide, and silicon nitride. In this case, a dielectric layer having optical transparency can be suitably realized.

(19) As one aspect of the present disclosure, the second electroconductive layer may contain at least one of ITO, a zinc oxide-based electric conductor, titanium nitride, and cadmium oxide. In this case, the second electroconductive layer having optical transparency can be suitably realized.

(20) As one aspect, the light-emitting device of the present disclosure may include: a spatial light modulator having the above-described structure; and a surface light source optically coupled to the front surface or the back surface of the spatial light modulator. According to the said light-emitting device, the number of effective pixels can be increased by the inclusion of any of the spatial light modulators described above, and hence a dynamic optical image with high image quality can be obtained.

(21) As one aspect of the present disclosure, the surface light source preferably includes a photonic crystal surface emitting laser element. For example, as a result of such configuration, the surface light source can be easily implemented.

(22) As one aspect of the present disclosure, it is preferable that the surface light source includes a surface emitting laser element in which an active layer and a phase modulation layer are included, and the phase modulation layer includes: a base layer; and a plurality of modified refractive index regions that have a refractive index different from that of the base layer and that are two-dimensionally distributed in a plane perpendicular to the thickness direction of the phase modulation layer. In such configuration, it is preferable that the centroid position of each of the plurality of modified refractive index regions is configured such that (1) the centroid is placed in a state of being away from the corresponding lattice point of the virtual square lattice set on the surface of the phase modulation layer, and the rotation angle around the corresponding lattice point, defined by the angle between the square lattice and the line segment connecting between the centroid and the corresponding lattice point, is individually set, or (2) the centroid is placed on a straight line that passes through the corresponding lattice point and that is inclined with respect to the square lattice, and the distance to the corresponding lattice point is individually set. Even with such configuration, for example, the surface light source can be realized.

As described above, each aspect listed in the section of [Description of Embodiments of Present Application] is applicable to each of all the remaining aspects or to all combinations of these remaining aspects.

DETAILS OF EMBODIMENTS OF PRESENT APPLICATION

Hereinafter, specific structures of the spatial light modulator and the light-emitting device according to the present embodiment will be described in detail with reference to the accompanying drawings. Note that the present invention is not limited to these examples, but is indicated by the claims, and is intended to include meanings equivalent to the claims and all modifications within the scope. In the description of the drawings, the same elements are denoted by the same reference numerals, and redundant description is omitted.

First Embodiment

FIG. 1 is a cutaway perspective view illustrating an appearance of a spatial light modulator 1A according to the first embodiment of the present disclosure, and is an enlarged view of a part of the spatial light modulator 1A. This spatial light modulator 1A is a surface waveguide-type spatial light modulator, and includes a substrate 10.

The substrate 10 has a flat plate shape having a front surface 11 and a back surface 12. The front surface 11 and the back surface 12 each are flat and they are parallel to each other. The thickness of the substrate 10 (the distance between the front surface 11 and the back surface 12) is, for example, 0.05 mm or more and 1.0 mm or less. Note that, in a case where the thickness of the substrate 10 is, for example, 0.1 mm or less, the spatial light modulator 1A has a decreased strength (becomes sensitive to impact). For this reason, for example, another support substrate having optical transparency is affixed to the front surface and/or the back surface of the spatial light modulator 1A, thereby enhancing the strength of the spatial light modulator 1A. In other words, another support substrate having optical transparency is affixed to the front surface and/or the back surface of the spatial light modulator 1A, thereby reducing the thickness of the substrate 10. The substrate 10 mainly contains a semiconductor, and, in one example, is comprised of only a semiconductor. The semiconductor contained in the substrate 10 includes, for example, at least one of Si, Ge, GaAs, InP, and GaN. In one example, the substrate 10 is a Si substrate, a Ge substrate, a GaAs substrate, an InP substrate, or a GaN substrate. The substrate 10 may be a single crystal substrate or a polycrystalline substrate. As the planar shape of the substrate 10, various shapes such as a circular shape, a square shape, and a rectangular shape can be adopted. The diameter (or the length of the long side) of the substrate 10 is, for example, 5 mm or more and 450 mm or less.

The substrate 10 has a plurality of through-holes 13. The plurality of through-holes 13 penetrates between the front surface 11 and the back surface 12. The plurality of through-holes 13 is arranged one-dimensionally or two-dimensionally on a plane perpendicular to the thickness direction of the substrate 10 (that is to say, a plane parallel to the front surface 11 and the back surface 12). The wording "one-dimensionally" means an arrangement in which a plurality of objects is arranged along a certain direction. The wording "two-dimensionally" means an arrangement in which a plurality of objects is arranged planarly with a certain regularity (e.g. an arrangement in which a plurality of objects is arranged along each of two orthogonal directions). In the present embodiment, the centroids of the planar shapes (when the planar shape is a circle, the centers of the circles) of the plurality of through-holes 13 are located at lattice points of the square lattices on at least one of the front surface 11 and the back surface 12.

Furthermore, on the front surface 11 of the substrate 10 is provided a wiring electrode 32 allocated to each of the plurality of through-holes 13. Note that the wiring electrode 32 (a first electrode) may include a plurality of electrodes. On the back surface 12 of the substrate 10 is provided a wiring electrode 31 (a second electrode), which covers a region between each of the plurality of through-holes 13, as a common electrode.

Figure 2A:
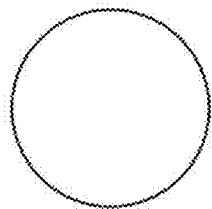
FIGS. 2A to 2I are diagrams illustrating examples of shapes of through-holes 13 as viewed from the thickness direction of a substrate 10.
Figure 2F:
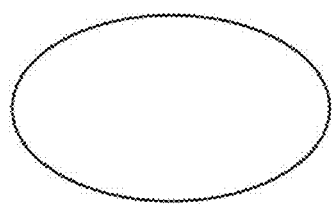
Figure 2B:
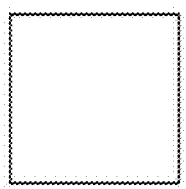
Figure 2G:
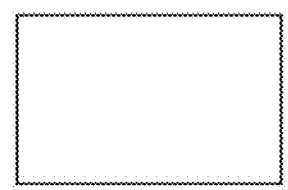
Figure 2C:
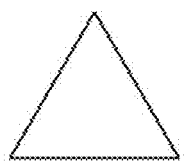
Figure 2H:
Figure 2D:
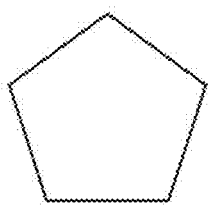
Figure 2I:
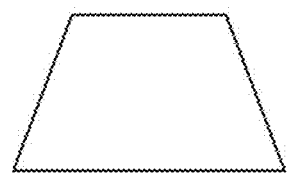
Figure 2E:
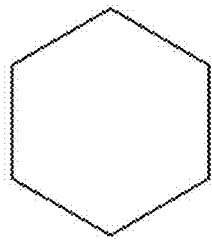

FIGS. 2A to 2I are diagrams illustrating examples of the shape of each through-hole 13 as viewed from the thickness direction of the substrate 10. As the shape of the through-hole 13, FIG. 2A shows a circular shape, FIG. 2B shows a square shape, FIG. 2C shows an equilateral triangle, FIG. 2D shows a regular pentagon, and FIG. 2E shows a regular hexagon. These circles or regular polygons are examples of shapes having rotational symmetry. FIG. 2F shows an elliptical shape, FIG. 2G shows a rectangular shape, FIG. 2H shows an isosceles triangle, and FIG. 2I shows a trapezoid. These are examples of shapes having reflection symmetry (axial symmetry).

The shapes of the plurality of through-holes 13 as viewed along the thickness direction of the substrate 10 (e.g. the shape defined on the front surface 11 of the substrate 10) may all be the same or may include shapes different from each other. However, the wording "the shapes are the same" does not mean the sameness in a strict sense, and manufacturing errors are allowed. The inner diameter of each through-hole 13 is, for example, 0.1 μm or more and 10 μm or less. Note that, in the following description, the aspect ratio of the through-hole 13 refers to the ratio $(Z_2/Z_1)$ of the length $Z_2$ of the through-hole 13 in the penetrating direction to the inner diameter $Z_1$ of the through-hole 13.

Figure 3:
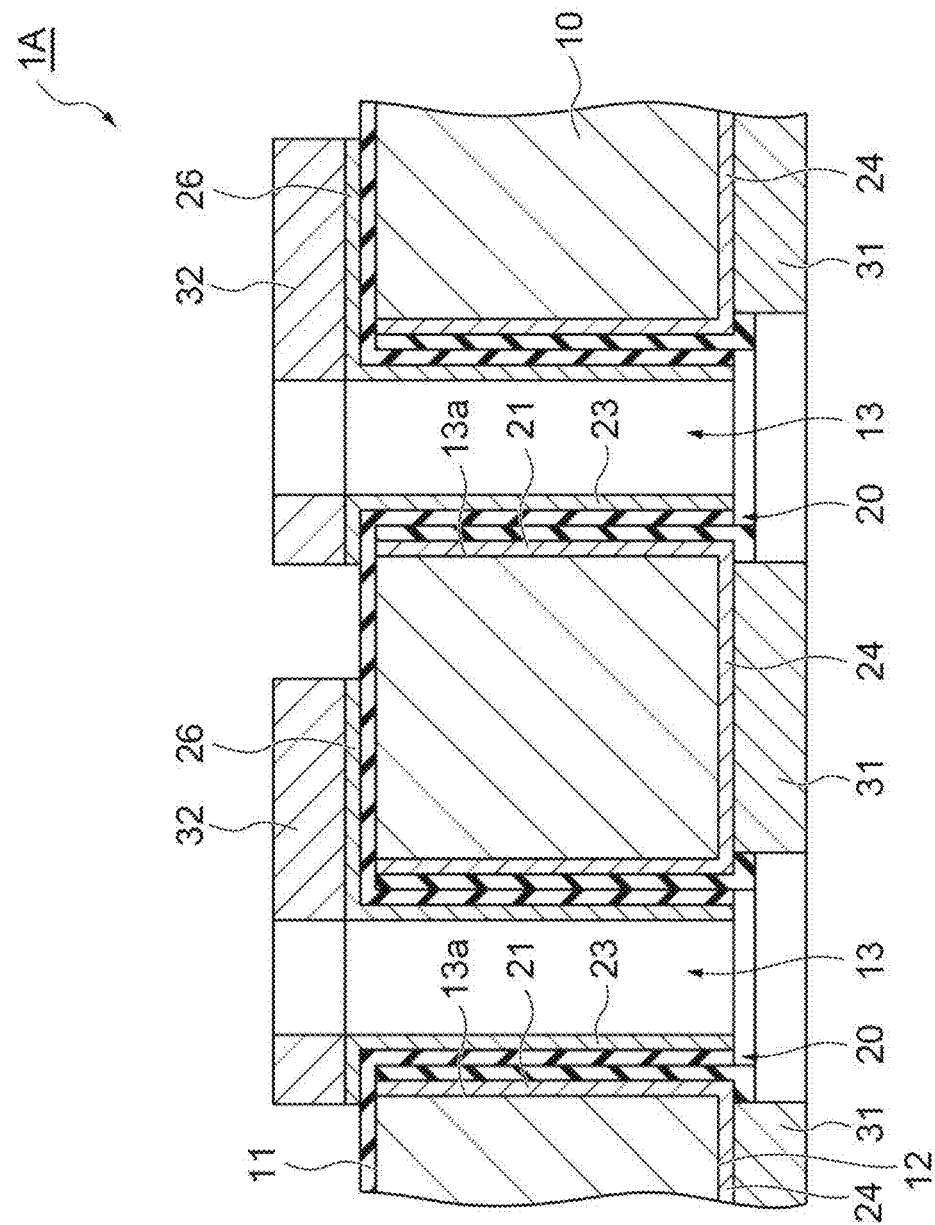
FIG. 3 is a cross-sectional view taken along line III-III illustrated in FIG. 1, and is a diagram illustrating a side cross section of the spatial light modulator 1A.

FIG. 3 is a cross-sectional view taken along line III-III illustrated in FIG. 1, and illustrates a side cross section of the spatial light modulator 1A. As illustrated in FIG. 3, each through-hole 13 extends straight in the thickness direction (that is to say, a direction perpendicular to the front surface 11 and the back surface 12) of the substrate 10. In addition, as illustrated in FIG. 3, the spatial light modulator 1A further includes a plurality of layered structures 20. Each of the plurality of layered structures 20 covers the inner wall 13a of each of the plurality of through-holes 13.

Figure 4:
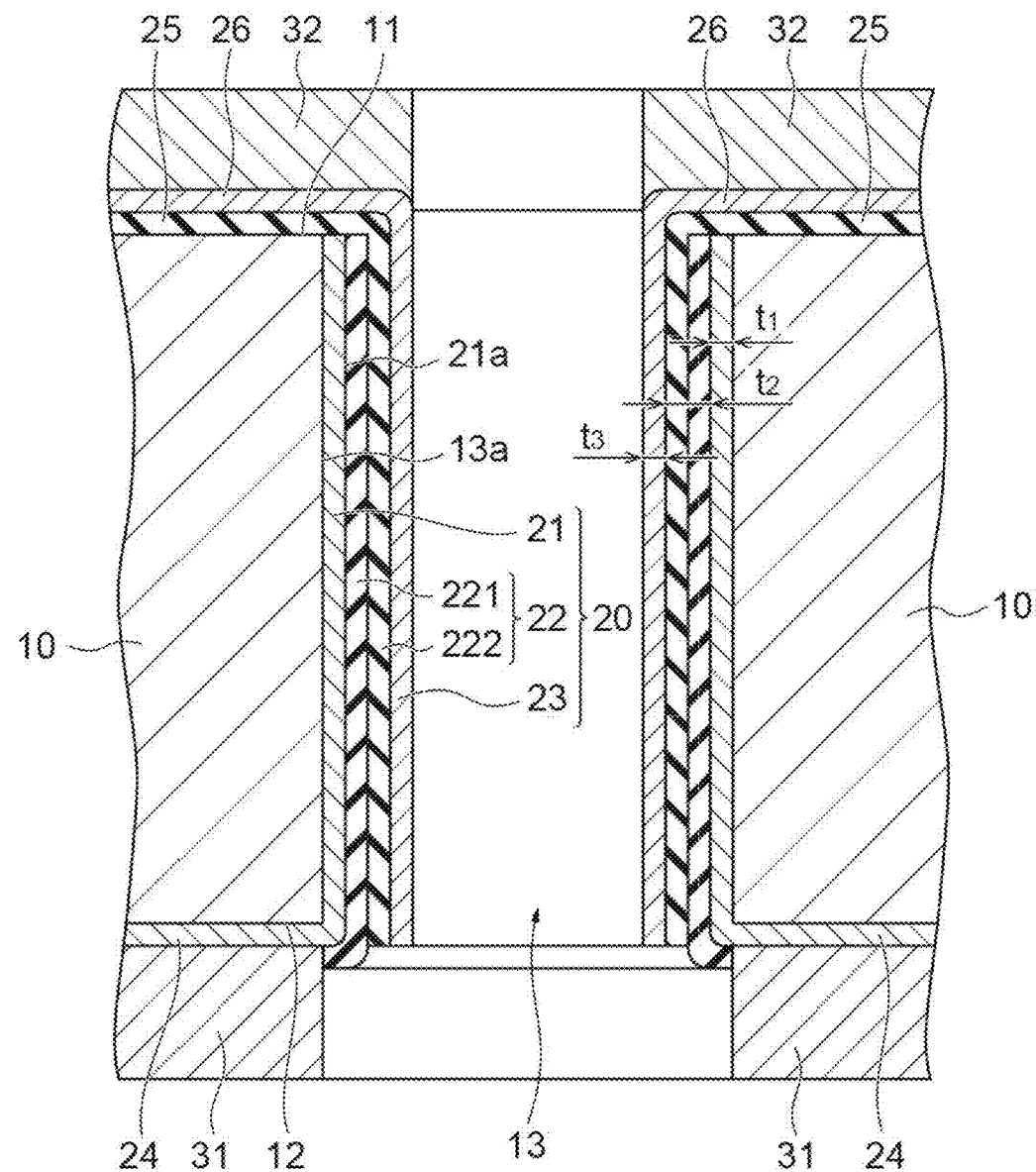
FIG. 4 is a partially enlarged view of FIG. 3.

FIG. 4 is a partially enlarged view of FIG. 3. The layered structure 20 includes an electroconductive layer 21 (a first electroconductive layer), a dielectric layer 22, and an electroconductive layer 23 (a second electroconductive layer). The electroconductive layer 21 is provided on the inner wall 13a of the through-hole 13. The electroconductive layer 21 illustrated in FIGS. 3 and 4 is provided on the inner wall 13a of the through-hole 13 so as to extend from the front surface 11 to the back surface 12, but is not limited to this form, and may be provided, for example, from the back surface 12 to the partway of the through-hole 13 (i.e. so as not to extend to the front surface 11). The electroconductive layer 21 is, for example, a metal layer. In that case, the electroconductive layer 21 contains, for example, Pt. In one example, the electroconductive layer 21 is a Pt layer. Note that the electroconductive layer 21 may contain a metal other than Pt, or may be comprised of a metal other than Pt. The thickness $t_1$ of the electroconductive layer 21 is, for example, 10 nm or more and 1000 nm or less. The surface 21a of the electroconductive layer 21 is a smooth surface with less unevenness.

The dielectric layer 22 is provided on the electroconductive layer 21 and insulates the electroconductive layer 21 and the electroconductive layer 23 from each other. The dielectric layer 22 of the present embodiment includes a first layer 221 provided on the electroconductive layer 21 and a second layer 222 provided on the first layer 221. The dielectric layer 22 shown in FIGS. 3 and 4 is provided on the inner wall 13a of the through-hole 13 from the front surface 11 to the back surface 12, but is not limited to this form, and may be provided only on a part of the inner wall 13a (e.g. from one of the front surface 11 and the back surface 12 to the partway of the through-hole 13) as long as the electroconductive layer 21 and the electroconductive layer 23 are mutually insulated. The first layer 221 and the second layer 222 of the dielectric layer 22 mainly contain an inorganic dielectric material having optical transparency, and in one example, comprised of only an inorganic dielectric material. For example, the first layer 221 and the second layer 222 of the dielectric layer 22 may contain at least one of aluminum oxide ($Al_2O_3$), hafnium oxide ($HfO_2$), silicon oxide ($SiO_2$), and silicon nitride (SiN), and may be a layer comprised of a mixture of at least two of them. In one example, the first layer 221 and the second layer 222 each are an $Al_2O_3$ layer, an $HfO_2$ layer, a $SiO_2$ layer, or a SiN layer. Note that, the constituent materials of the first layer 221 and the second layer 222 may be the same as or different from each other. In the description of the present embodiment, the wording "having optical transparency" refers to a property in which an absorption coefficient at a wavelength (e.g. included in visible range or near-infrared range) of light incident on the spatial light modulator 1A is 0.1 $cm^{-1}$ or less. As such, the decrease in light intensity is in an amount of 10% or less even when the light is transmitted through a layer having a thickness of 1 mm. Note that, as long as having optical transparency, at least one of the first layer 221 and the second layer 222 may contain another dielectric material other than $Al_2O_3$, $HfO_2$, $SiO_2$, and SiN, or may be comprised of another dielectric material other than $Al_2O_3$, $HfO_2$, $SiO_2$, and SiN. The thickness $t_2$ of the dielectric layer 22 is, for example, 1 nm or more and 20 nm or less. The surface, which is in contact with the electroconductive layer 21, of the dielectric layer 22 is a smooth surface with less unevenness. Note that, in a case where only one of the first layer 221 and the second layer 222 can sufficiently insulate the electroconductive layer 21 and the electroconductive layer 23, the other of the first layer 221 and the second layer 222 may be omitted.

The electroconductive layer 23 is provided on the dielectric layer 22. In other words, the electroconductive layer 23 is provided on the electroconductive layer 21 with the dielectric layer 22 interposed therebetween. The electroconductive layer 23 illustrated in FIGS. 3 and 4 is provided on the inner wall 13a of the through-hole 13 from the front surface 11 to the back surface 12, but is not limited to this form, and may be provided, for example, from the front surface 11 to the partway of the through-hole 13 (i.e. so as not to extend to the back surface 12). The electroconductive layer 23 mainly contains an electric conductor having optical transparency, and is comprised of only an electric conductor having optical transparency, for example. In one example, the electroconductive layer 23 includes at least one of indium tin oxide (ITO) and a zinc oxide-based electric conductor (e.g. gallium doped zinc oxide (GZO), aluminum doped zinc oxide (AZO), etc.), and in one example, the electroconductive layer 23 is an ITO layer or an AZO layer. Note that the electroconductive layer 23 may contain an optically transparent electric conductor other than ITO and AZO, or may be comprised of an optically transparent electric conductor other than ITO and AZO. The thickness $t_3$ of the electroconductive layer 23 is, for example, 1 nm or more and 20 nm or less.

The electroconductive layer 24 is provided on the entire surface of the back surface 12. The electroconductive layer 24 is a layer formed concurrently with the electroconductive layer 21, and the constituent material thereof is the same as that of the electroconductive layer 21. In one example, the electroconductive layer 24 is in contact with the back surface 12. The electroconductive layer 21 in each through-hole 13 is connected to the electroconductive layer 24. A wiring electrode 31 (a second electrode) is provided on the electroconductive layer 24. The wiring electrode 31 is in contact with the electroconductive layer 24 and is electrically connected to the electroconductive layer 21 in each through-hole 13 via the electroconductive layer 24. That is, the wiring electrode 31 is provided in common to the plurality of through-holes 13. The wiring electrode 31 is a metal film such as an Au film, for example. Note that the material of this metal film is not limited to only Au, and may be a material such as Cr/Au, Ti/Au, or Ti/Pt/Au, for example, in order to increase adhesion. The wiring electrode 31 shown in FIGS. 3 and 4 is provided on the entire surface of the electroconductive layer 24, and covers the entire region between each of the plurality of through-holes 13 on the back surface 12. Note that, the electroconductive layer 24 and the wiring electrode 31 may be removed in the region, having no through-hole 13 formed, out of the back surface 12. As a result, the metal peeling can be eliminated at the time of cutting out the device from the wafer, and the adhesion of a metal dust that is difficult to be removed can be suppressed.

On the entire surface of the front surface 11 is provided a dielectric layer 25. The dielectric layer 25 is a layer formed concurrently with the first layer 221 or the second layer 222 (the second layer 222 in the example of FIGS. 3 and 4) of the dielectric layer 22, and its constituent material is the same as that of the concurrently formed first layer 221 or second layer 222. In one example, dielectric layer 25 is in contact with the front surface 11. The first layer 221 or the second layer 222 in each through-hole 13 is connected to the dielectric layer 25.

An electroconductive layer 26 is provided on the dielectric layer 25. The electroconductive layer 26 is a layer to be formed concurrently with the electroconductive layer 23, and the constituent material thereof is the same as that of the electroconductive layer 23. In one example, the electroconductive layer 26 is in contact with the dielectric layer 25. On the electroconductive layer 26 is provided a wiring electrode 32 (a first electrode). The wiring electrode 32 is in contact with the electroconductive layer 26 and is electrically connected to the electroconductive layer 23 in each through-hole 13 via the electroconductive layer 26. The electroconductive layer 26 and the wiring electrode 32 are provided in an independent region for one or more through-holes 13 (for one through-hole 13 in the example of FIGS. 3 and 4), and are electrically isolated (insulated) for each region (i.e. for one or more through-holes 13). FIG. 1 illustrates a case where the planar shapes of the electroconductive layer 26 and the wiring electrode 32 are square, but the planar shapes of the electroconductive layer 26 and the wiring electrode 32 are not limited thereto, and may be another shape such as a circular shape, for example. The wiring electrode 32 may have a layered structure including: a first film (e.g. a Cr film or a Ti film) in contact with the electroconductive layer 26; and a second film (e.g. an Au film) provided on the first film. The wiring electrode 32 may have a layered structure of three or more layers such as Ti/Pt/Au.

Figure 5:
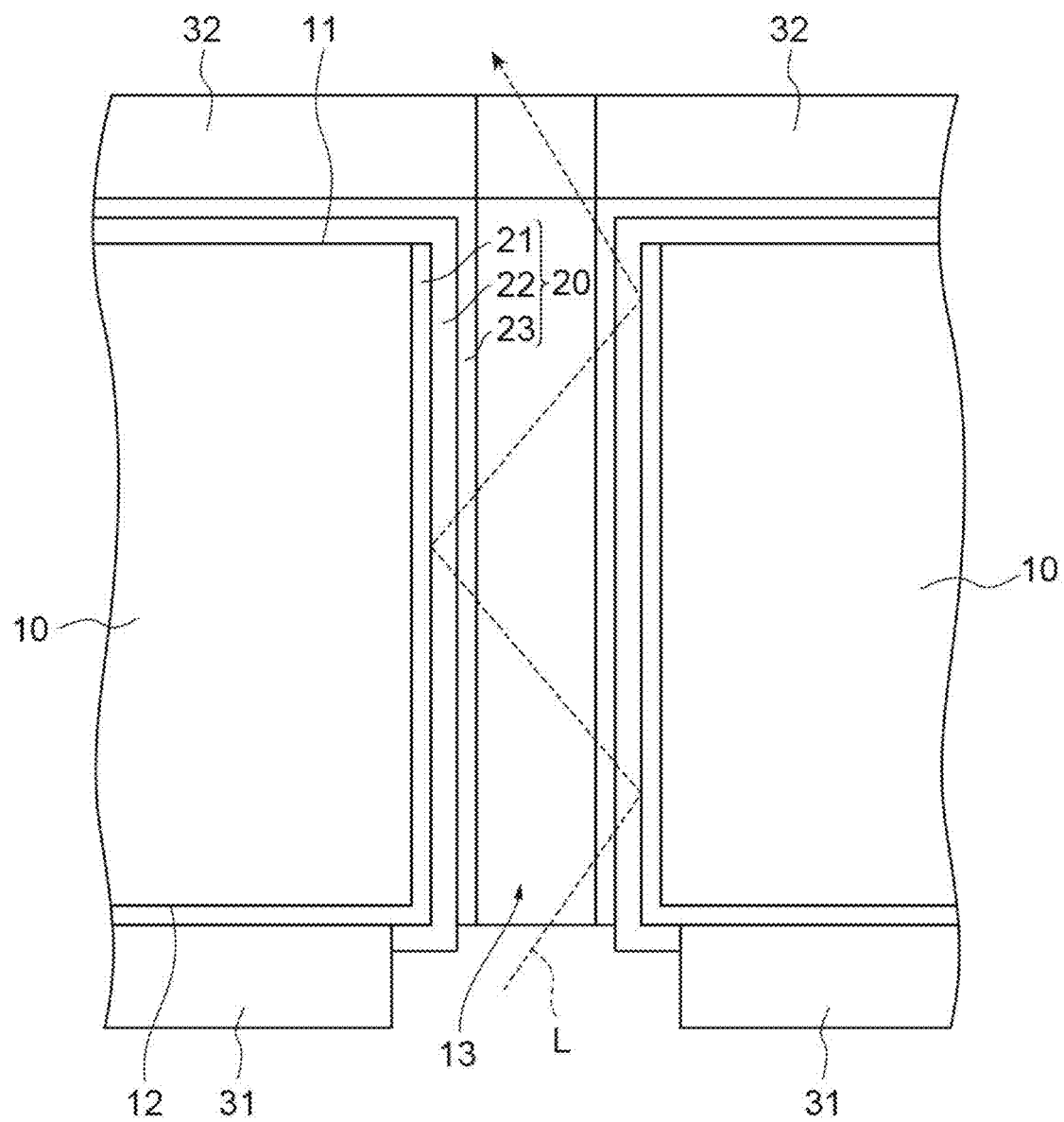
FIG. 5 is a diagram for explaining an operation of the spatial light modulator 1A.

The operation of the above-described spatial light modulator 1A will be described. As illustrated in FIG. 5, light L enters from the back surface 12 side of the substrate 10, and then the light L passes through the plurality of through-holes 13. The light L incident at this time is desirably a spatially coherent light having a spatially aligned phase. The light L incident into each through-hole 13 travels while being reflected at the interface between the electroconductive layer 21 and the dielectric layer 22 of each layered structure 20, and passes through each through-hole 13. Here, when a voltage is applied between the electroconductive layer 21 and the electroconductive layer 23 in a certain through-hole 13, the following three phenomena occur in the said layered structure 20.

(1) Change in the Refractive Index of the Electroconductive Layer 23 Depending on the Density of Carriers Accumulated in the Electroconductive Layer 23

Since the electroconductive layer 21 and the electroconductive layer 23 are provided with the dielectric layer 22 interposed therebetween, they make up a capacitor. Therefore, when a voltage is applied between the electroconductive layer 21 and the electroconductive layer 23, carriers of one of electrons or holes accumulate in the vicinity of the interface of the electroconductive layer 21 with the dielectric layer 22, and carriers of the other of electrons or holes accumulate in the vicinity of the interface of the electroconductive layer 23 with the dielectric layer 22. In a case where the electroconductive layer 23 mainly contains an inorganic electric conductor such as ITO or AZO, a portion in the vicinity of the said interface of the electroconductive layer 23 is metallized by the accumulation of the carriers, and the refractive index of the portion changes. The more carriers are accumulated (i.e. the higher the applied voltage), the larger the amount of change in the refractive index. As a result of this, the optical path length of the light L transmitted through the portion changes. The change in the refractive index associated with the carrier accumulation can be estimated using, for example, Drude model or the like. In the Drude model, the vicinity of the resonance wavelength, in which the real part of the dielectric constant becomes close to 0, is called an epsilon near zero (ENZ) region, and is a region where the change of refractive index is large. For this reason, by choosing the wavelength of light to be within the ENZ region, a large amount of phase modulation can be achieved.

(2) Change in the Refractive Index of the Dielectric Layer 22 Caused by an Electric Field Between the Electroconductive Layer 21 and the Electroconductive Layer 23

Since the dielectric layer 22 is sandwiched between the electroconductive layer 21 and the electroconductive layer 23, an electric field passing through the dielectric layer 22 is generated when a voltage is applied between the electroconductive layer 21 and the electroconductive layer 23. An electro-optic effect caused by this electric field gives rise to the change in the refractive index of the dielectric layer 22. The stronger the electric field (i.e. the higher the applied voltage), the larger the amount of change in the refractive index. As a result of this, the optical path length of the light L transmitted through the dielectric layer 22 changes.

(3) Change in the Amount of Phase Shift Before and After the Reflection at the Interface Between the Electroconductive Layer 21 and Dielectric Layer 22

In the layered structure 20, the light L transmitted through the electroconductive layer 23 and the dielectric layer 22 is reflected at the electroconductive layer 21, then is transmitted through the dielectric layer 22 and the electroconductive layer 23 again, and finally is outputted. In a case where the thickness of the dielectric layer 22 is sufficiently smaller than the wavelength of the light L, when a voltage is applied between the electroconductive layer 21 and the electroconductive layer 23, an induced current electromagnetic field in mutually opposite directions, called gap surface plasmon mode, is created in each of the electroconductive layer 21 and the electroconductive layer 23. As a result, a strong magnetic resonance (plasmon resonance) occurs in the dielectric layer 22. This magnetic resonance changes the amount of the phase shift before and after the reflection at the interface between the electroconductive layer 21 and the dielectric layer 22. The amount of the phase shift at this time depends on the magnitude of the voltage applied between the electroconductive layer 21 and the electroconductive layer 23. In addition, in a case of total reflection in the layered structure 20, a phase shift called Goos-Hänchen shift also exists. For this reason, the amount of this phase shift can also be controlled by altering the refractive index with varied applied voltage.

On account of the above-described phenomena (1) to (3), the phase of the light L emitted from each through-hole 13 varies depending on the magnitude of the voltage between the electroconductive layer 21 and the electroconductive layer 23. Then, the electroconductive layer 23 of the present embodiment is electrically isolated for each group including one or more through-holes 13. As a result, the magnitude of the voltage between the electroconductive layer 21 and the electroconductive layer 23 can be individually chosen for each of the one or more through-holes 13. Note that, the voltage between the electroconductive layer 21 and the electroconductive layer 23 is applied from the outside of the spatial light modulator 1A via the wiring electrode 31 on the back surface 12 and via the wiring electrode 32 on the front surface 11. The above-described operation enables the spatial light modulator 1A to control the phase distribution of the light L spatially and dynamically.

FIG. 6 is a diagram conceptually illustrating a state of the light L in a case where there is an inclination in the magnitude of the voltage between the electroconductive layer 21 and the electroconductive layer 23 among the plurality of through-holes 13 arranged in a certain direction. The length of the arrow of the light L illustrated in FIG. 6 represents the amount of the phase shift. In a case where there is an inclination in the magnitude of the voltage, as illustrated in FIG. 6, the phase of the light L emitted from each through-hole 13 is also distributed with a certain inclination. Then, an emitted light $L_{out}$ from the spatial light modulator 1A as a resultant of these light L is emitted along the normal direction of the inclination. Note that, in the present embodiment, the magnitude of the voltage between the electroconductive layer 21 and the electroconductive layer 23 is calculated according to a desired optical image, and is freely determined for each through-hole 13.

Figure 7A:
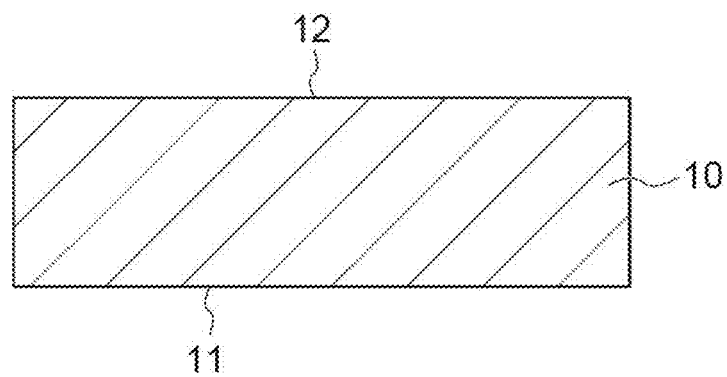
FIGS. 7A to 7D are diagrams illustrating an example of a method of manufacturing the spatial light modulator 1A.
Figure 7B:
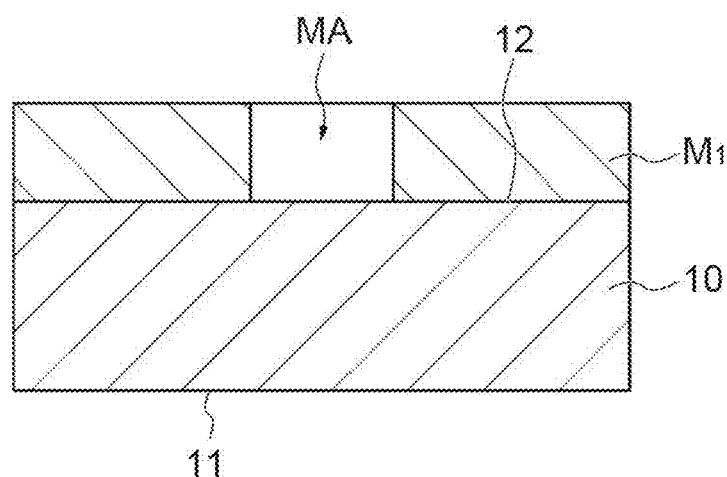

Here, a method of manufacturing the spatial light modulator 1A of the present embodiment will be described. FIGS. 7A to 10C are diagrams illustrating an example of a method of manufacturing the spatial light modulator 1A. First, as illustrated in FIG. 7A, there is provided a substrate 10 having a front surface 11 and a back surface 12 being flat and parallel to each other. Next, as illustrated in FIG. 7B, a resist is applied on the back surface 12 (or may be on the front surface 11), and the resist is exposed (or irradiated with an electron beam) and developed to form a resist mask $M_1$. The resist mask $M_1$ has a plurality of openings MA corresponding to the plurality of through-holes 13 (see FIG. 1).

Figure 7C:
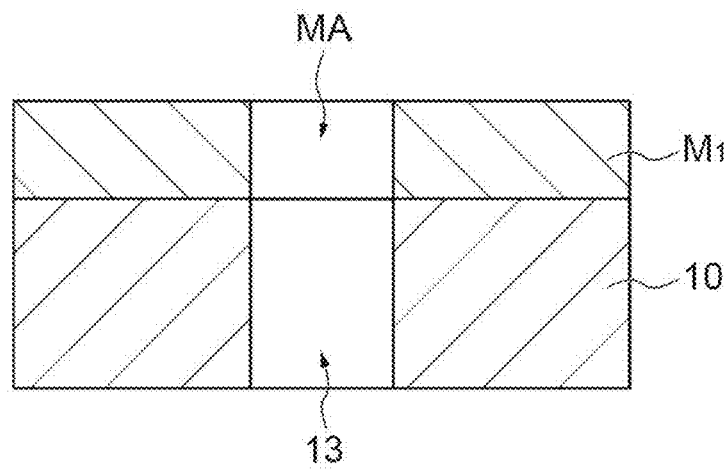
Figure 7D:
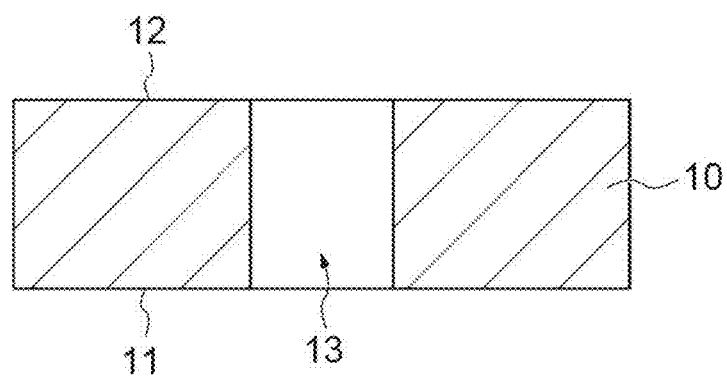

Subsequently, as illustrated in FIG. 7C, the substrate 10 is etched through the opening of the resist mask $M_1$. This etching is, for example, a dry etching, and in one example, an inductively coupled plasma (ICP) etching through Bosch process. Thereafter, as shown in FIG. 7D, the resist mask $M_1$ is removed through organic cleaning. Note that, during etching the substrate 10, in a case where the etching selectivity between the resist mask $M_1$ and the substrate 10 is not sufficient, a silicon compound film such as SiN or $SiO_2$ is deposited on the back surface 12 (or on the front surface 11) prior to the application of the resist. After the resist mask $M_1$ is formed on the silicon compound, the opening MA may be transferred to the silicon compound film. The substrate 10 may be then etched using this silicon compound film as an etching mask. Note that the etching mask is not limited to the silicon compound film, and other inorganic dielectric material such as $Al_2O_3$ or $HfO_2$ can also be used.

Figure 8A:
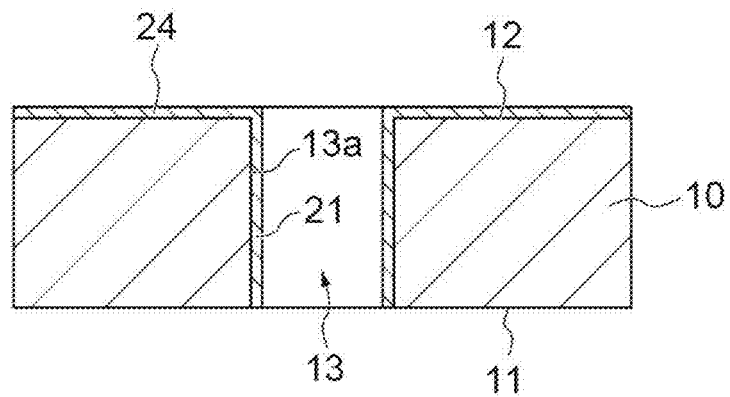
FIGS. 8A to 8D are diagrams illustrating an example of a method of manufacturing the spatial light modulator 1A.
Figure 8B:
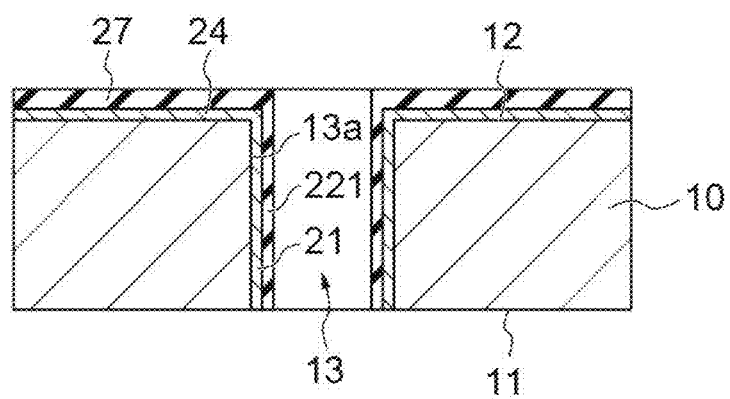

Subsequently, as illustrated in FIG. 8A, the electroconductive layers 21 and 24 are formed. In this step, atomic layer deposition (ALD) is used. Through the ALD, the material of the electroconductive layers 21, 24 can be isotropically thinly and uniformly deposited on the inner wall 13a of each through-hole 13 and the back surface 12 of the substrate 10. Note that, typically, the ALD is suitable for the deposition of a film inside a hole having a high aspect ratio, but not limited to the ALD, other method such as electroplating, vapor deposition, or sputter deposition may be used to form the electroconductive layers 21 and 24. Subsequently, as illustrated in FIG. 8B, the first layer 221 of the dielectric layer 22 is formed. In this step, by using the ALD, as in the case of the electroconductive layers 21 and 24, the material of the first layer 221 is thinly and uniformly deposited on the inner wall 13a of each through-hole 13. At this time, a dielectric layer 27 comprised of the same material as that of the first layer 221 is formed on the back surface 12 of the substrate 10. Also in this step, not limited to the ALD, another method such as sputter deposition may be used to form the first layer 221.

Figure 8C:
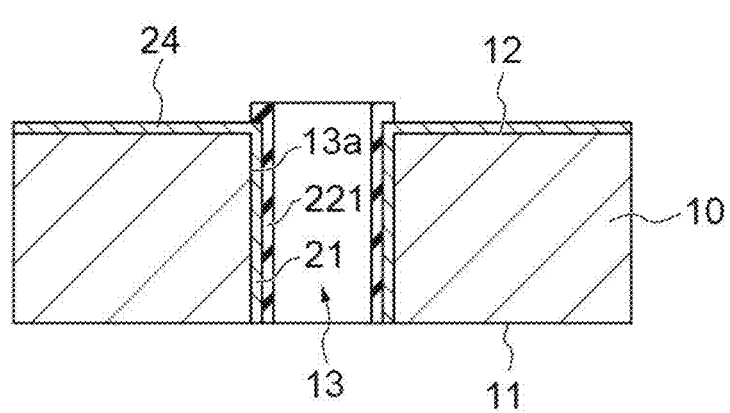
Figure 8D:
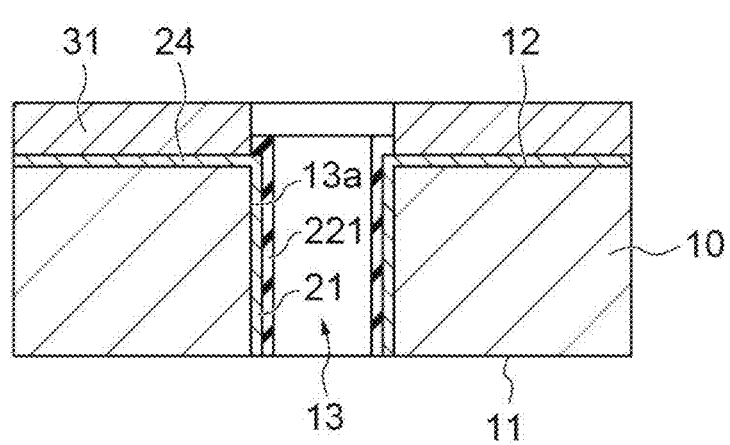

Subsequently, as illustrated in FIG. 8C, by removing the dielectric layer 27, the electroconductive layer 24 below the dielectric layer 27 is exposed. In this step, the dielectric layer 27 can be removed by, for example, wet etching using a hydrofluoric acid-based solvent or dry etching using a hydrofluoric acid-based gas. Subsequently, as illustrated in FIG. 8D, a wiring electrode 31 is formed on the exposed electroconductive layer 24. In this step, the wiring electrode 31 is formed using, for example, an electroplating technique or vapor deposition.

Figure 9A:
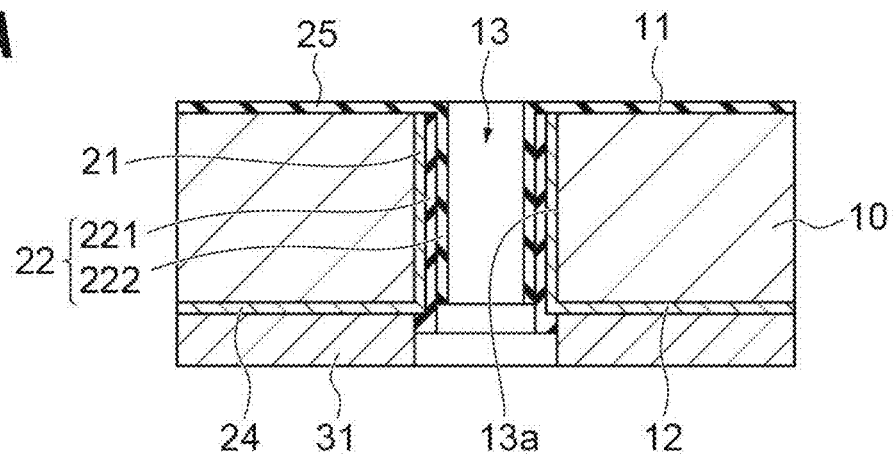
FIGS. 9A to 9C are diagrams illustrating an example of a method of manufacturing the spatial light modulator 1A.

Subsequently, as illustrated in FIG. 9A, the front surface 11 is directed upward by reversing the substrate 10. Then, the second layer 222 of the dielectric layer 22 and the dielectric layer 25 are formed. In this step, by using the ALD as in the case of the first layer 221, the material for the second layer 222 and the dielectric layer 25 are thinly and uniformly deposited on the inner wall 13a of each through-hole 13 and the front surface 11 of the substrate 10. Also in this step, the second layer 222 and the dielectric layer 25 may be formed not only by the ALD but also by another method such as sputter deposition.

Figure 9B:
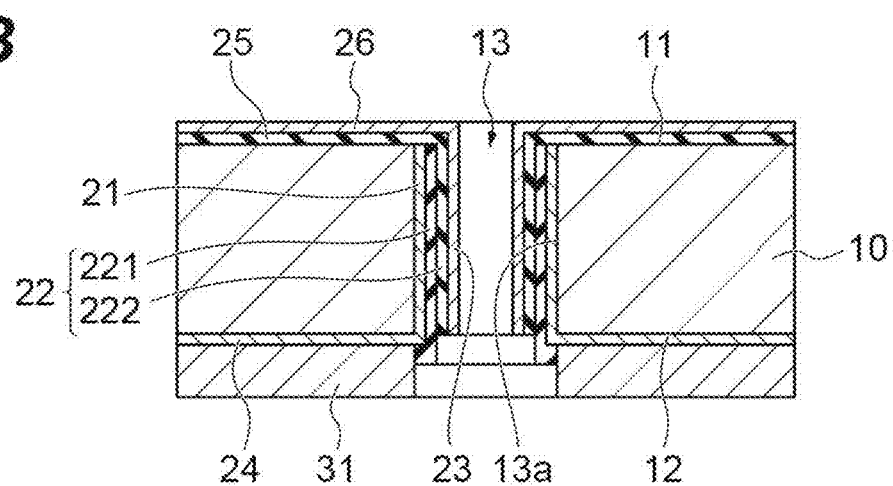

Subsequently, as illustrated in FIG. 9B, the electroconductive layer 23 and the electroconductive layer 26 are formed. In this step, by using the ALD as in the case of the electroconductive layers 21 and 24, the material for the electroconductive layers 23 and 26 is thinly and uniformly deposited on the inner wall 13a of each through-hole 13 and the front surface 11 of the substrate 10. Also in this step, the electroconductive layers 23 and 26 may be formed not only by the ALD but also by other methods such as sputter deposition.

Figure 9C:
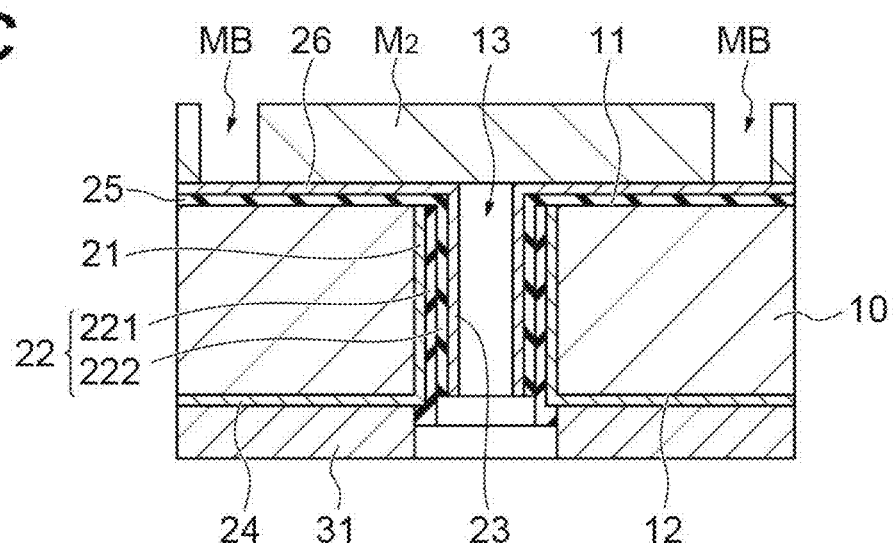
Figure 10A:
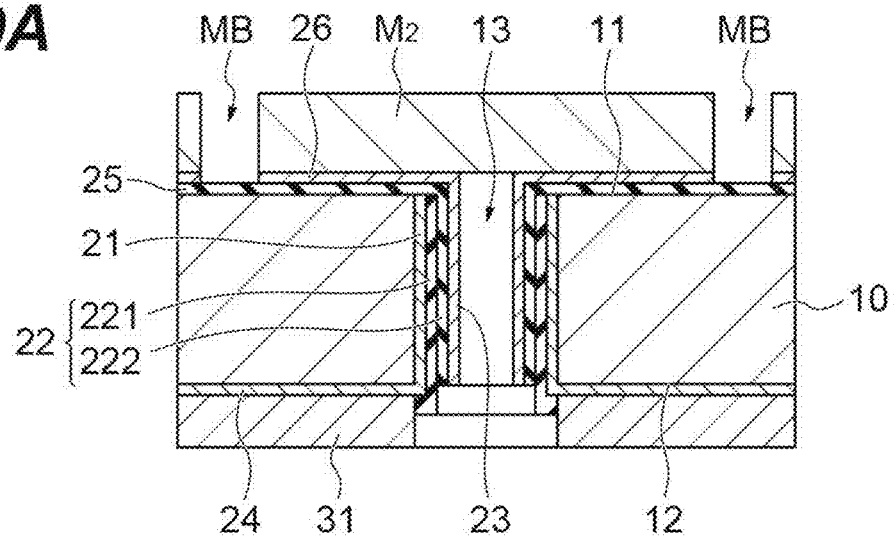
FIGS. 10A to 10C are diagrams illustrating an example of a method of manufacturing the spatial light modulator 1A.
Figure 10B:
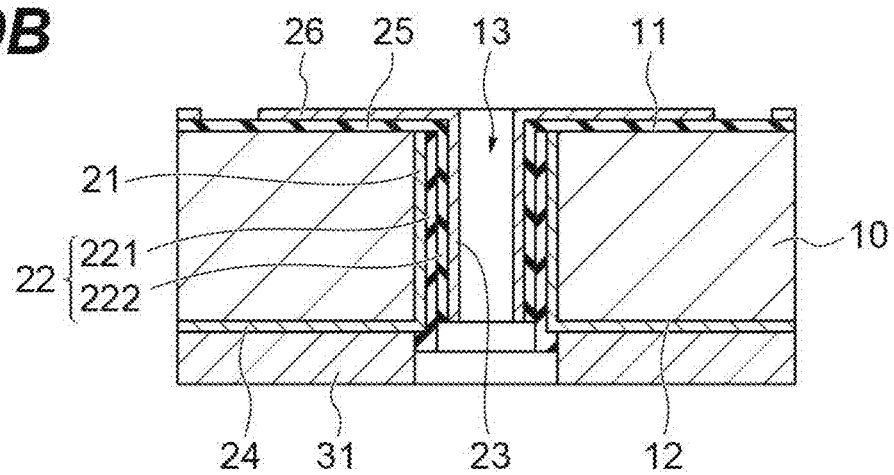
Figure 10C:
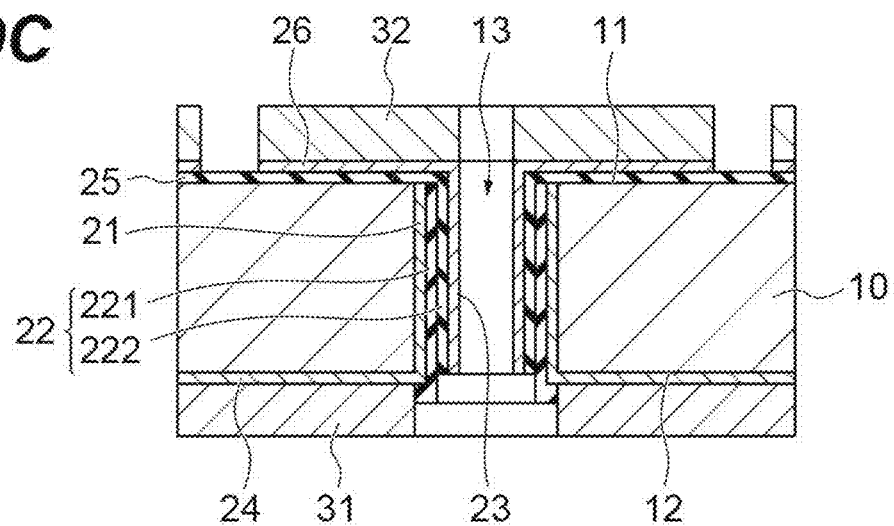

Subsequently, as illustrated in FIG. 9C, after a resist is applied onto the electroconductive layer 26, the resist is exposed (or irradiated with an electron beam) and developed to form a resist mask $M_2$. The resist mask $M_2$ has a latticed opening MB surrounding each group of one or more through-holes 13 of the plurality of through-holes 13. Then, as illustrated in FIG. 10A, the electroconductive layer 26 is etched through the opening MB of the resist mask $M_2$. In this step, the electroconductive layer 26 is etched by, for example, wet etching using a hydrofluoric acid-based solvent or dry etching using a hydrofluoric acid-based gas. Through this step, the electroconductive layers 23 and 26 are electrically isolated for each group including one or more through-holes 13. Thereafter, as shown in FIG. 10B, the resist mask $M_2$ is removed by organic cleaning. Subsequently, as illustrated in FIG. 10C, the wiring electrode 32 is formed on the electroconductive layer 26. In this step, the wiring electrode 32 is formed by using, for example, an electroplating technique. Through the above steps, the spatial light modulator 1A of the present embodiment is manufactured.

Figure 11A:
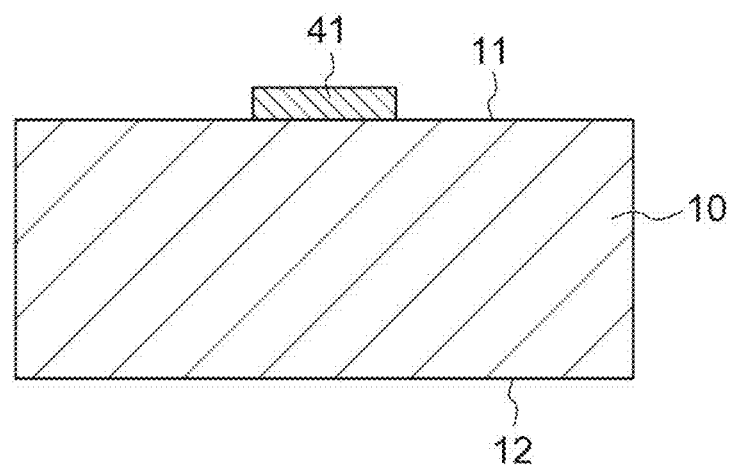
FIGS. 11A to 11C are diagrams illustrating another method (MACE) of forming the plurality of through-holes 13 in the substrate 10.
Figure 11B:
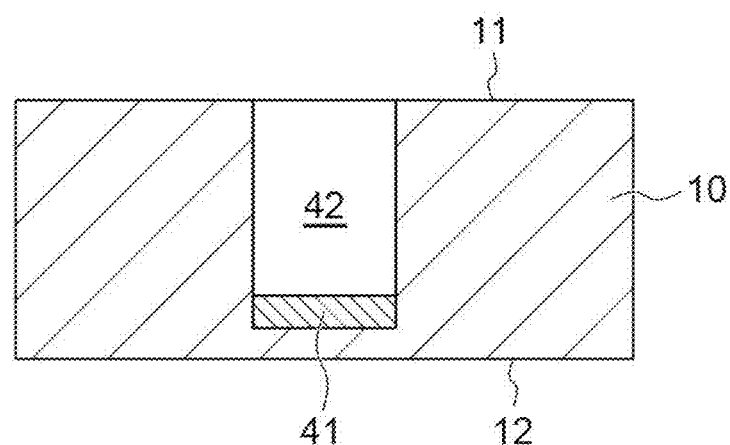
Figure 11C:
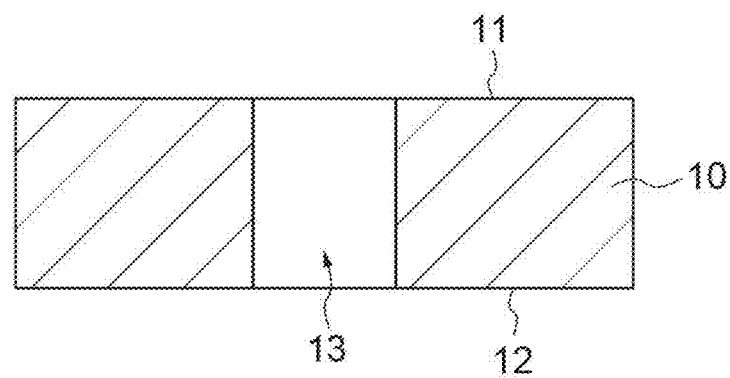

FIGS. 11 to 11C are diagrams illustrating another method (MACE) of forming the plurality of through-holes 13 in the substrate 10. First, as shown in FIG. 11A, a plurality of catalytic metal films 41 each corresponding to each of the plurality of through-holes 13 is formed on the front surface 11 (or the back surface 12). The catalytic metal film 41 includes, for example, a Ti layer in contact with the substrate 10 and an Au layer formed on the Ti layer. Note that, a metal film other than this (a noble metal film comprised of Ag, Pt, Pd, Cu, or the like, for example) may be used as the catalytic metal film 41. Then, the substrate 10 is immersed into an etching solution. As the etching solution, for example, a mixed solution of hydrofluoric acid and hydrogen peroxide water can be used. As a result, as shown in FIG. 11B, the reaction is locally promoted at the contact portion between the catalytic metal film 41 and the substrate 10, and the substrate 10 below the catalytic metal film 41 is selectively etched. This etching proceeds while the catalytic metal film 41 falls down. As a result, a plurality of recesses 42 having a high aspect ratio is formed in the substrate 10. By allowing this etching to proceed (by the penetration of the plurality of recesses 42 through the substrate 10), the plurality of through-holes 13 having a high aspect ratio can be formed. Alternatively, thereafter, as shown in FIG. 11C, an etching or a polishing (or both of them) may be performed on the surface opposite to the surface having the catalytic metal film 41 formed, thereby causing the recess 42 to penetrate through the substrate 10 and removing the catalytic metal film 41. Even in this case, the plurality of through-holes 13 having a high aspect ratio can be formed in the substrate 10. Note that, in the etching or polishing, an enhancement of the parallelism between the front surface 11 and the back surface 12 enables the plurality of through-holes 13 to have a uniform length in the penetration direction and to suppress the variation in the amount of phase shift. The subsequent steps are similar to the steps shown in FIGS. 8A to 10C.

There will be described an effect obtained by the spatial light modulator 1A of the present embodiment described above. As described above, the spatial light modulator 1A of the present embodiment can spatially and dynamically control the phase distribution of light. In addition, since the through-hole 13 can be formed by, for example, an etching process for semiconductor or a method such as MACE, the arrangement period of the through-hole 13 is easily made smaller than the arrangement period of the pixels of liquid crystal-type spatial light modulators. Therefore, in the spatial light modulator 1A, the arrangement period of the through-holes 13, that is, the arrangement period of pixels can be made smaller than that in the conventional art. As a result, the combination of the spatial light modulator 1A and a surface light source such as a photonic crystal laser element increases the number of effective pixels to provide a high-quality optical image.

Furthermore, in comparison with the configuration described in Non-Patent Document 1, the spatial light modulator 1A of the present embodiment has the following advantages. That is, in the configuration described in Non-Patent Document 1, light is required to pass through the substrate portion disposed under the bottom surface of the recess in order for the light to pass through the recess formed on the front surface of the substrate. Hence, the light is limited to be within a wavelength range less likely to be absorbed by the substrate. Furthermore, Non-Patent Document 1 uses MACE as a method of forming a recess. However, when MACE is used to form a bottomed recess, a catalytic metal film remains at the bottom of the recess, and the remaining catalytic metal film scatters light. Regarding these problems, in the spatial light modulator 1A of the present embodiment, the light L passes through the through-hole 13 penetrating between the front surface 11 and the back surface 12 of the substrate 10, and hence the light L does not need to go through the substrate 10. Therefore, in comparison with the configuration described in Non-Patent Document 1, the present embodiment enables to extend an available wavelength range. In addition, even in a case where MACE is used to form the through-hole 13, the catalytic metal film 41 can be easily removed, and hence light is not scattered by the catalytic metal film 41. Therefore, according to the spatial light modulator 1A of the present embodiment, a high-quality optical image can be obtained as compared with the configuration described in Non-Patent Document 1.

As in the present embodiment, the shape of each through-hole 13 as viewed from the thickness direction of the substrate 10 may have rotational symmetry or reflection symmetry. In this case, the bias in the light emission direction from each through-hole 13 can be suppressed.

As in the present embodiment, the shapes of the plurality of through-holes 13 as viewed from the thickness direction of the substrate 10 may be the same as each other. In this case, the emitted light conditions (the light intensity etc.) for each through-hole 13 can be equalized, and a high-quality optical image can be easily formed.

As in the present embodiment, on at least one of the front surface 11 and the back surface 12 of the substrate 10, the centroids of the plurality of through-holes 13 may be located at lattice points of square lattices or triangular lattices. In this case, the plurality of through-holes 13 is regularly aligned on a plane perpendicular to the thickness direction of the substrate 10 (an optical image can be easily designed).

As in the present embodiment, the electroconductive layer 23 may be electrically connected to the wiring electrode 32, provided for each through-hole 13, on the substrate 10. For example, such configuration enables to apply an individual voltage to the electroconductive layer 23 for each through-hole 13. In addition, the electroconductive layer 21 may be electrically connected to the wiring electrode 31, provided in common for the plurality of through-holes 13, on the substrate 10. For example, such configuration facilitates the setting of a reference electric potential with respect to the electroconductive layer 21.

As in the present embodiment, the wiring electrode 31 may cover a region between each of the plurality of through-holes 13 on the back surface 12 of the substrate 10. In this case, the light L can be prevented from passing through the substrate portion other than the through-hole 13, and hence an emitted light $L_{out}$ can be composed only of the light L modulated after passing through the through-hole 13. In addition, the provision of such wiring electrode 31 on the back surface 12 as light-incident surface suppresses the absorption of the light L in the substrate portion other than the through-hole 13 and a temperature rise in the substrate 10.

As in the present embodiment, the substrate 10 may mainly contain a semiconductor. In this case, an etching process for semiconductor or MACE is easily used to form the through-hole 13. Therefore, fine through-holes 13 having a high aspect ratio can be easily formed, and the arrangement period of the through-holes 13 can be easily shortened.

As in the present embodiment, the semiconductor of the substrate 10 may include at least one of Si, Ge, GaAs, InP, and GaN. In this case, a known etching process can be used in the formation of the through-hole 13, and the formation of through-holes 13 is facilitated.

As in the present embodiment, the electroconductive layer 21 may be a metal layer. In this case, the light L can be sufficiently reflected at the interface between the electroconductive layer 21 and the dielectric layer 22.

As in the present embodiment, the electroconductive layer 21 may contain Pt. In this case, for example, by using ALD, the electroconductive layer 21 can be easily formed in a through-hole 13 having a small inner diameter and being long in the penetration direction (i.e. having a large aspect ratio).

As in the present embodiment, the dielectric layer 22 may contain at least one of $Al_2O_3$, $HfO_2$, $SiO_2$, and SiN. In this case, the formation of the dielectric layer 22 having optical transparency becomes suitably feasible.

As in the present embodiment, the electroconductive layer 23 may contain at least one of ITO, a zinc oxide-based electric conductor (GZO, AZO, etc.), titanium nitride, and cadmium oxide. In this case, the formation of the electroconductive layer 23 having optical transparency becomes suitably feasible.

(First Modification)

Figure 12:
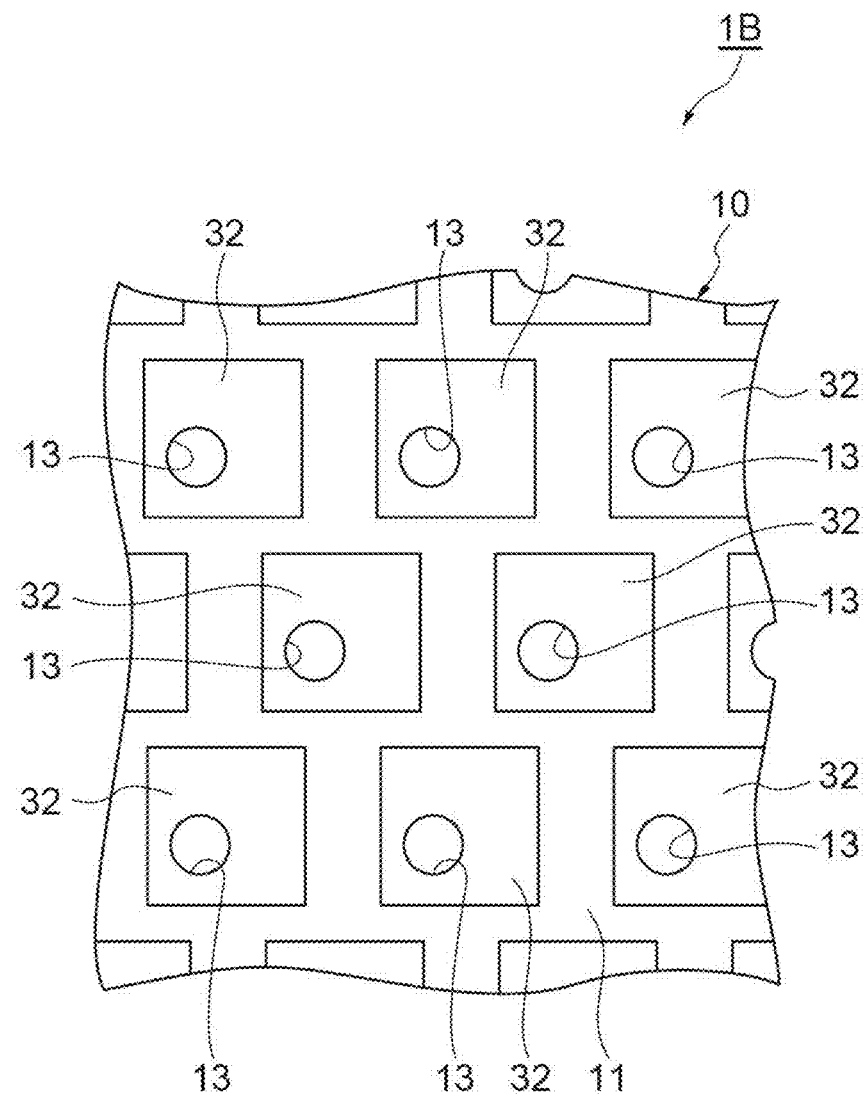
FIG. 12 is a plan view illustrating a spatial light modulator 1B as a first modification.

FIG. 12 is a plan view illustrating a spatial light modulator 1B as the first modification of the above embodiment. In the spatial light modulator 1B, the centroids of the planar shapes (shapes to be defined on the front surface 11) of the plurality of through-holes 13 are located at the lattice points of triangular lattices instead of being located at the lattice points of the square lattices as in the above-described embodiment. Also in this case, the plurality of through-holes 13 is regularly aligned on the surface perpendicular to the thickness direction of the substrate 10, so that an optical image is easily designed. Note that the arrangement of the plurality of through-holes 13 is not limited to the above-described embodiment and the present modification, and various other arrangements are applicable.

(Second Modification)

Figure 13:
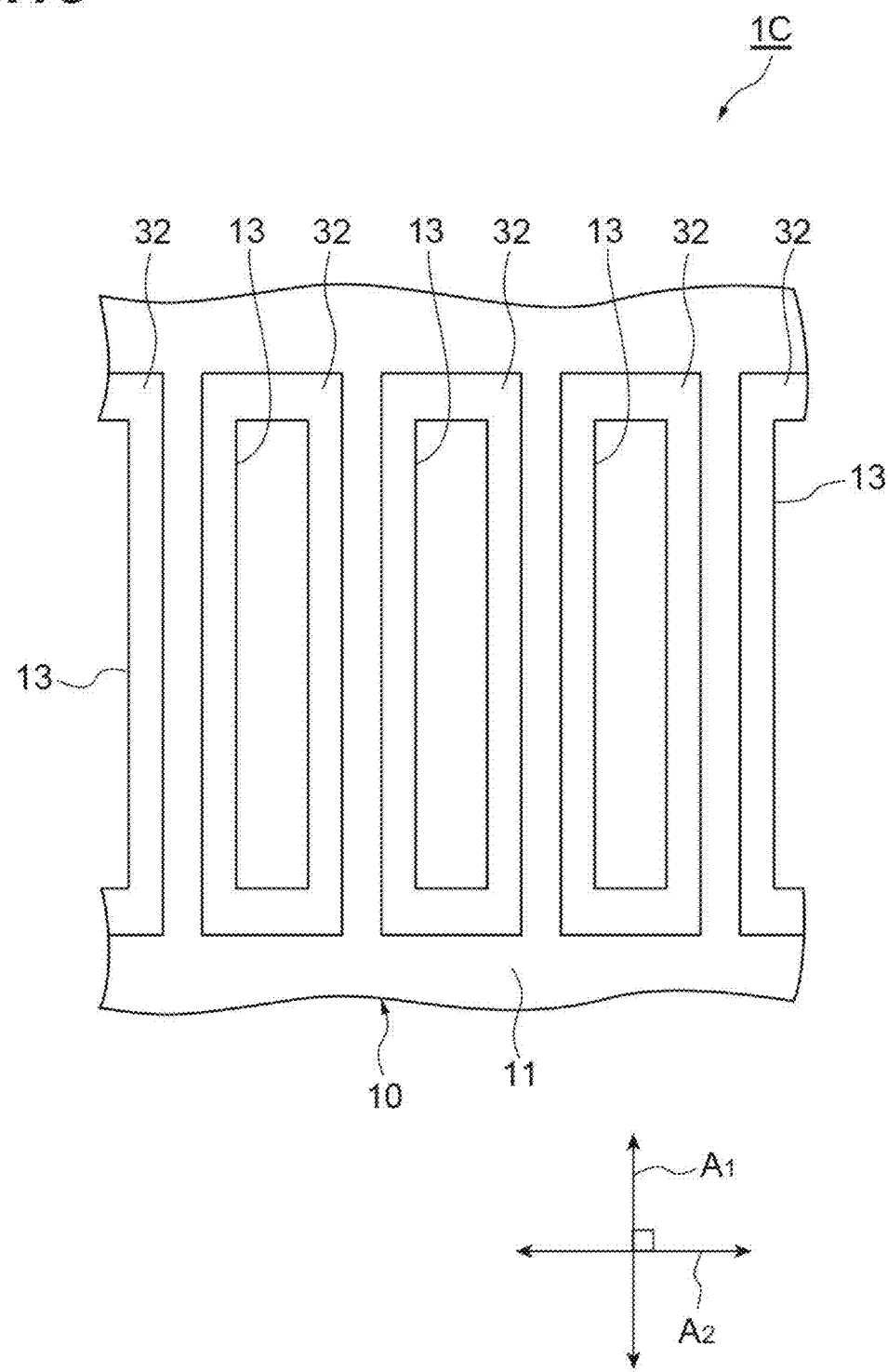
FIG. 13 is a plan view illustrating a spatial light modulator 1C as a second modification.
Figure 14:
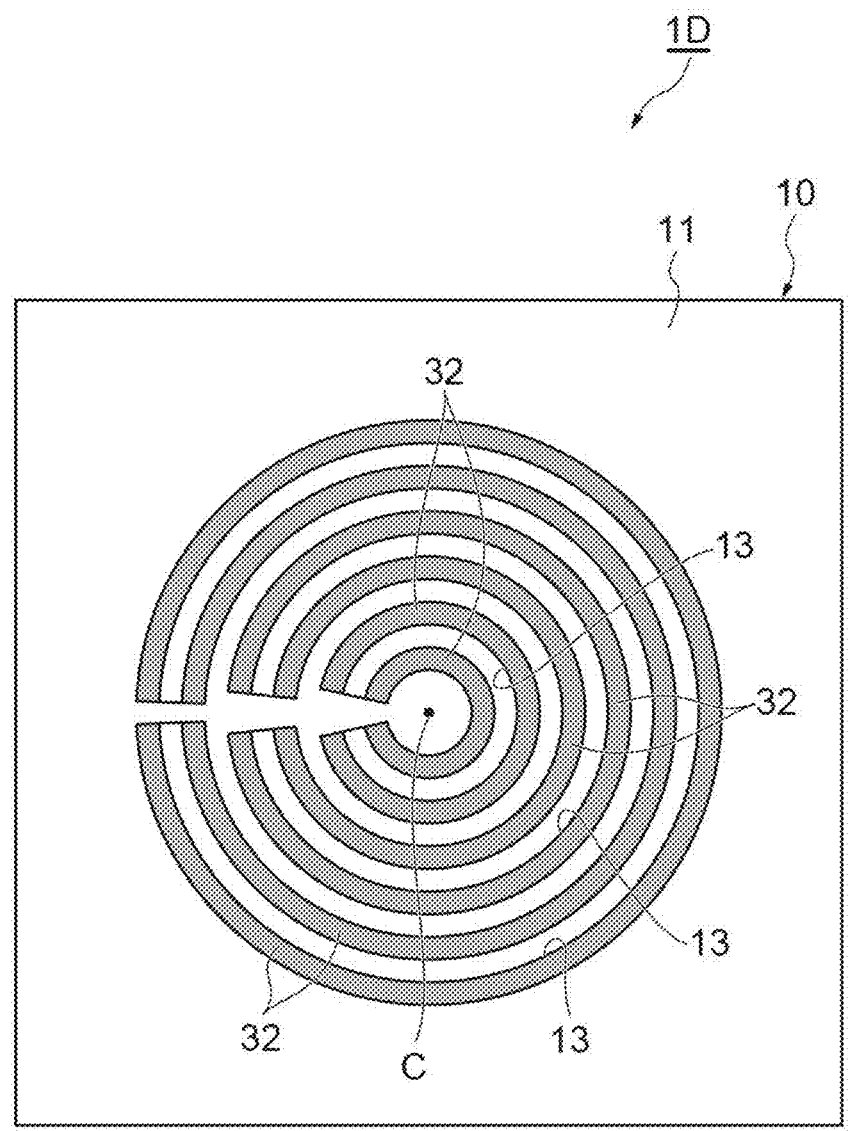
FIG. 14 is a plan view illustrating a spatial light modulator 1D as a second modification.
Figure 15:
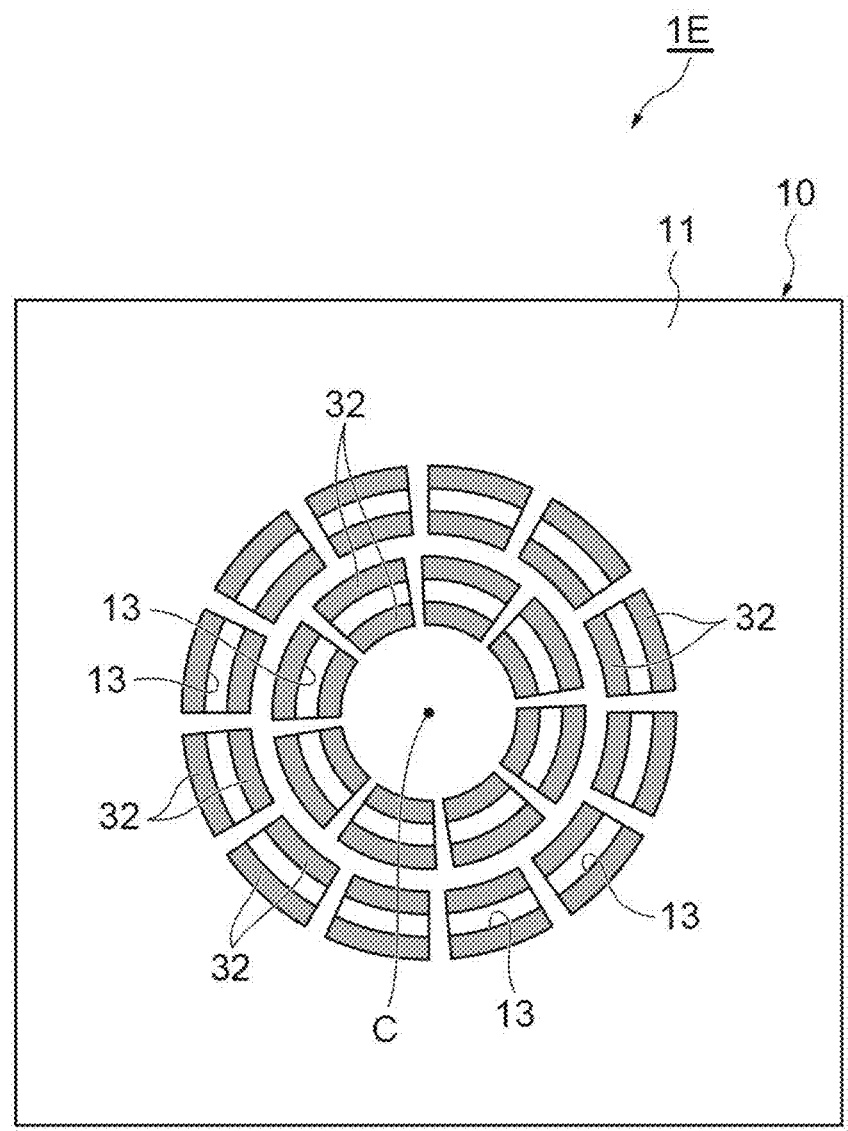
FIG. 15 is a plan view illustrating a spatial light modulator 1E as a second modification.

FIGS. 13 to 15 are plan views illustrating spatial light modulators 1C to 1E, respectively, as the second modification of the above embodiment. In the spatial light modulator 1C illustrated in FIG. 13, the substrate 10 has a plurality of through-holes 13 extending linearly along a certain direction $A_1$. These through-holes 13 are arranged at regular intervals along a direction $A_2$ intersecting (for example, orthogonal to) the direction $A_1$. The wiring electrode 32 extends in a rectangular frame shape so as to surround the periphery of each through-hole 13. In the spatial light modulator 1D illustrated in FIG. 14, the substrate 10 includes a plurality (three, in the drawing) of through-holes 13 extending in an arc shape around a certain center point C. These through-holes 13 extend over an angular range of less than 360° in polar coordinates centered at the center point C (origin) and are arranged at equal intervals in the radial direction. The wiring electrode 32 extends along the edges on both sides of each through-hole 13. Furthermore, also in the spatial light modulator 1E illustrated in FIG. 15, the substrate 10 includes a plurality of through-holes 13 extending in an arc shape around a certain center point C. However, in this example, two or more through-holes 13 are arranged at certain intervals in the circumferential direction on a circle around the center point C, and a plurality of such circles is arranged concentrically at equal intervals.

In these spatial light modulators 1C to 1E, the shape of each through-hole 13 as viewed from the thickness direction of the substrate 10 extends linearly, and the plurality of through-holes 13 is arranged in a direction intersecting the extending direction of each through-hole 13. Even in a case where the through-holes 13 have such shape, the same operational effects as those of the above-described embodiment can be produced. In addition, in a case where the through-hole 13 extends in this manner, the etching is facilitated, and at the same time, the aperture ratio of a phase modulation portion is increased, whereby a phase control with higher efficiency and higher definition can be implemented. Furthermore, an optical confinement in the extending direction of light inside a pore is mitigated, and its propagation loss can be suppressed.

(Third Modification)

Figure 16:
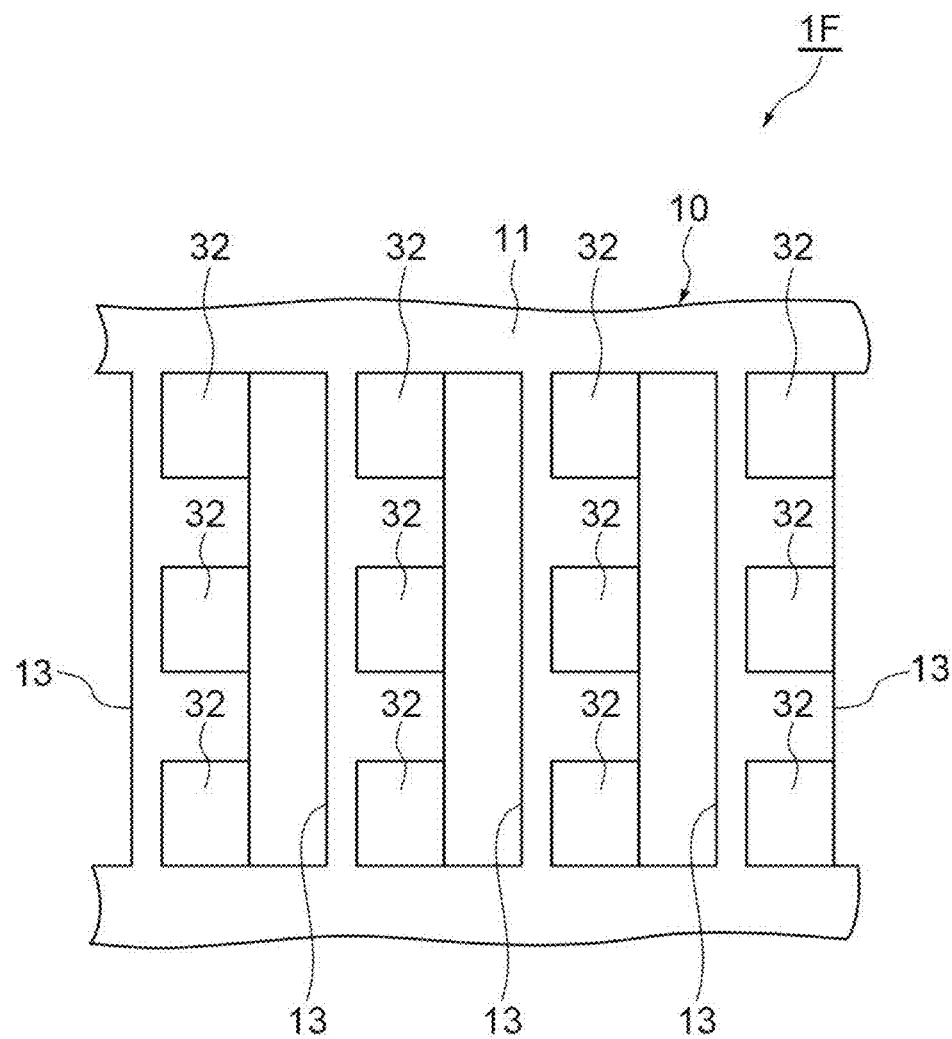
FIG. 16 is a plan view illustrating a spatial light modulator 1F as a third modification.

FIG. 16 is a plan view illustrating a spatial light modulator 1F as the third modification of the above embodiment. In the spatial light modulator 1F, the substrate 10 has a plurality of through-holes 13 having the shape illustrated in FIG. 13. Furthermore, a plurality (three, in the illustrated example) of wiring electrodes 32 is provided for each through-hole 13. In the examples illustrated in FIGS. 1, 12, and 13, one wiring electrode 32 is provided for each through-hole 13, but a plurality of wiring electrodes 32 may be provided for each through-hole 13 as in the present modification. Also in this case, a voltage can be individually applied to the electroconductive layer 23 for each through-hole 13. In addition, it is sufficient that any one of the plurality of wiring electrodes 32 is connected to a wiring, the degree of freedom of the wiring is increased.

(Fourth Modification)

Figure 17:
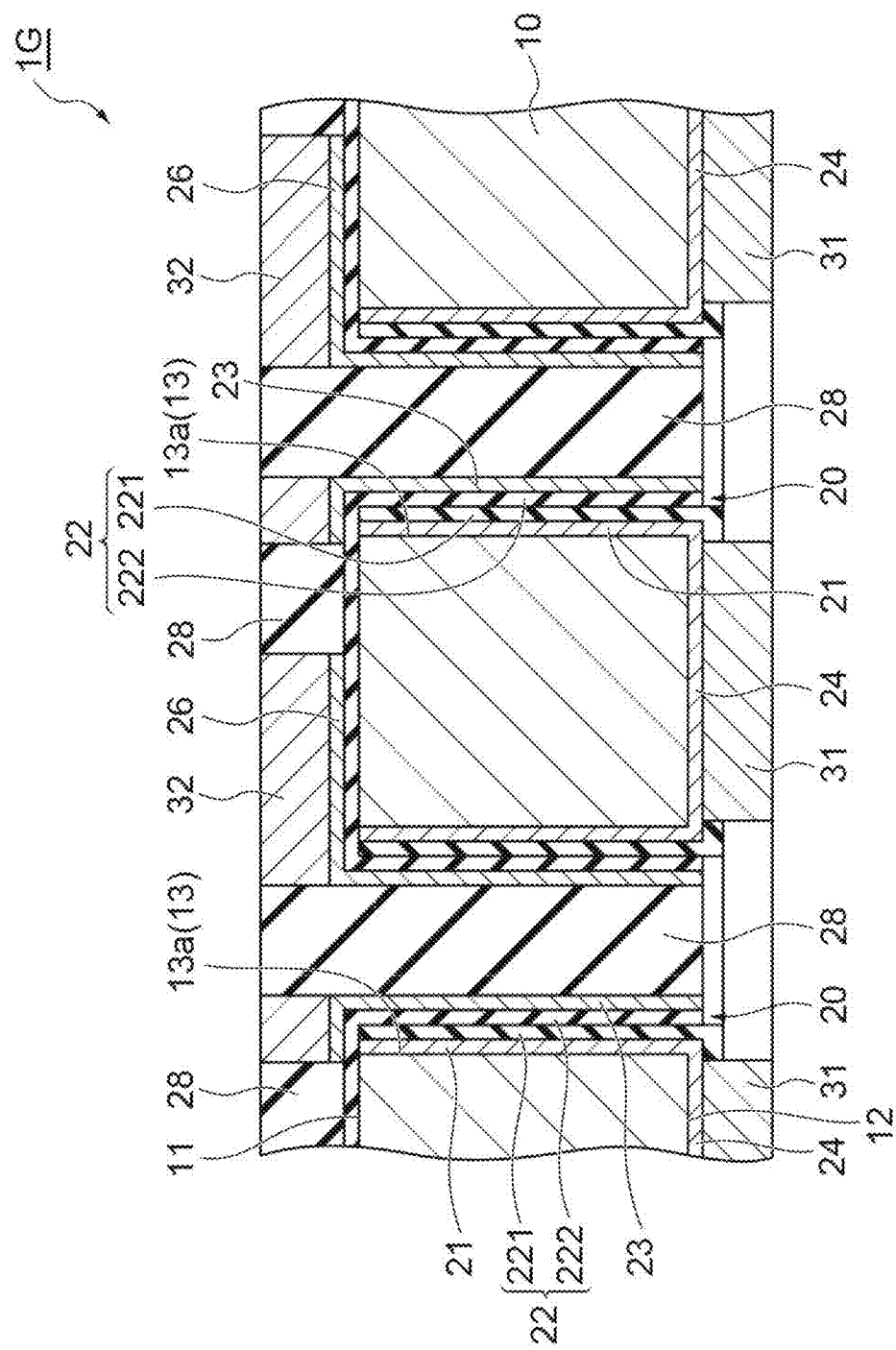
FIG. 17 is a cross-sectional view illustrating a configuration of a spatial light modulator 1G as a fourth modification.

FIG. 17 is a cross-sectional view illustrating a configuration of a spatial light modulator 1G as the fourth modification of the above embodiment. The spatial light modulator 1G further includes a dielectric region 28 in addition to the configuration of the spatial light modulator 1A of the above embodiments. The dielectric region 28 is provided on each layered structure 20 in each through-hole 13 and is comprised of a dielectric material having optical transparency. The constituent material of the dielectric region 28 includes, for example, at least one of $Al_2O_3$, $HfO_2$, $SiO_2$, and SiN, and the region may be comprised of a mixture of at least two of them. In one example, the dielectric region 28 is comprised only of $Al_2O_3$, $HfO_2$, $SiO_2$, and SiN. Note that the constituent materials of the dielectric region 28 and the dielectric layer 22 may be the same as or different from each other. In the example of FIG. 17, the dielectric region 28 is filled in the entire space in the penetration direction of each through-hole 13 out of the spaces in the through-holes 13 surrounded by the layered structure 20. Not limited to this example, the dielectric region 28 may be filled in a part of the space in the penetrating direction of each through-hole 13. As shown in FIG. 17, the end surface, facing toward the front surface 11, of the dielectric region 28 may extend to the wiring electrode 32, and furthermore the dielectric region 28 may be filled in the gap between the wiring electrodes 32 adjoining each other.

Figure 18A:
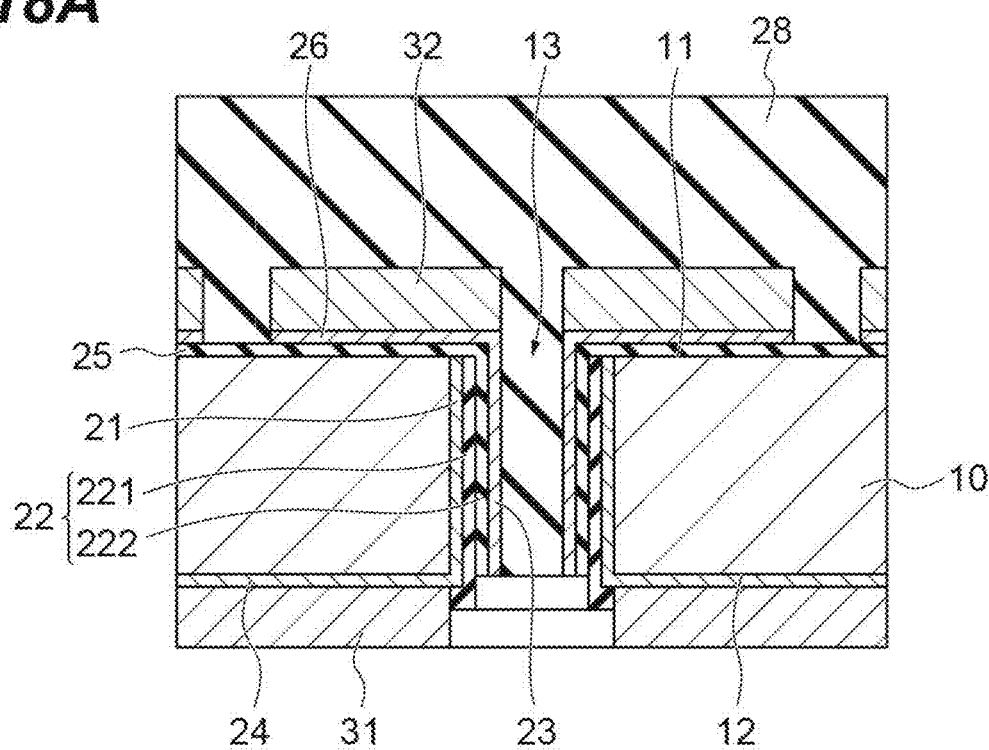
FIGS. 18A and 18B are diagrams illustrating a step of forming a dielectric region 28 among the steps of manufacturing spatial light modulator 1G.
Figure 18B:
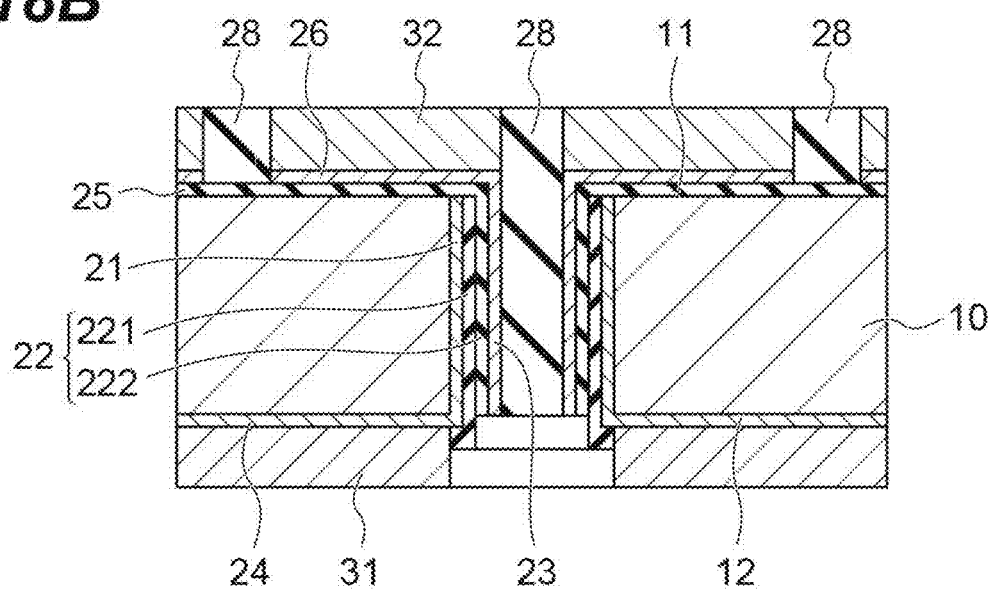

FIGS. 18A and 18B are diagrams illustrating a step of forming the dielectric region 28 among the steps of manufacturing the spatial light modulator 1G. First, the spatial light modulator 1A illustrated in FIG. 1 is manufactured through the steps illustrated in FIGS. 7A to 10C of the above embodiment. Then, as illustrated in FIG. 18A, the material of the dielectric region 28 is deposited from the front surface 11 side by ALD, for example. At this time, the dielectric region 28 is embedded into a part in the penetrating direction of or the whole of the through-hole 13. Thereafter, as illustrated in FIG. 18B, the dielectric region 28 is etched from the front surface 11 side to reduce the thickness of the dielectric region 28, whereby the wiring electrode 32 is exposed from the dielectric region 28. In this way, the spatial light modulator 1G of the present modification is manufactured. Note that, in a case of partially thinning the dielectric region 28 to expose the wiring electrode 32, first, on the dielectric region 28 is formed a resist mask having an opening above the wiring electrode 32, through the resist mask is etched the dielectric region 28 (to expose the wiring electrode 32), and then the resist mask is needed to be removed by organic cleaning.

As in the present modification, the spatial light modulator 1G may include an optical transparent dielectric region 28 provided on each layered structure 20. In this case, the refractive index of the through-hole 13 becomes higher than 1 and the optical path length of the light L passing therethrough becomes increased, and thus the number of times of reflections at the interface between the electroconductive layer 21 and the dielectric layer 22 increases. Therefore, the amount of phase modulation in each through-hole 13 can be increased. Alternatively, there can be reduced the required thickness of the substrate 10 to achieve a predetermined amount of phase modulation. In this case, the dielectric region 28 may be filled in at least a part in the penetration direction (a partial section along the penetration direction) of each through-hole 13 among the space surrounded by the layered structure 20. As a result, the optical path length of the light L passing through the through-hole 13 is further increased, and the number of times of reflections at the interface between the electroconductive layer 21 and the dielectric layer 22 can be further increased.

(Fifth Modification)

Figure 19:
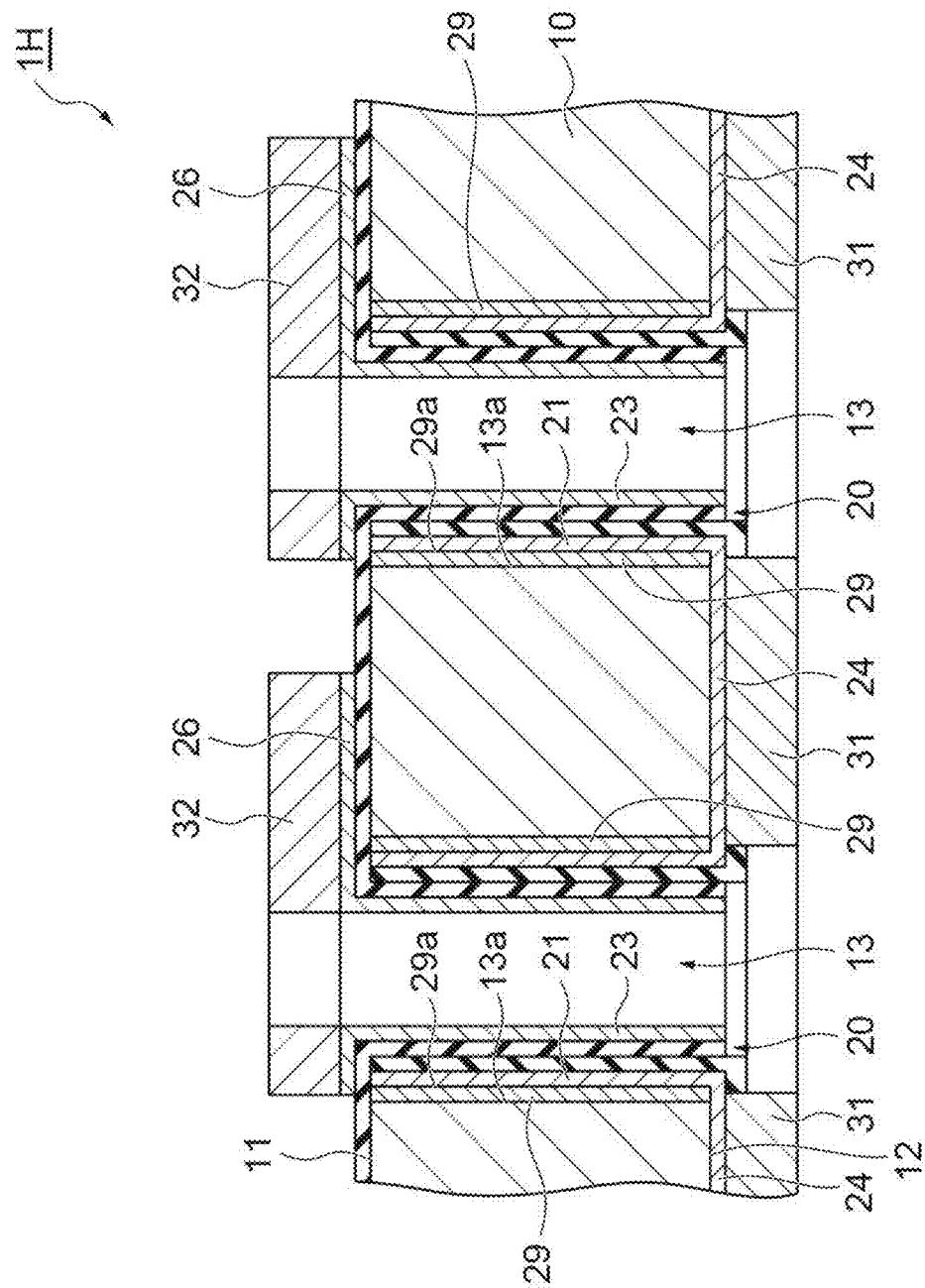
FIG. 19 is a cross-sectional view illustrating a configuration of a spatial light modulator 1H as a fifth modification.

FIG. 19 is a cross-sectional view illustrating a configuration of a spatial light modulator 1H as the fifth modification of the above embodiment. The spatial light modulator 1H further includes a smooth layer 29 in addition to the configuration of the spatial light modulator 1A of the above embodiments. The smooth layer 29 is provided on the inner wall 13a of each through-hole 13 and has a smooth surface 29a. The layered structure 20 is provided on the surface 29a of the smooth layer 29. In one example, the electroconductive layer 21 of the layered structure 20 is in close contact with the surface 29a of the smooth layer 29. The smooth layer 29 contains at least one of a metal and a dielectric material. In one example, the smooth layer 29 is a metal layer or a dielectric layer. As an example, a dielectric layer comprised of $Al_2O_3$, $HfO_2$, $SiO_2$, SiN, or the like; or a metal layer comprised of Pt, or the like can be used as the smooth layer 29, and these layers can be deposited by ALD, for example, to form a smooth film.

According to the present modification, even when the inner wall 13a of the through-hole 13 has unevenness during processing, the surface of the electroconductive layer 21 becomes smooth. For this reason, the light L can be suppressed from reflecting diffusely at the interface between the electroconductive layer 21 and the dielectric layer 22. In addition, the smooth layer 29 contains at least one of a metal and a dielectric material, for example, whereby a smooth surface 29a can be realized regardless of the presence or absence of the unevenness of the inner wall 13a. In addition, in a case where the smooth layer 29 is comprised of an insulating dielectric material, the electroconductive layer 21 and the substrate 10 can be electrically isolated (insulated) from each other, and hence a current leakage from the electroconductive layer 21 to the substrate 10 can be effectively suppressed. As a result, a voltage applied to the electroconductive layer 21 is precisely controlled.

(Dynamic Modulation of Phase)

Figure 20A:
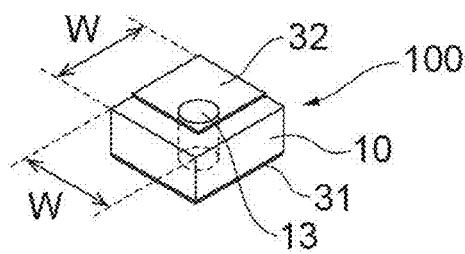
FIGS. 20A to 20C are diagrams for explaining configurations of a base element and a base unit for implementing dynamic modulation of phases in spatial light modulators 1A to 1H.
Figure 20B:
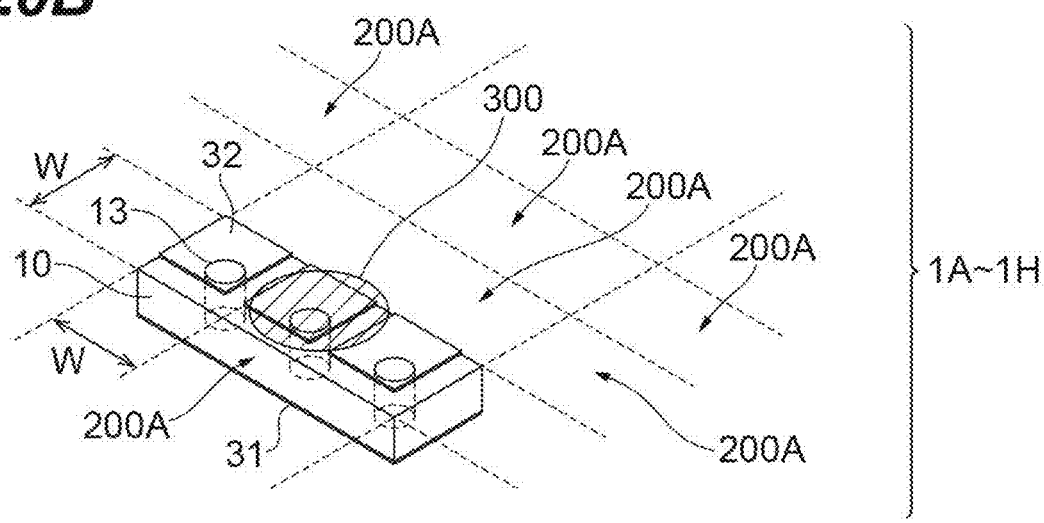
Figure 20C:
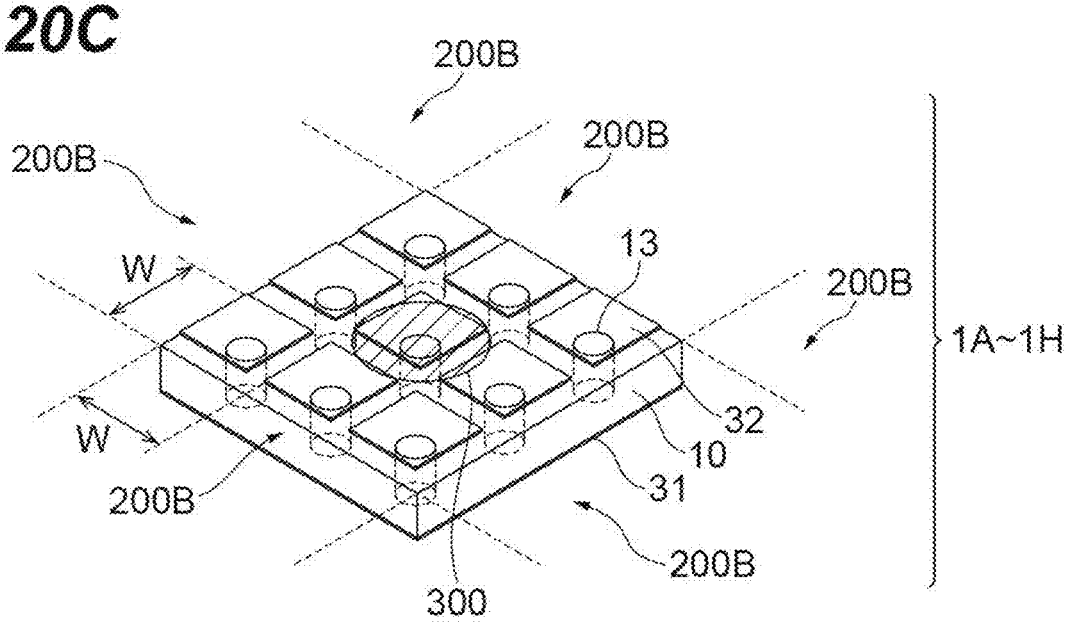

FIGS. 20A to 20C are diagrams for describing configurations of a base element and a base unit in order to achieve the dynamic modulation of phase using the intensity modulation of applied voltage in the spatial light modulators 1A to 1H.

In each of the spatial light modulators 1A to 1H described above, the substrate 10 can be considered as an assembly of a plurality of base elements 100 to each of which one through-hole 13 is allocated. FIG. 20A illustrates an example of one base element 100. Each base element 100 includes: a part of a substrate 10 including a corresponding through-hole 13; a wiring electrode 32 provided on the front surface 11; and a wiring electrode 31 provided on the back surface 12. In the example illustrated in FIG. 20A, each of the maximum widths W of the base element 100 to be defined along two directions (e.g. two orthogonal directions) intersecting each other on the front surface 11 is configured to be smaller than the wavelength of an incident light.

Each of the above-described spatial light modulators 1A to 1H includes a base unit as a modulation control unit. For example, FIG. 20B illustrates an example of a base unit 200A including three consecutive base elements 100 along one direction. FIG. 20C illustrates an example of a base unit 200B including nine (3×3) consecutive base elements 100 along each of two directions orthogonal to each other.

In the base unit 200A illustrated in FIG. 20B, a wiring electrode 32 is provided on the front surface 11 for each through-hole 13 allocated to the three base elements 100, while on the back surface 12 is provided a wiring electrode 31 as a common electrode of the three base elements 100. It is known that, in the base unit 200A configured as described above, when the transmission intensity (or the reflection intensity) of each base element 100 is dynamically modulated, an effect of equivalently shifting the position of an emission region 300 (hatched area in FIG. 20B) of the base unit 200A is provided (dynamic phase modulation). Note that such phase modulation utilizes the principle of detour phase hologram disclosed in Non-Patent Document 2 above, and the fact that a plurality of base units is included in a spatial light modulator is disclosed in Non-Patent Document 3, for example.

In addition, in the base unit 200B illustrated in FIG. 20C, a wiring electrode 32 is provided on the front surface 11 for each through-hole 13 allocated to nine base elements 100, while on the back surface 12 is provided a wiring electrode 31 as a common electrode of the nine base elements 100. Also by this base unit 200B, when the transmission intensity (or the reflection intensity) of each base element 100 is dynamically modulated, there can be obtained an effect of equivalently shifting the position of an emission region 300 (hatched region in FIG. 20C) of the base unit 200A.

As described above, in a case where the spatial light modulators 1A to 1H each include the plurality of base units 200A, one-dimensional phase modulation becomes available, and in a case where the spatial light modulators 1A to 1H each include the plurality of base units 200B, two-dimensional phase modulation becomes available. Note that the spatial light modulators 1A to 1H may include a plurality of types of base units having different structures, such as a combination of the base units 200A and 200B.

Second Embodiment

Figure 21A:
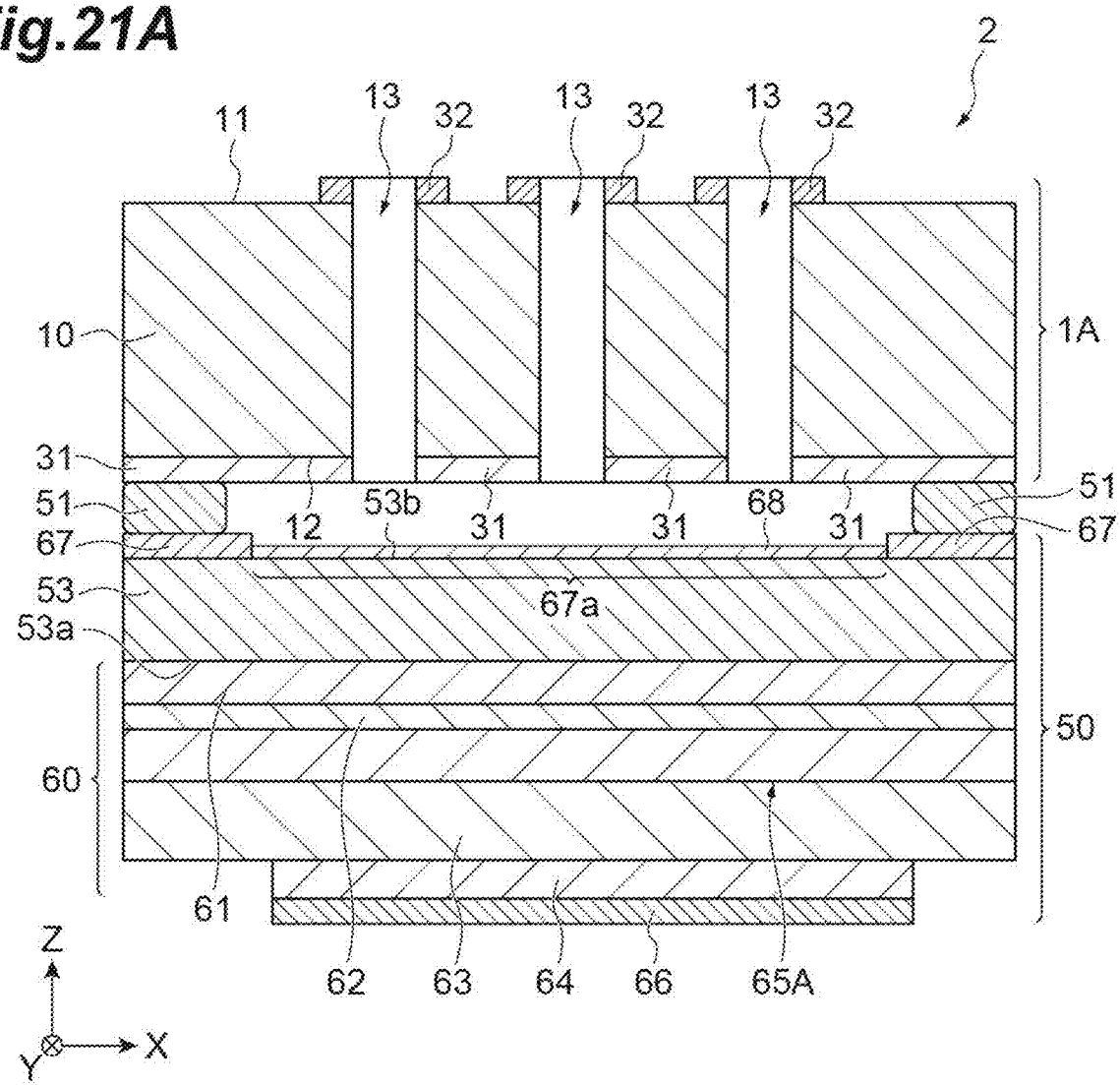
FIG. 21A is a cross-sectional view illustrating a configuration of a light-emitting device 2 according to a second embodiment.

FIG. 21A is a cross-sectional view showing a configuration of a light-emitting device 2 according to the second embodiment of the present disclosure. This light-emitting device 2 includes the spatial light modulator 1A of the above embodiment and a surface emitting laser element 50. The surface emitting laser element 50 is a surface light source in the present embodiment, and is a photonic crystal surface emitting laser (PCSEL) element as it is called. The surface emitting laser element 50 is optically coupled to the front surface 11 or the back surface 12 (the back surface 12 in the illustrated example) of the spatial light modulator 1A. In one example, the surface emitting laser element 50 is joined to the back surface 12 of the spatial light modulator 1A via a junction 51. The junction 51 is, for example, an electroconductive jointing material such as solder. Note that the material of the junction 51 is not necessarily electroconductive.

Here, there is defined an XYZ orthogonal coordinate system in which an axis that passes through the center of the surface emitting laser element 50 and that extends in the thickness direction of the surface emitting laser element 50 is specified to Z-axis. The surface emitting laser element 50 creates a standing wave in a direction defined on the X-Y plane, and outputs laser light L in a direction (Z-axis direction) perpendicular to the main surface 53a of a semiconductor substrate 53. Note that the Z-axis direction coincides with the thickness direction (that is to say, the penetration direction of the through-hole 13) of the substrate 10 of the spatial light modulator 1A.

The surface emitting laser element 50 includes a semiconductor substrate 53 and a semiconductor stack 60 provided on the main surface 53a of the semiconductor substrate 53. The semiconductor stack 60 includes a cladding layer 61 provided on the main surface 53a, an active layer 62 provided on the cladding layer 61, a cladding layer 63 provided on the active layer 62, and a contact layer 64 provided on the cladding layer 63. Furthermore, the semiconductor stack 60 includes a photonic crystal layer 65A. In the example of FIG. 21A, the photonic crystal layer 65A is provided between the active layer 62 and the cladding layer 63, but the photonic crystal layer 65A may be provided between the cladding layer 61 and the active layer 62. The laser light is outputted from the back surface 53b of the semiconductor substrate 53 and is provided to the spatial light modulator 1A as the light L illustrated in FIG. 5.

The energy band gaps in the cladding layer 61 and the cladding layer 63 are wider than the energy band gap in the active layer 62. The thickness directions of the semiconductor substrate 53, the cladding layers 61 and 63, the active layer 62, the contact layer 64, and the photonic crystal layer 65A each coincide with the Z-axis direction.

Figure 21B:
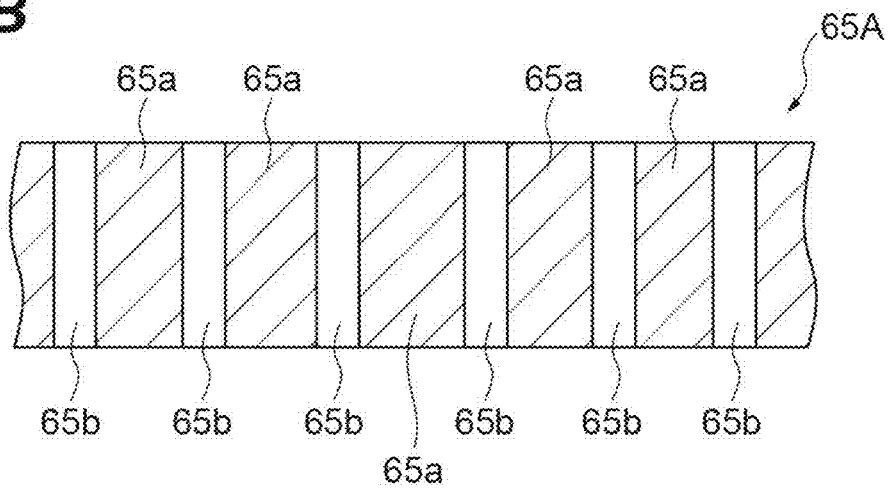
FIG. 21B is an enlarged cross-sectional view illustrating a photonic crystal layer 65A.

The photonic crystal layer (diffraction grating layer) 65A is a layer that creates a resonance mode. FIG. 21B is an enlarged cross-sectional view illustrating the photonic crystal layer 65A. The photonic crystal layer 65A includes a base layer 65a and a plurality of modified refractive index regions 65b. The base layer 65a is a semiconductor layer comprised of a first refractive index medium. The plurality of modified refractive index regions 65b is comprised of a second refractive index medium having a refractive index different from that of the first refractive index medium, and is present in the base layer 65a. The modified refractive index region 65b may be a vacancy, or may include a compound semiconductor embedded in the vacancy. The plurality of modified refractive index regions 65b is two-dimensionally and periodically arranged on a plane perpendicular to the thickness direction of the photonic crystal layer 65A (a plane parallel to the X-Y plane). When an equivalent refractive index is denoted by n, the wavelength $\lambda_0$ (=a×n, a is a lattice spacing) selected by the photonic crystal layer 65A is included in the range of the emission wavelength of the active layer 62. The photonic crystal layer 65A is capable of selecting the wavelength $\lambda_0$ among the emission wavelengths of the active layer 62 and outputting it to the outside.

Figure 22:
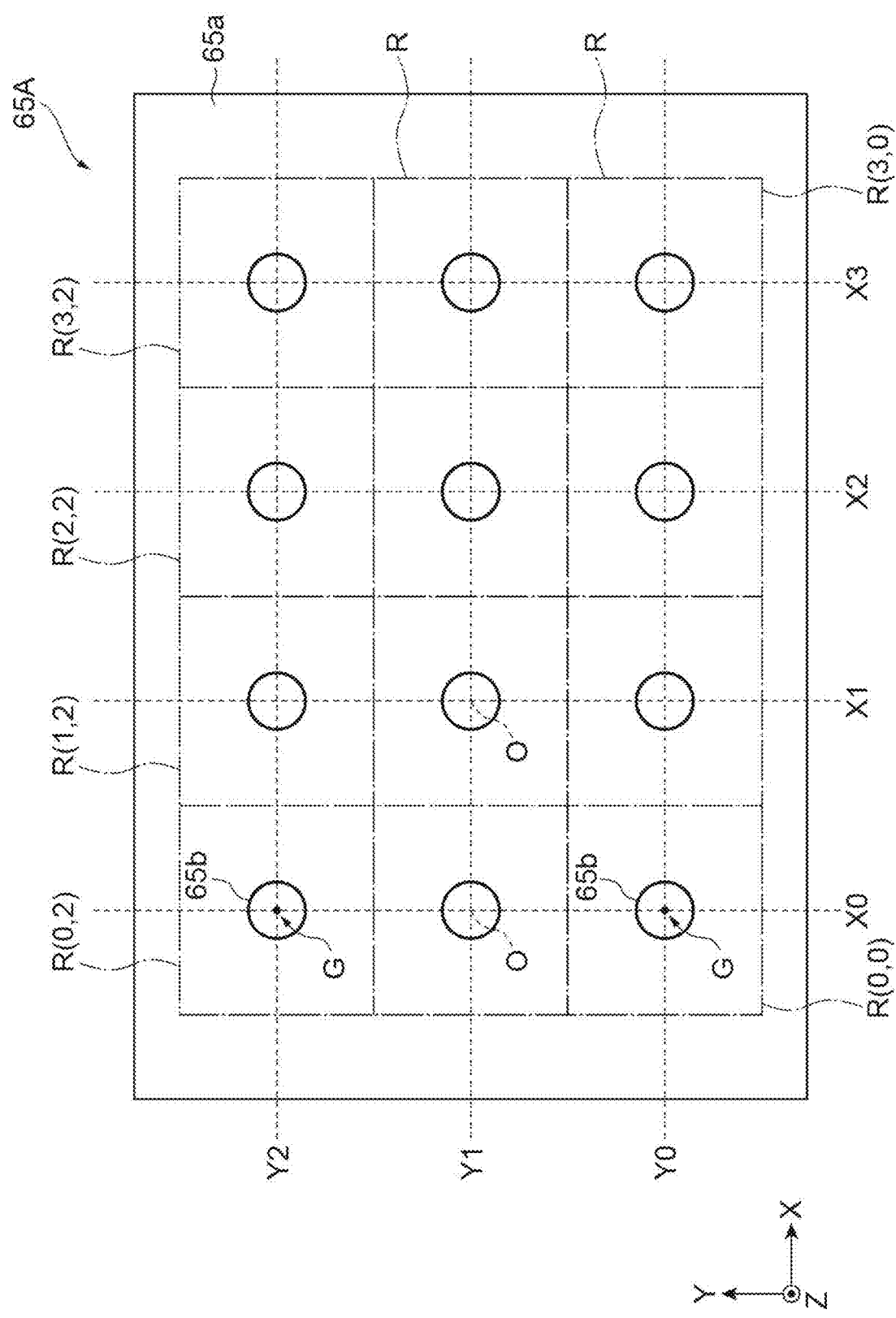
FIG. 22 is a plan view of a photonic crystal layer 65A.

FIG. 22 is a plan view of the photonic crystal layer 65A. A virtual square lattice on the X-Y plane is set on the photonic crystal layer 65A. As illustrated in FIG. 22, the points of intersection between lines x0 to x3 parallel to the Y-axis and lines y0 to y2 parallel to the X-axis are lattice points O, and square regions each centered at each of the lattice points O are defined as unit constituent regions R(0, 0) to R(3, 2). Therefore, one side of each unit constituent region R(x, y) as a square lattice is parallel to the X-axis, and the other side is parallel to the Y-axis. As a result, the centroid G of each modified refractive index region 65b coincides with each of the lattice points O of the square lattices (i.e. the center of the unit constituent region R(x, y)). The planar shape of the modified refractive index region 65b is, for example, a circular shape, and is present in a unit constituent region R (first Brillouin zone) surrounded by line segments that pass through the midpoint of a line segment connecting adjacent lattice points and that are orthogonal to the line segment connecting adjacent lattice points. Note that the planar shapes of the plurality of modified refractive index regions 65b are not limited to a circle, and may be various shapes such as a polygon, a closed curve, or a shape consisting of two or more closed curves. In addition, the periodic structure of the plurality of modified refractive index regions 65b is not limited thereto, and for example, a triangular lattice may be chosen instead of the square lattice.

Referring again to FIGS. 21A and 21B. The surface emitting laser element 50 further includes: a metal electrode film 66 provided on the contact layer 64; and a metal electrode film 67 provided on the back surface 53b of the semiconductor substrate 53. The metal electrode film 66 is in ohmic contact with the contact layer 64, and the metal electrode film 67 is in ohmic contact with the semiconductor substrate 53. The metal electrode film 67 has a frame-like (annular) planar shape surrounding the output region of laser light, and has an opening 67a. Note that the planar shape of the metal electrode film 67 may be various shapes such as a rectangular frame shape, or an annular shape. The metal electrode film 67 is joined to the wiring electrode 31 of the spatial light modulator 1A via the electroconductive junction 51, and may have an electric potential same as that of the wiring electrode 31. In particular, in a case where the junction 51 is comprised of a metal, heat generated in the surface emitting laser element 50 can be dissipated through the substrate 10. A portion, in the opening 67a, of the back surface 53b of the semiconductor substrate 53 is covered with an antireflection film 68. As a constituent material of this antireflection film 68, SiN or $SiO_2$, which is an optical transparent dielectric material, is applicable. Alternatively, as a constituent material of the antireflection film 68, a transparent electroconductive film such as ITO, AZO, TiN, or CdO may be applied. In this case, the current injected from the metal electrode film 67 is widely diffused in a plane perpendicular to the thickness direction. Therefore, a semiconductor substrate 53 having a smaller thickness becomes applicable. Alternatively, instead of the semiconductor substrate 53, an optical transparent support substrate may be laminated onto the semiconductor stack 60. By reducing the thickness of the semiconductor substrate 53, or by removing the semiconductor substrate 53, there can be used light in the range of wavelength shorter than the wavelength of the band-edge of the semiconductor substrate 53. The metal electrode film 66 is provided in the central region of the semiconductor stack 60, that is, in a region overlapping the opening 67a as viewed from the Z-axis direction.

When a drive current is supplied between the metal electrode film 66 and the metal electrode film 67, a recombination of electrons and holes takes place in the active layer 62 (light emission in the active layer 62). Electrons and holes contributing to this light emission, and the generated light are efficiently distributed between the cladding layer 61 and the cladding layer 63. Since the light outputted from the active layer 62 is distributed between the cladding layer 61 and the cladding layer 63, the light enters into the photonic crystal layer 65A, and then creates a resonance mode in a direction along the main surface 53a of the semiconductor substrate 53 according to the lattice structure inside of the photonic crystal layer 65A. Then, the light is oscillated at a wavelength corresponding to the arrangement period of the plurality of modified refractive index regions 65b, and laser light is generated. A part of the laser light emitted from the photonic crystal layer 65A travels in a direction perpendicular to the main surface 53a of the semiconductor substrate 53, and is directly outputted from the back surface 53b through the opening 67a toward the spatial light modulator 1A. The rest of the laser light emitted from the photonic crystal layer 65A is reflected by a metal electrode film 66 and then outputted from the back surface 53b through the opening 67a toward the spatial light modulator 1A.

In one example, the semiconductor substrate 53 is a GaAs substrate, and the cladding layer 61, the active layer 62, the photonic crystal layer 65A, the cladding layer 63, and the contact layer 64 each are comprised of a GaAs-based semiconductor. In another example, the cladding layer 61 is an AlGaAs layer, the active layer 62 has a multiple quantum well structure (AlGaAs barrier layer/InGaAs quantum well layer, the number of well layers is 3, for example), the base layer 65a of the photonic crystal layer 65A is an AlGaAs layer or a GaAs layer, the modified refractive index region 65b is a vacancy, the cladding layer 63 is an AlGaAs layer, and the contact layer 64 is a GaAs layer.

An electrical conductivity type same as that of the semiconductor substrate 53 is present in the cladding layer 61, and an electrical conductivity type opposite to that of the semiconductor substrate 53 is present in the cladding layer 63 and the contact layer 64. In one example, the semiconductor substrate 53 and the cladding layer 61 have n-type electrical conductivity, and the cladding layer 63 and the contact layer 64 have p-type electrical conductivity. In a case of being provided between the active layer 62 and the cladding layer 61, the photonic crystal layer 65A has an electrical conductivity type same as that of the semiconductor substrate 53, and in a case of being provided between the active layer 62 and the cladding layer 63, the photonic crystal layer 65A has an electrical conductivity type opposite to that of the semiconductor substrate 53. Note that, an impurity concentration is, for example, $1\times10^{16}$ to $1\times10^{21}$/$cm^3$. In a case of an intrinsic (i-type) semiconductor without any intentionally doped impurities, its impurity concentration is $1\times10^{16}/cm^3$ or less. The active layer 62 is not limited to intrinsic (i-type), and may be doped with an impurity. Note that, regarding the impurity concentration of the photonic crystal layer 65A, an intrinsic (i-type) semiconductor may be used in a case where it is necessary to suppress the impact of loss due to an absorption of light through an impurity level, or the like.

The light-emitting device 2 of the present embodiment described above includes: the spatial light modulator 1A; and a surface light source (surface emitting laser element 50) optically coupled to the front surface 11 or the back surface 12 of the spatial light modulator 1A. This light-emitting device 2 includes the spatial light modulator 1A of the first embodiment, this enables to increase the number of effective pixels, and to give a dynamic optical image with high image quality. In addition, the surface emitting laser element 50 facilitates the realization of a surface light source that provides coherent light to the spatial light modulator 1A. Note that the light-emitting device 2 may include any of the spatial light modulators 1B to 1H of the above-described modifications, in place of the spatial light modulator 1A. Also in this case, a similar operation and effect can be obtained.

Figure 23:
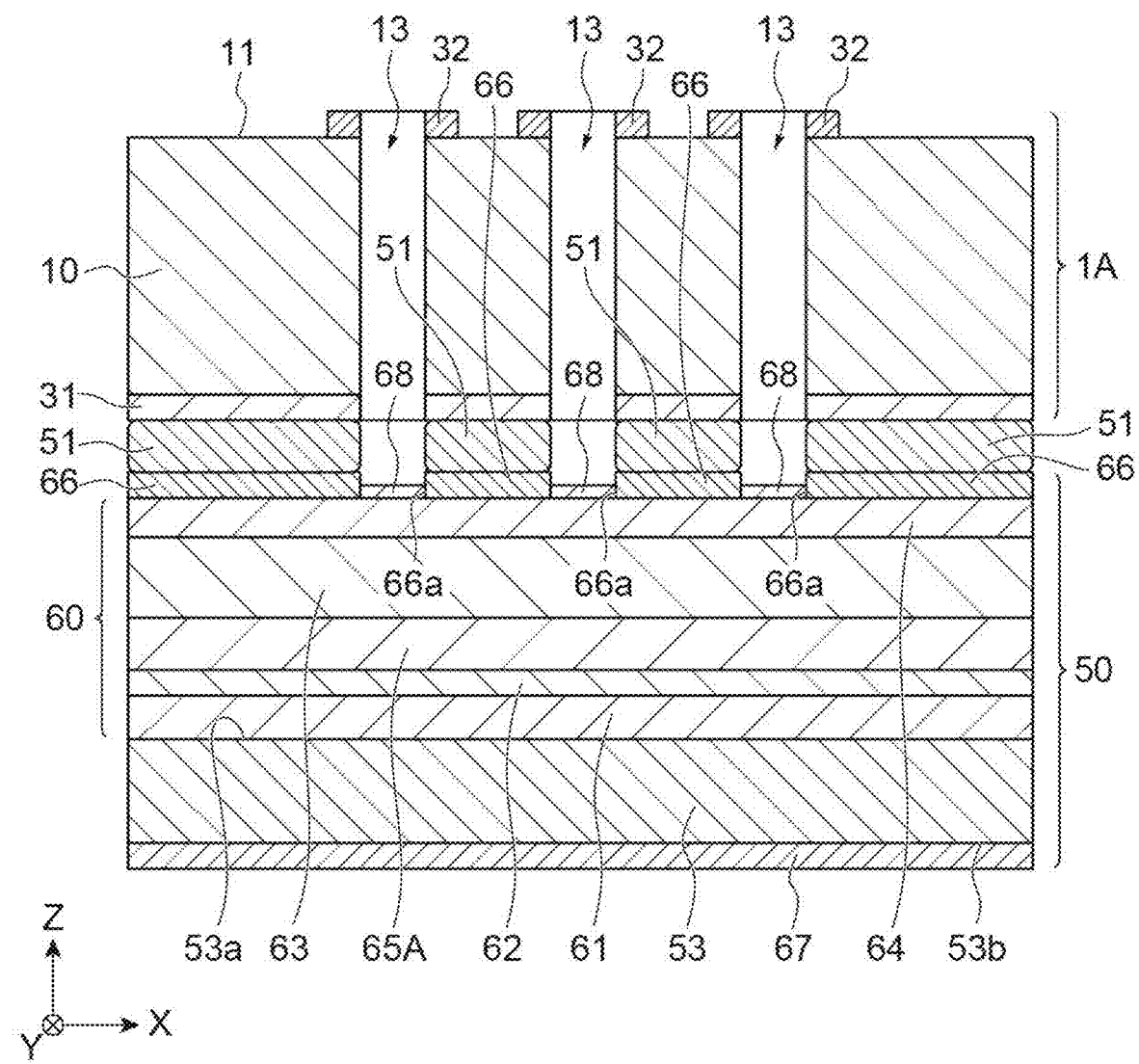
FIG. 23 is a cross-sectional view illustrating a modification of the light-emitting device 2 according to the second embodiment.

Note that, FIGS. 21A and 21B illustrate the case where the surface emitting laser element 50 emits light from the back surface 53b side of the semiconductor substrate 53, but as illustrated in FIG. 23, the surface emitting laser element 50 may emit light from the main surface 53a side of the semiconductor substrate 53 (i.e. from the surface, facing away from the semiconductor substrate 53, of the semiconductor stack 60). In this case, the metal electrode film 66 has a plurality of openings 66a each opposing each of the plurality of through-holes 13. An entire region but the opening 66a of the metal electrode film 66 is joined to the wiring electrode 31 of the spatial light modulator 1A via the electroconductive junction 51. The metal electrode film 67 is provided on the entirety of the back surface 53b. This enables to uniformly inject electric current in a plane perpendicular to the thickness direction of the semiconductor stack 60. In particular, in a case where the junction 51 is comprised of a metal such as solder, heat generated in the semiconductor stack 60 can be efficiently dissipated in the spatial light modulator 1A. Note that, in this case, the metal electrode film 66 has the same electrical potential as that of the wiring electrode 31. A portion, in the opening 66a of the metal electrode film 66, of the surface of the semiconductor stack 60 is covered with an antireflection film 68. According to the configuration illustrated in FIG. 23, without using a transparent electroconductive film having not very high electrical conductivity, light in a range of wavelength shorter than the wavelength of the band edge of the semiconductor substrate 53 can be provided to the spatial light modulator 1A. Therefore, in a case where the light-emitting device 2 outputs light in a range of wavelength shorter than the wavelength of the band edge of the semiconductor substrate 53, the light-emitting device 2 can be highly efficient.

Figure 24:
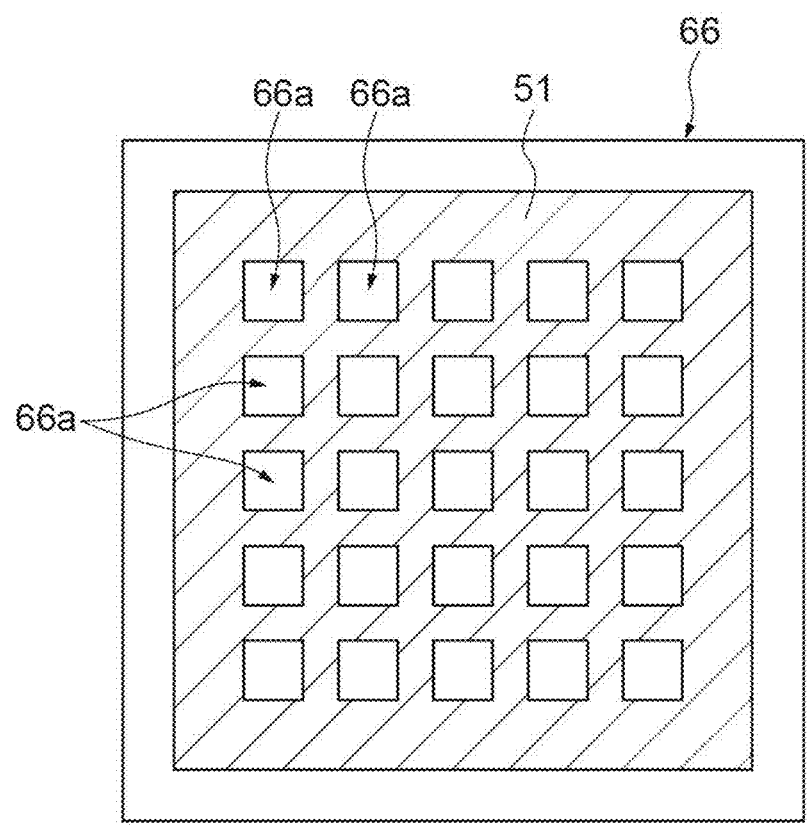
FIG. 24 is a diagram illustrating an example of a planar shape of a metal electrode film 66 and a junction 51.

FIG. 24 is a diagram illustrating an example of planar shapes of the metal electrode film 66 and the junction 51. To facilitate understanding, an area where the junction 51 is present is indicated by hatching. The planar shape of each opening of the metal electrode film 66 may be the same as or different from the planar shape of the through-hole 13. As an example, FIG. 24 illustrates a metal electrode film 66 having a plurality of openings 66a whose planar shape is a square. As illustrated in FIG. 24, the junction 51 may be provided in the entire region located between each of the plurality of openings 66a. The junction 51 is not necessarily provided in the periphery of the metal electrode film 66.

Figure 25:
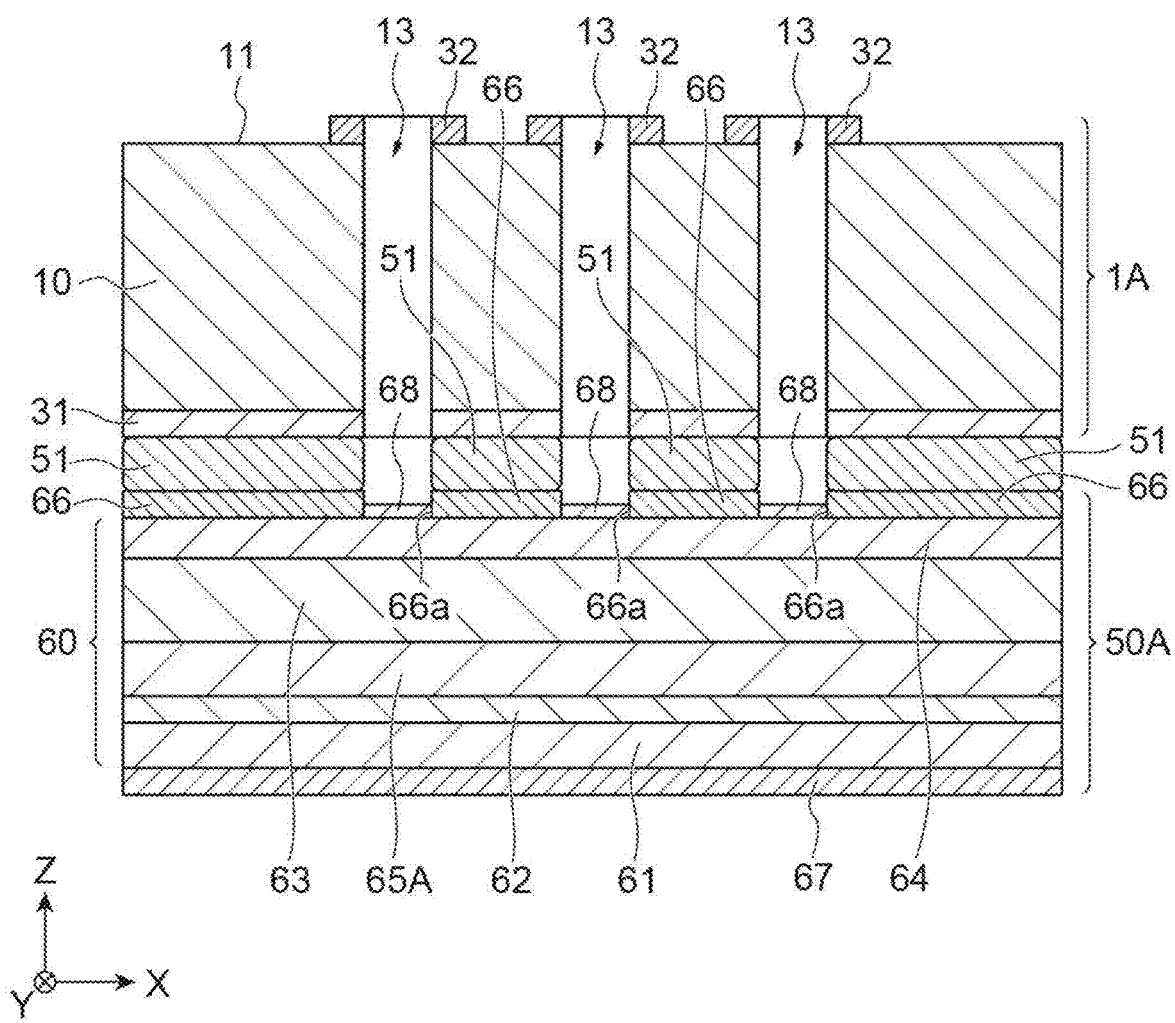
FIG. 25 is a cross-sectional view illustrating a configuration in a case where a semiconductor substrate 53 is removed from the configuration illustrated in FIG. 23.

FIG. 25 is a cross-sectional view illustrating a configuration of a case where the semiconductor substrate 53 is removed from the configuration illustrated in FIG. 23. As illustrated in FIG. 25, by removing the semiconductor substrate 53 from the surface emitting laser element 50 in FIG. 23 while leaving the semiconductor stack 60 as it is, a surface emitting laser element 50A having a reduced thickness is obtained. In this case, the semiconductor substrate 53 can be prevented from absorbing light in a range of wavelength shorter than the band edge wavelength of the semiconductor substrate 53, and further increased efficiency can be achieved. Note that, in the surface emitting laser element 50A, the metal electrode film 67 is provided on the back surface of the semiconductor stack 60.

(Sixth Modification)

In the second embodiment described above, there has been described the case where the light-emitting device 2 includes the surface emitting laser element 50, which is a PCSEL, as a surface light source. However, the surface light source is not limited to the PCSEL, and various surface emitting laser elements may be adopted. For example, there has been studied a surface emitting laser element that outputs a freely-selected optical image by controlling the phase spectrum and intensity spectrum of light emitted from a plurality of light emitting points arranged two-dimensionally. Such surface emitting laser element is called a static-integrable phase modulating (S-iPM) laser, and outputs an optical image having a freely-selected two-dimensional shape including a direction perpendicular to the main surface of the semiconductor substrate and a direction inclined with respect to this.

Figure 26:
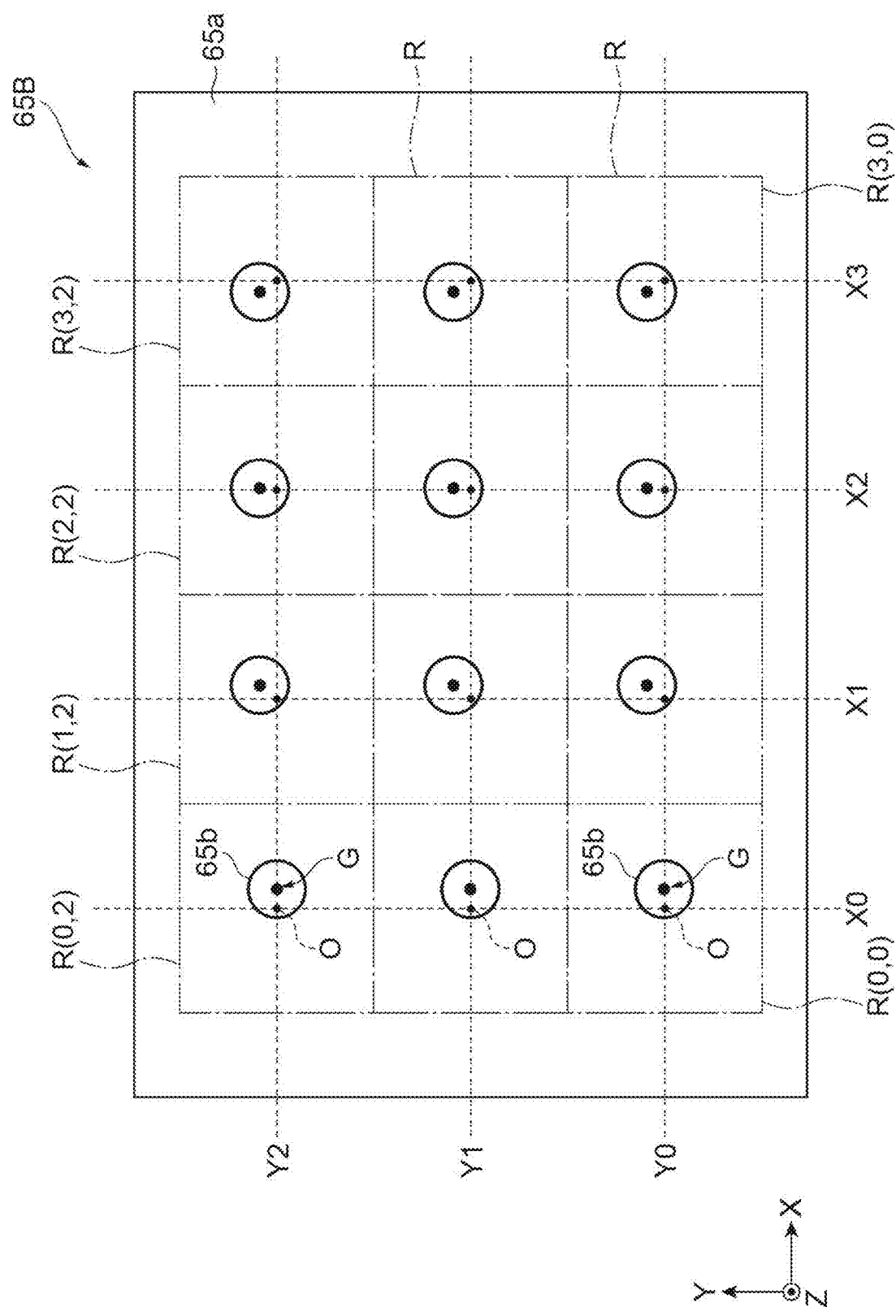
FIG. 26 is a plan view of a phase modulation layer 65B included in an S-iPM laser.

FIG. 26 is a plan view of a phase modulation layer 65B included in the S-iPM laser. The surface emitting laser element 50 of the second embodiment may include a phase modulation layer 65B illustrated in FIG. 26 in place of the photonic crystal layer 65A (see FIG. 22). No that, also in the example of FIG. 26, the points of intersection between lines x0 to x3 parallel to the Y-axis and lines y0 to y2 parallel to the X-axis are the lattice points O, and unit constituent regions R(0, 0) to R(3, 2) are configured as square regions (square lattices) each centered at each of the lattice points O. As a result, the surface emitting laser element 50 operates as an S-iPM laser. The phase modulation layer 65B is a resonance mode creating layer in the present modification. Note that, in the surface emitting laser element 50 of the present modification, the other configurations except for the phase modulation layer 65B are similar to those of the second embodiment, and thus detailed description is omitted.

The phase modulation layer 65B includes: a base layer 65a comprised of a first refractive index medium; and a modified refractive index region 65b comprised of a second refractive index medium having a refractive index different from that of the first refractive index medium. Here, a virtual square lattice on the X-Y plane is set on the phase modulation layer 65B. One side of each unit constituent region R(x, y) as a square lattice is chosen to be parallel to the X-axis, and the other side is chosen to be parallel to the Y-axis. As a result, the square unit constituent region R centered at the lattice point O can be set two-dimensionally over a plurality of columns along the X-axis and a plurality of rows along the Y-axis. The plurality of modified refractive index regions 65b is provided one by one in each unit constituent region R. The planar shape of the modified refractive index region 65b is, for example, a circular shape, but is not limited thereto, and may be various shapes such as a polygonal shape, a closed curve, or a shape consisting of two or more closed curves. In each unit constituent region R(x, y), the centroid G of the modified refractive index region 65b is disposed away from the lattice point O closest thereto.

Figure 27:
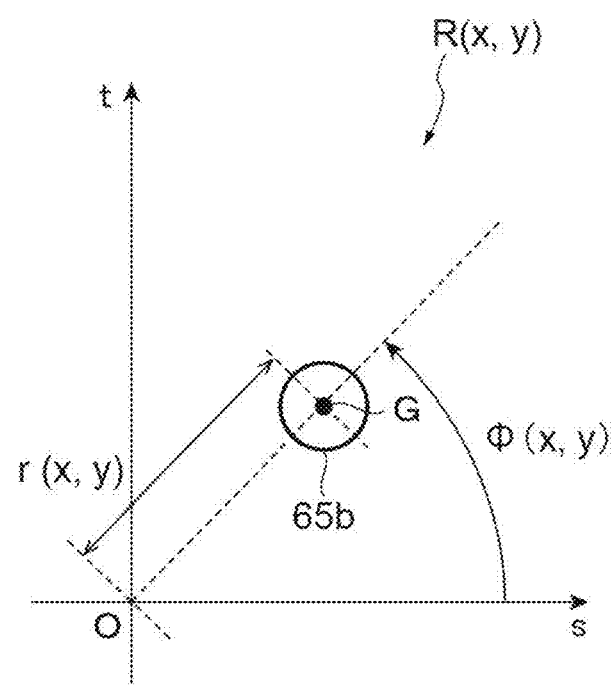
FIG. 27 is a plan view illustrating another example of the shape of the modified refractive index region in an X-Y plane.

As illustrated in FIG. 27, the position in the unit constituent region R(x, y) is given by an s-axis (parallel to the X-axis) and a t-axis (parallel to the Y-axis) orthogonal to each other at the corresponding lattice point O. In the unit constituent region R(x, y), an angle between the s-axis and a direction from the lattice point O toward the centroid G is denoted by φ(x, y). The component x indicates the position of the x-th lattice point O on the X-axis, and the component y indicates the position of the y-th lattice point O on the Y-axis. When the rotation angle φ is 0°, the direction of a vector connecting the lattice point O and the centroid G coincides with the positive direction of the X-axis. In addition, the length of a vector connecting the lattice point O and the centroid G is denoted by r(x, y). In one example, r(x, y) is constant with x and y (in the entirety of the phase modulation layer 65B).

As illustrated in FIG. 26, in the phase modulation layer 65B, the rotation angle φ of the centroid G of the modified refractive index region 65b around the lattice point O is independently and individually chosen for each unit constituent region R depending on a desired optical image. The distribution of the rotation angle φ(x, y) has a specific value for each position determined by the values of the component x and the component y, but is not necessarily represented by a specific function. That is, the distribution of the rotation angle φ(x, y) is determined from an extraction of a phase distribution out of the complex amplitude distribution obtained by applying inverse Fourier transform to the desired optical image. Note that, in the determination of the complex amplitude distribution from the desired optical image, the reproducibility of a beam pattern is improved by applying an iterative algorithm such as the Gerchberg-Saxton (GS) method commonly used in the calculation of hologram generation.

Figure 28:
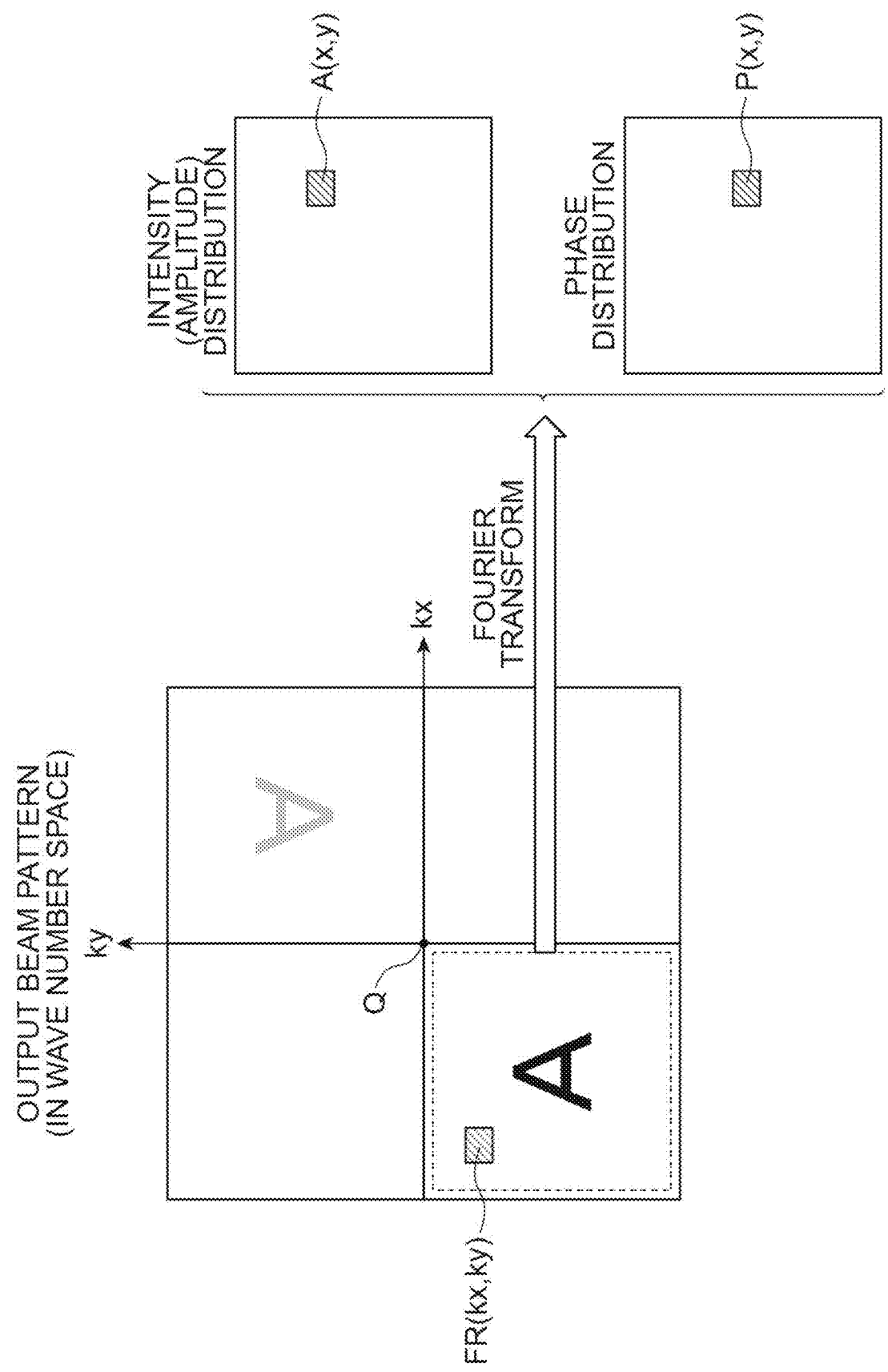
FIG. 28 is a diagram for explaining a relationship between an optical image obtained by imaging of an output beam pattern of a surface emitting laser element 50 and the distribution of rotation angles $\varphi(x, y)$ in a phase modulation layer 65B.

FIG. 28 is a diagram for explaining the relationship between an optical image obtained by imaging of the output beam pattern of the surface emitting laser element 50 and the distribution of the rotation angle φ(x, y) in the phase modulation layer 65B. Note that the center Q of the output beam pattern (in wave number space) is not necessarily located on an axis line perpendicular to the main surface 53a of the semiconductor substrate 53, but may be placed on the perpendicular axis line. Here, for the sake of explanation, the center Q is assumed to be on the axis line perpendicular to the main surface 53a. FIG. 28 illustrates four quadrants with their origin at the center Q. FIG. 28 illustrates a case where the optical images are obtained in the first quadrant and the third quadrant as an example, but it is also possible to obtain the image in the second quadrant and the fourth quadrant or in all quadrants. In the present modification, as illustrated in FIG. 28, an optical image having point symmetry with respect to the origin is obtained. FIG. 28 illustrates, as an example, a case where a character "A" and a pattern of the character "A" rotated 180 degrees are obtained in the third and first quadrant, respectively. Note that, in a case where an optical image has rotational symmetry (e.g. a cross, a circle, a double circle, etc.), the images are superimposed and observed as one optical image.

The optical image of the output beam pattern of the surface emitting laser element 50 includes at least one of a spot, a straight line, a cross, a line drawing, a lattice pattern, a photograph, a stripe pattern, computer graphics (CG), and a character. Here, in order to obtain a desired optical image, the distribution of rotation angle φ(x, y) of the modified refractive index region 65b in the phase modulation layer 65B is determined by the following procedure.

In the present modification, a desired optical image can be obtained by the determination of the distribution of rotation angle φ(x, y) according to the following procedure. First, as the first precondition, in an XYZ orthogonal coordinate system, which is defined by a Z-axis coincident with a normal direction and an X-Y plane that includes X and Y axes orthogonal to each other and that is coincident with one surface of the phase modulation layer 65B including the plurality of modified refractive index regions 65b, on the X-Y plane is set a virtual square lattice including M1 (an integer not smaller than 1)×N1 (an integer not smaller than 1) pieces of unit constituent regions R each of which has a square shape.

Figure 29:
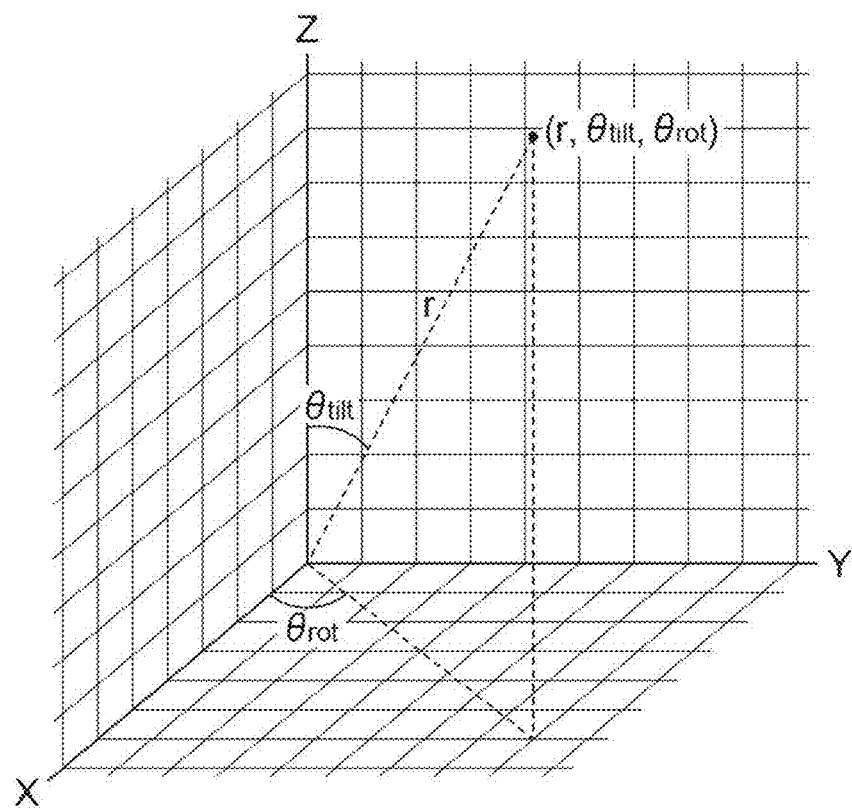
FIG. 29 is a diagram for explaining a coordinate transformation from spherical coordinates (r, $\theta_{rot}$, $\theta_{tilt}$) to the coordinates ($\xi$, $\eta$, $\zeta$) in an XYZ orthogonal coordinate system.

As the second precondition, the coordinates (ξ, η, ζ) in the XYZ orthogonal coordinate system shall satisfy the relationships expressed by the following Formulae (1) to (3) with respect to spherical coordinates (r, θ_{rot}, θ_{tilt}) defined by a radius length r, an inclination angle θ_{tilt} from the Z-axis, and a rotation angle θ_{rot} from the X-axis specified on the X-Y plane as illustrated in FIG. 29. Note that FIG. 29 is a diagram for explaining a coordinate transformation from spherical coordinates (r, θ_{rot}, θ_{tilt}) to coordinates (ξ, η, ζ) in the XYZ orthogonal coordinate system, and a designed optical image on a predetermined plane set in the XYZ orthogonal coordinate system as a real space is represented by the coordinates (ξ, η, ζ). When a beam pattern corresponding to an optical image outputted from the surface emitting laser element is considered as a set of bright spots directed in a direction defined by the angles θ_{tilt} and θ_{rot}, the angles θ_{tilt} and θ_{rot} are converted into a coordinate value $k_x$ on Kx-axis corresponds to the X-axis and a coordinate value $k_y$ on Ky-axis corresponds to the Y-axis and orthogonal to the Kx-axis, the coordinate value $k_x$ is a normalized wave number defined by the following Formula (4), and the coordinate value $k_y$ is a normalized wave number defined by the following Formula (5). The normalized wave number means a wave number normalized such that the wave number 2π/a corresponding to the lattice spacing of the virtual square lattice is 1.0. As such, in the wave number space defined by the Kx-axis and the Ky-axis, a specific wave number range including the beam pattern corresponding to the optical image is composed of M2 (an integer not smaller than 1)×N2 (an integer not smaller than 1) pieces of image regions FR each of which has a square shape. Note that the integer M2 does not need to coincide with the integer M1. Similarly, the integer N2 does not need to coincide with the integer N1. Formulae (4) and (5) are disclosed in Non-Patent Document 4 described above, for example.

$$\xi = r\sin\theta_{tilt}\cos\theta_{rot} \quad (1)$$

$$\eta = r\sin\theta_{tilt}\sin\theta_{rot} \quad (2)$$

$$\zeta = r\cos\theta_{tilt} \quad (3)$$

$$k_x = \frac{a}{\lambda}\sin\theta_{tilt}\cos\theta_{rot} \quad (4)$$

$$k_y = \frac{a}{\lambda}\sin\theta_{tilt}\sin\theta_{rot} \quad (5)$$

a: the lattice constant of virtual square lattice

λ: the oscillation wavelength of surface emitting laser element 50

As the third precondition, each image region $FR(k_x, k_y)$, which is specified by the coordinate component $k_x$ (an integer from 0 to M2−1) in the Kx-axis direction and the coordinate component $k_y$ (an integer from 0 to N2−1) in the Ky-axis direction in the wave number space, is two-dimensional inverse discrete Fourier transformed into a unit constituent region $R(x, y)$ on the X-Y plane, which is specified by the coordinate component x (an integer from 0 to M1−1) in the X-axis direction and the coordinate component y (an integer from 0 to N1−1) in the Y-axis direction, thereby obtaining a complex amplitude $F(x, y)$, and this complex amplitude $F(x, y)$ is given by the following Formula (6) with j as an imaginary unit. Furthermore, when the amplitude term is denoted by $A(x, y)$ and the phase term is denoted by $P(x, y)$, this complex amplitude $F(x, y)$ is defined by the following Formula (7). Furthermore, as the fourth precondition, the unit constituent region $R(x, y)$ is defined by an s-axis and a t-axis that are parallel to the X-axis and the Y-axis, respectively, and that are orthogonal to each other at a lattice point $O(x, y)$ which is the center of the unit constituent region $R(x, y)$.

$$F(x, y) = \sum_{k_x=0}^{M2-1} \sum_{k_y=0}^{N2-1} FR(k_x, k_y) \exp\left[j2\pi\left(\frac{k_x}{M2}x + \frac{k_y}{N2}y\right)\right] \quad (6)$$

$$F(x, y) = A(x, y) \times \exp[jP(x, y)] \quad (7)$$

Under the first to fourth preconditions, the phase modulation layer 65B is configured to satisfy the following first and second conditions. That is, the first condition is that the centroid G is placed away from the lattice point $O(x, y)$ in the unit constituent region $R(x, y)$. The second condition is that the corresponding modified refractive index region 65b is positioned in the unit constituent region $R(x, y)$ such that an angle $\varphi(x, y)$ between the s-axis and a line segment connecting the lattice point $O(x, y)$ and the corresponding centroid G satisfies the following relationship:

$\varphi(x,y) = C \times P(x,y) + B$

C: a proportional constant such as 180°/π

B: any constant such as 0 under the condition that the line segment length $r_2(x, y)$ from the lattice point $O(x, y)$ to the corresponding centroid G is set to a common value in each of the M1×N1 pieces of unit constituent regions R.

As a method to obtain the intensity distribution and the phase distribution from the complex amplitude distribution obtained by the inverse Fourier transform, for example, the intensity distribution $I(x, y)$ can be calculated by using the abs function of numerical analysis software "MATLAB" of the MathWorks, Inc., and the phase distribution $P(x, y)$ can be calculated by using the angle function of MATLAB.

Here are some precautions in calculating using general discrete Fourier transform (or fast Fourier transform) when the distribution of the rotation angle $\varphi(x, y)$ is found from the results of inverse Fourier transform of the optical image and the position of each of the modified refractive index regions 65b is determined. When an optical image prior to apply Fourier transform is divided into four quadrants A1, A2, A3, and A4 as illustrated in FIG. 30A, the obtained beam pattern is as illustrated in FIG. 30B. That is, in the first quadrant of the beam pattern appears a pattern of superimposition of a pattern in the first quadrant of FIG. 30A rotated 180 degrees and a pattern in the third quadrant of FIG. 30A. In the second quadrant of the beam pattern appears a pattern of superimposition of a pattern in the second quadrant of FIG. 30A rotated 180 degrees and a pattern in the fourth quadrant of FIG. 30A. In the third quadrant of the beam pattern appears a pattern of superimposition of a pattern in the third quadrant of FIG. 30A rotated 180 degrees and a pattern in the first quadrant of FIG. 30A. In the fourth quadrant of the beam pattern appears a pattern of superimposition of a pattern in the fourth quadrant of FIG. 30A rotated 180 degrees and a pattern in the second quadrant of FIG. 30A.

Therefore, in a case of using a pattern having a value only in the first quadrant as an optical image (original optical image) prior to apply inverse Fourier transform, in the third quadrant of the obtained beam pattern appears the first quadrant of the original optical image, and in the first quadrant of the obtained beam pattern appears a pattern of the first quadrant of the original optical image rotated 180 degrees.

As described above, the surface emitting laser element 50 enables to provide a desired beam pattern as a wavefront is phase-modulated. This beam pattern can be configured to be not only a pair of unimodal beams (spots), but also, as described above, a character shape, two or more spot groups having the same shape, a vector beam whose phase or intensity distribution is spatially non-uniform, or the like.

In the present modification, the laser light outputted from the active layer 62 enters into the inside of the phase modulation layer 65B while being confined between the cladding layer 61 and the cladding layer 63, and creates a predetermined mode according to the lattice structure inside the phase modulation layer 65B. The laser light, which is scattered in the phase modulation layer 65B and emitted, is outputted from the back surface 53b of the semiconductor substrate 53 to the outside. At this time, zero-order light is emitted into a direction perpendicular to the main surface 53a. In contrast, +1st order light and −1st order light are emitted into any two-dimensional direction including a direction perpendicular to the main surface 53a and a direction inclined with respect to this.

Figure 31:
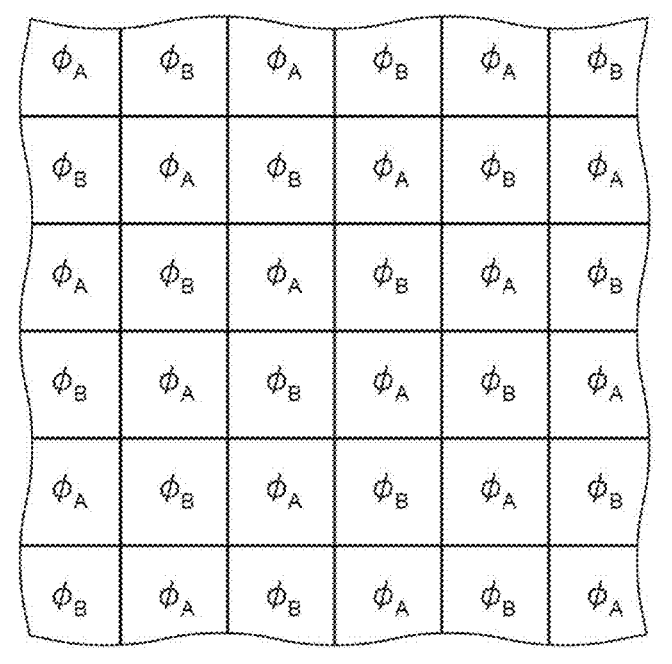

Note that, in the above description of the present modification, the wavelength $\lambda_0$ is assumed such that $\lambda_0 = a \times n$ (a is a lattice spacing), and a band end called $\Gamma_2$ point in the square lattice is used. On the other hand, the lattice spacing a may be configured such that $\lambda_0 = (2^{1/2}) a \times n$. This corresponds to a band end called M point in the square lattice. In this case, the phase of an additional phase angle distribution $\varphi_1(x, y) = (\pm \pi x/a, \pm \pi y/a)$ is superimposed to the distribution of phase angle $\varphi_0(x, y)$ corresponding to the design beam pattern so that the distribution of phase angle $\varphi(x,y) = \varphi_0(x, y) + \varphi_1(x,y)$ is used. FIG. 31 is a diagram conceptually illustrating an example of the distribution of rotation angle $\varphi_1(x, y)$. As illustrated in FIG. 31, in this example, the first phase value $\varphi_A$ and the second phase value $\varphi_B$, having a value different from the first phase value $\varphi_A$, are arranged in a check pattern. In one example, the phase value $\varphi_A$ is 0 (rad), and the phase value $\varphi_B$ is π (rad). That is, the first phase value $\varphi_A$ and the second phase value $\varphi_B$ are different from each other by 7E. In this case, the designed beam pattern can be taken out in a direction vertical to the plane, the zero-order light does not appear in the direction vertical to the plane, and there can be emitted only the designed beam pattern including ±1 order light. Zero-order light is a wavefront without phase modulation, but ±1 order light is a phase-modulated wavefront. Therefore, the spatial phase distribution of the light incident onto the spatial light modulator 1A can be efficiently controlled, and a further improved efficiency can be achieved by condensing the light into the through-hole 13, for example.

As in the present modification, the surface emitting laser element 50 may include a phase modulation layer 65B as a resonance mode creating layer. In this case, a part of the laser light (a part of +1 order light and −1 order light, and zero-order light) generated in the phase modulation layer 65B is diffracted into a direction perpendicular to the main surface 53a of the semiconductor substrate 53, then after being reflected at the metal electrode film 66 (or directly) reaches the back surface 53b of the semiconductor substrate 53, and is emitted from the back surface 53b toward the spatial light modulator 1A. Therefore, the same effect as that of the second embodiment can be produced. In addition, as described above, by controlling the spatial phase of the ±1 order light of the emission beam of the S-iPM laser (e.g. by condensing the light into the through-hole 13 etc.), a further improved efficiency can be achieved.

(Seventh Modification)

Figure 32:
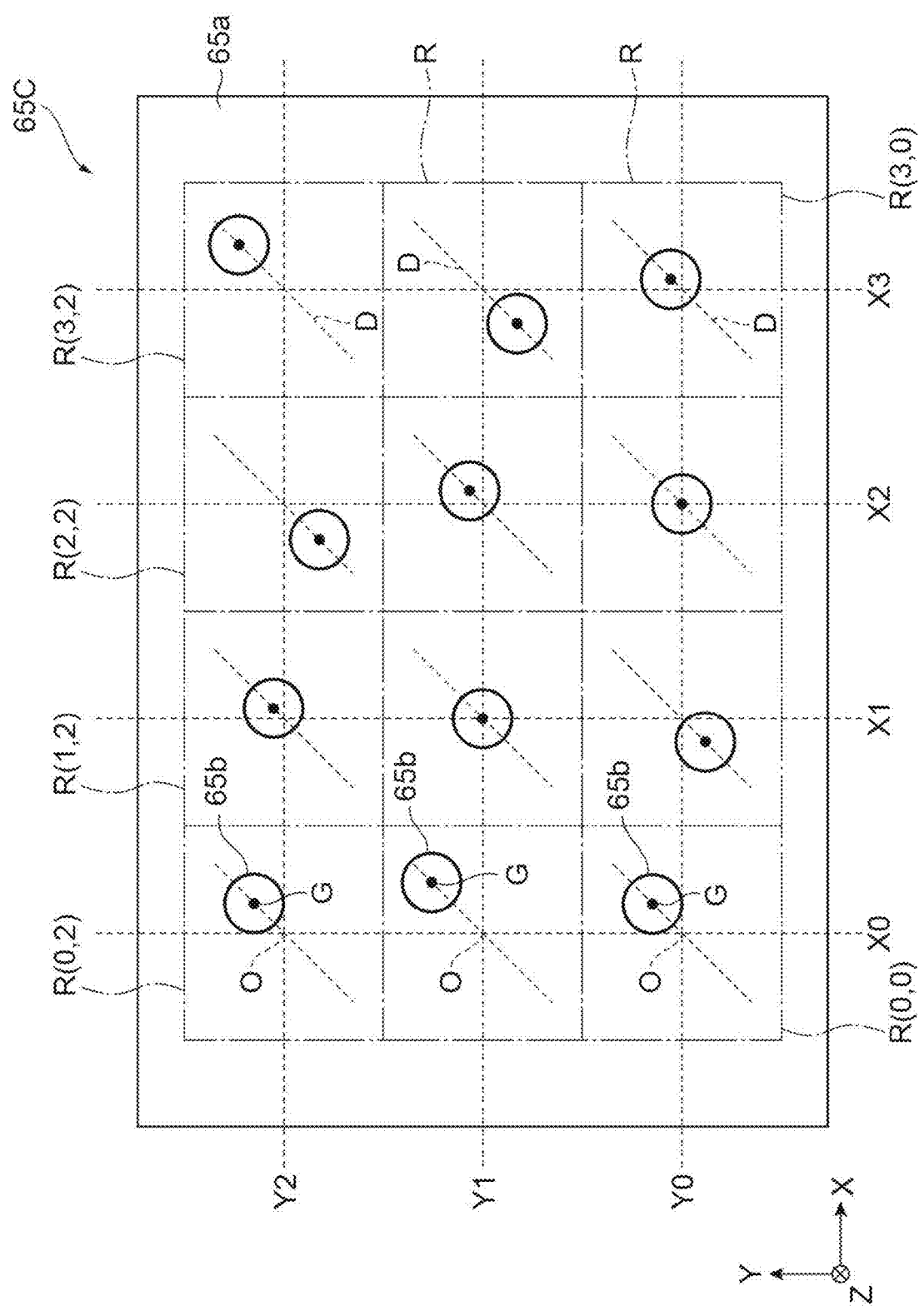
FIG. 32 is a plan view of a phase modulation layer 65C included in the S-iPM laser.
Figure 33:
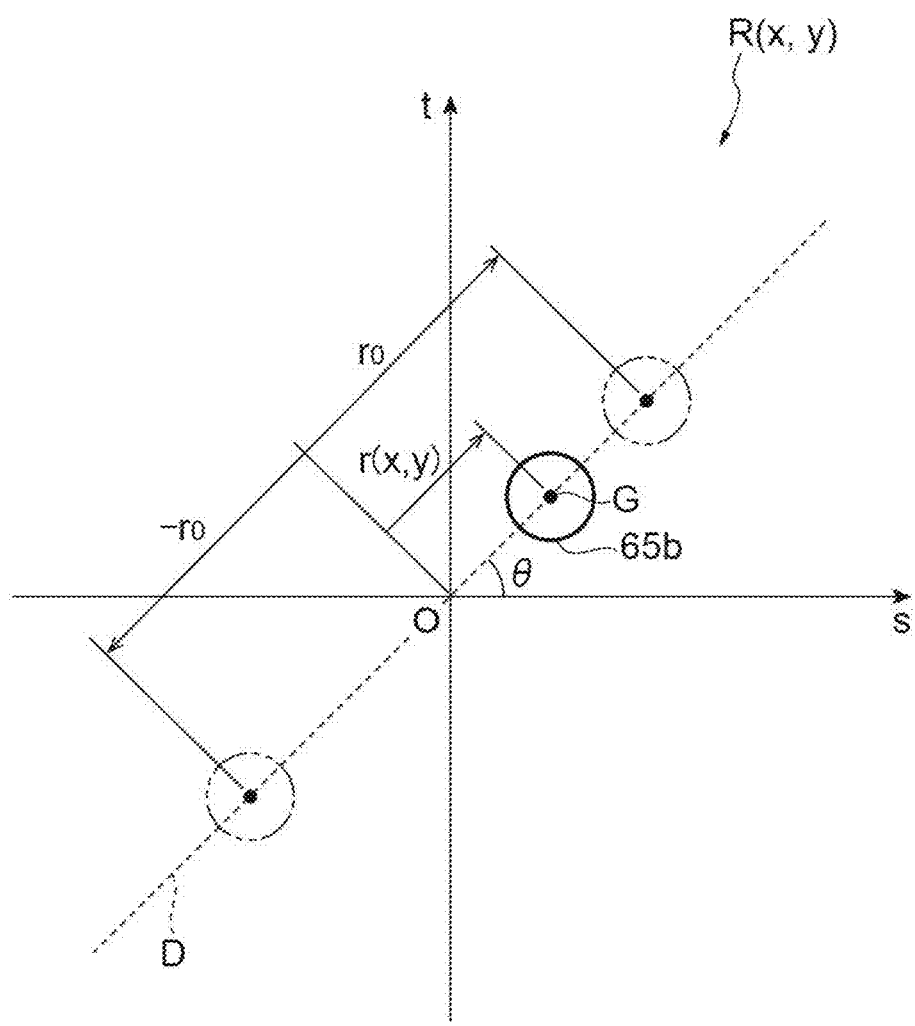
FIG. 33 is a diagram illustrating a positional relationship of the modified refractive index region 65b in the phase modulation layer 65C.

The S-iPM laser is not limited to the configuration of the sixth modification described above. For example, the S-iPM laser can be suitably realized even in the configuration of the phase modulation layer of the present modification. FIG. 32 is a plan view of a phase modulation layer 65C included in the S-iPM laser. FIG. 33 is a diagram illustrating the positional relationship of the modified refractive index region 65b in the phase modulation layer 65C. The phase modulation layer 65C is a resonance mode creating layer in the present modification. Note that, as illustrated in FIG. 32, the points of intersection between lines x0 to x3 parallel to the Y-axis and lines y0 to y2 parallel to the X-axis are lattice points O, and square regions centered at the lattice points O are set as unit constituent regions R(0, 0) to R(3, 2). The position in each unit constituent region R(x, y) is given by an s-axis parallel to the X-axis) and a t-axis parallel to the Y-axis) orthogonal to each other at the corresponding lattice point O. As illustrated in FIGS. 32 and 33, in the phase modulation layer 65C, the centroid G of each of the modified refractive index regions 65b is placed on a straight line D. The straight line D is a straight line that passes through the corresponding lattice point O of each unit constituent region R and is inclined with respect to each side of the square lattice. In other words, the straight line D is a straight line inclined with respect to both the X-axis (s-axis) and the Y-axis (t axis). An inclination angle of the straight line D with respect to the s-axis parallel to the X-axis is θ. The inclination angle θ is constant in the phase modulation layer 65C. The inclination angle θ satisfies 0°<θ<90°, and in one example, θ=45° is satisfied. Alternatively, the inclination angle θ satisfies 180°<θ<270°, and in one example, θ=225° is satisfied. When the inclination angle θ satisfies 0°<θ<90° or 180°<θ<270°, the straight line D extends from the first quadrant to the third quadrant of a coordinate plane defined by the X-axis and the Y-axis. Alternatively, the inclination angle θ satisfies 90°<θ<180°, and in one example, θ=135° is satisfied. Alternatively, the inclination angle θ satisfies 270°<θ<360°, and in one example, θ=315° is satisfied. In a case where the inclination angle θ satisfies 90°<θ<180° or 270°<θ<360°, the straight line D extends from the second quadrant to the fourth quadrant of a coordinate plane defined by the X-axis and the Y-axis. As described above, the inclination angle θ is an angle not involving 0°, 90°, 180°, and 270°. By choosing such inclination angle θ, an optical wave traveling in the X-axis direction and an optical wave traveling in the Y-axis direction both can contribute to the optical output beam. Here, the distance between the lattice point O and the centroid G is denoted by r(x, y). The position of an x-th lattice point on the X-axis is denoted by x, and the position of a y-th lattice point on the Y-axis is denoted by y. In a case where the distance r(x, y) is a positive value, the centroid G is located in the first quadrant (or the second quadrant). In a case where the distance r(x, y) is a negative value, the centroid G is located in the third quadrant (or the fourth quadrant). In a case where the distance r(x, y) is 0, the lattice point O and the centroid G coincide with each other.

The distance r(x, y) between the centroid G of each of the modified refractive index regions 65b and the corresponding lattice point O of each of the unit constituent regions R illustrated in FIG. 32 is individually chosen for each of the modified refractive index regions 65b according to a desired optical image. The distribution of the distance r(x, y) has a specific value for each position determined by the values of x and y, but is not necessarily represented by a specific function. The distribution of the distance r(x, y) is determined from an extraction of phase distribution out of the complex amplitude distribution obtained by applying inverse Fourier transform to a desired optical image. That is, the distance r(x, y) is set to 0 in a case where the phase P(x, y) in the unit constituent region R(x, y) illustrated in FIG. 33 is $P_0$, the distance r(x, y) is set to the maximum value $r_0$ in a case where the phase P(x, y) is $\pi+P_0$, and the distance r(x, y) is set to the minimum value $-r_0$ in a case where the phase P(x, y) is $-\pi+P_0$. Then, for an intermediate phase P(x, y) between them, the distance r(x, y) is chosen such that r(x, y)={P(x, y)−$P_0$}×$r_0$/π. Here, an initial phase $P_0$ can be freely chosen. When the lattice spacing of a square lattice is denoted by a, the maximum value $r_0$ of r(x, y), for example, is within the range of:

$$0 \le r_0 \le \frac{a}{\sqrt{2}}.$$

As in the present modification, the surface emitting laser element 50 may include a phase modulation layer 65C as a resonance mode creating layer. In this case, a part of laser light (a part of +1 order light and −1 order light; and zero-order light) generated in the phase modulation layer 65C is diffracted into a direction perpendicular to the main surface 53a of the semiconductor substrate 53, then after being reflected at the metal electrode film 66 (or directly) reaches the back surface 53b of the semiconductor substrate 53, and exits from the back surface 53b toward the spatial light modulator 1A. Therefore, the same effect as that of the second embodiment can be produced. In addition, a further improved efficiency can be achieved by controlling the spatial phase of ±1 order light of an emission beam of the S-iPM laser (e.g. by condensing the light into the through-hole 13).

The spatial light modulator and the light-emitting device according to the present disclosure are not limited to the above-described embodiments, and various other modifications can be implemented. For example, in the spatial light modulator of the above-described embodiment and each of the modifications, one or more wiring electrodes 32 provided for each through-hole 13 are electrically connected to the electroconductive layer 23, and the wiring electrode 31 provided in common for the plurality of through-holes 13 is electrically connected to the electroconductive layer 21. The spatial light modulator according to the present disclosure is not limited to this embodiment, and for example, one or more wiring electrodes 32 provided for each through-hole 13 may be electrically connected to the electroconductive layer 21, and the wiring electrode 31 provided in common for the plurality of through-holes 13 may be electrically connected to the electroconductive layer 23.

In the spatial light modulator of the above-described embodiment and each of the modifications, one or more wiring electrodes 32 provided for each through-hole 13 are provided on the front surface 11, and the wiring electrode 31 provided in common for the plurality of through-holes 13 is provided on the back surface 12. The spatial light modulator according to the present disclosure is not limited to this form, and for example, one or more wiring electrodes 32 provided for each through-hole 13 may be provided on the back surface 12, and the wiring electrode 31 provided in common for the plurality of through-holes 13 may be provided on the front surface 11. In this case, the electroconductive layer 24 connected to the electroconductive layer 21 is isolated for each of one or more through-holes 13, and the electroconductive layer 26 connected to the electroconductive layer 23 is provided in common for the plurality of through-holes 13. In this case, the wiring electrode 31 may cover the entirety of the region between each of the plurality of through-holes 13 on the front surface 11.

Furthermore, in the above-described embodiment and each of the modifications, the light L enters the spatial light modulator from the back surface 12 side and exits from the front surface 11 side, but the light L may enter the spatial light modulator from the front surface 11 side and exit from the back surface 12 side.

REFERENCE SIGNS LIST 1A to 1H Spatial light modulator
2 Light-emitting device
10 Substrate
11 Front surface
12 Back surface
13 Through-hole
13a Inner wall
20 Layered structure
21, 24 Electroconductive layer
21a Surface
22, 25, 27 Dielectric layer
23, 26 Electroconductive layer
28 Dielectric region
29 Smooth layer
29a Surface
31, 32 Wiring electrode
41 Catalytic metal film
42 Recess
50 Surface emitting laser element
51 Junction
53 Semiconductor substrate
53a Main surface
53b Back surface
60 Semiconductor stack
61 Cladding layer
62 Active layer
63 Cladding layer
64 Contact layer
65A Photonic crystal layer
65B, 65C Phase modulation layer
65a Base layer
65b Modified refractive index region
66, 67 Metal electrode film
67a Opening
68 Antireflection film
100 Base element
200A, 200B Base unit
221 First layer
222 Second layer
300 Emission region
$A_1, A_2$ Direction
C Center point
D Straight line
G Centroid
L Light
Lout Emitted light
$M_1, M_2$ Resist mask
MA, MB Opening
O Lattice point
R Unit constituent region
θ Inclination angle
φ Rotation angle.

The invention claimed is:

1. A surface waveguide-type spatial light modulator, comprising:
a substrate having a front surface, a back surface opposing to the front surface, and a plurality of through-holes, each of the plurality of through-holes connecting the front surface and the back surface, an opening of each of the plurality of through-holes defined at least on the front surface being arranged one-dimensionally or two-dimensionally; and
a plurality of layered structures each covering an inner wall of each of the plurality of through-holes,
wherein
each of the plurality of layered structures includes:
a first electroconductive layer provided on the inner wall of a corresponding through-hole among the plurality of through-holes;
a dielectric layer provided on the first electroconductive layer and having optical transparency; and
a second electroconductive layer provided on the dielectric layer and having optical transparency,
wherein
at least one of the first and second electroconductive layers is electrically isolated for each group including one or more through-holes among the plurality of through-holes.

2. The spatial light modulator according to claim 1, wherein an opening shape of each of the plurality of through-holes defined on the front surface has rotational symmetry or reflection symmetry.

3. The spatial light modulator according to claim 1, wherein respective opening shapes of the plurality of through-holes defined on the front surface coincide with each other.

4. The spatial light modulator according to claim 1, wherein a centroid of opening of each of the plurality of through-holes is located on a lattice point of a square lattice or a triangular lattice on at least one of the front surface and the back surface.

5. The spatial light modulator according to claim 1, wherein an opening shape of each of the plurality of through-holes defined on the front surface is a linearly extending shape.

6. The spatial light modulator according to claim 5, wherein the opening shape of each of the plurality of through-holes includes a linear shape or an arc shape.

7. The spatial light modulator according to claim 6, wherein the opening shape of each of the plurality of through-holes includes the arc shape extending over an angular range of less than 360° in polar coordinates centered at an origin, and the plurality of through-holes is arranged at an equal interval along a radial direction on the front surface.

8. The spatial light modulator according to claim 1, further comprising a dielectric region having optical transparency and provided on a corresponding layered structure among the plurality of layered structures in each of the plurality of through-holes.

9. The spatial light modulator according to claim 8, wherein the dielectric region is filled in at least a predetermined section to be defined along a thickness direction from the front surface to the back surface in a space surrounded by the corresponding layered structure.

10. The spatial light modulator according to claim 1, further comprising a smooth layer having a smooth surface and provided on the inner wall in each of the plurality of through-holes, wherein in each of the plurality of through-holes, a corresponding layered structure among the plurality of layered structures is provided on the surface of the smooth layer.

11. The spatial light modulator according to claim 10, wherein the smooth layer includes at least one of a metal and a dielectric material.

12. The spatial light modulator according to claim 1, wherein one of the first and second electroconductive layers is electrically connected to one or more first electrodes provided on the front surface of the substrate corresponding to each of the plurality of through-holes.

13. The spatial light modulator according to claim 12, wherein the other of the first and second electroconductive layers is electrically connected to a second electrode in common to the plurality of through-holes and provided on the back surface of the substrate.

14. The spatial light modulator according to claim 13, wherein the second electrode covers a region between each of the plurality of through-holes on the front surface or on the back surface of the substrate.

15. The spatial light modulator according to claim 1,
wherein the substrate includes a plurality of base elements, wherein one through-hole among the plurality of through-holes is allocated to each of the plurality of base elements, and in each of the plurality of base elements both maximum widths defined along a first direction and a second direction intersecting each other on the front surface are configured to be shorter than a wavelength of incident light, three or more consecutive base elements along at least one of the first direction and the second direction among the plurality of base elements are included in a base unit as a modulation control unit, and in the three or more base elements included in the base unit, one of the first and second electroconductive layers is electrically connected to a common electrode provided on a surface configured to be a part of the back surface of the substrate.

16. The spatial light modulator according to claim 1, wherein the substrate mainly contains a semiconductor material.

17. The spatial light modulator according to claim 16, wherein the semiconductor material includes at least one of Si, Ge, GaAs, InP, and GaN.

18. The spatial light modulator according to claim 1, wherein the first electroconductive layer is a metal layer.

19. The spatial light modulator according to claim 18, wherein the first electroconductive layer contains Pt.

20. The spatial light modulator according to claim 1, wherein the dielectric layer contains at least one of aluminum oxide, hafnium oxide, silicon oxide, and silicon nitride.

21. The spatial light modulator according to claim 1, wherein the second electroconductive layer contains at least one of ITO, a zinc oxide-based electric conductor, titanium nitride, and cadmium oxide.

22. A light-emitting device comprising:
the spatial light modulator according to claim 1; and
a surface light source optically coupled to the front surface or the back surface of the spatial light modulator.

23. The light-emitting device according to claim 22, wherein the surface light source includes a photonic crystal surface emitting laser element.

24. The light-emitting device according to claim 22, wherein
the surface light source includes a surface emitting laser element, the surface emitting laser element having an active layer and a phase modulation layer,
the phase modulation layer includes a base layer and a plurality of modified refractive index regions, the plurality of modified refractive index regions having a refractive index different from a refractive index of the base layer and distributed two-dimensionally in a plane perpendicular to a thickness direction of the phase modulation layer, and
a position of centroid of each of the plurality of modified refractive index regions is configured such that
the centroid is placed away from a corresponding lattice point of a virtual square lattice set on the surface of the phase modulation layer, and a rotation angle centered at the corresponding lattice point, defined by an angle between the square lattice and a line segment connecting between the centroid and the corresponding lattice point, is individually set, or
the centroid is placed on a straight line, the straight line passing through the corresponding lattice point and inclined with respect to the square lattice, and a distance from the centroid to the corresponding lattice point is individually set.

* * * * *